US012787628B2

(12) United States Patent
Seo et al.

(10) Patent No.: US 12,787,628 B2
(45) Date of Patent: Nov. 3, 2026

(54) DISPLAY DEVICE

(71) Applicant: Semiconductor Energy Laboratory Co., Ltd., Atsugi (JP)

(72) Inventors: Satoshi Seo, Sagamihara (JP); Rihito Wada, Atsugi (JP)

(73) Assignee: SEMICONDUCTOR ENERGY LABORATORY CO., LTD., Atsugi (JP)

( * ) Notice: Subject to any disclaimer, the term of this patent is extended or adjusted under 35 U.S.C. 154(b) by 555 days.

(21) Appl. No.: 18/276,080

(22) PCT Filed: Feb. 9, 2022

(86) PCT No.: PCT/IB2022/051140
§ 371 (c)(1),
(2) Date: Aug. 7, 2023

(87) PCT Pub. No.: WO2022/175784
PCT Pub. Date: Aug. 25, 2022

(65) Prior Publication Data

US 2023/0422577 A1 Dec. 28, 2023

(30) Foreign Application Priority Data

Feb. 19, 2021 (JP) ................................ 2021-024827
Feb. 19, 2021 (JP) ................................ 2021-024828
May 13, 2021 (JP) ................................ 2021-081416

(51) Int. Cl.
*H10K 59/80* (2023.01)
*H10K 59/12* (2023.01)
(Continued)

(52) U.S. Cl.
CPC ....... *H10K 71/135* (2023.02); *H10K 59/1201* (2023.02); *H10K 59/122* (2023.02);
(Continued)

(58) Field of Classification Search
CPC ............ H10K 71/135; H10K 59/1201; H10K 59/122; H10K 59/35; H10K 59/80516;
(Continued)

(56) References Cited

U.S. PATENT DOCUMENTS 6,858,464 B2 2/2005 Yamazaki et al.
7,683,537 B2 3/2010 Yoshida et al.
(Continued)

FOREIGN PATENT DOCUMENTS

CN 106409870 A 2/2017
CN 106711169 A 5/2017
(Continued)

OTHER PUBLICATIONS

International Search Report (Application No. PCT/IB2022/051140) Dated May 17, 2022.
(Continued)

*Primary Examiner* — Elmito Breval
(74) *Attorney, Agent, or Firm* — Eric J. Robinson; Robinson Intellectual Property Law Office, P.C.

(57) ABSTRACT

A display device in which a voltage drop is inhibited is provided. The display device includes a first lower electrode; a second lower electrode; a third lower electrode; an auxiliary electrode; a partition wall including a region overlapping with an end portion of the first lower electrode, an end portion of the second lower electrode, an end portion of the third lower electrode, and the auxiliary electrode; a first light-emitting layer including a region overlapping with the first lower electrode and being positioned in an opening in the partition wall; a first layer positioned between the first lower electrode and the first light-emitting layer; a second light-emitting layer including a region overlapping with the second lower electrode and being positioned in an opening in the partition wall; a second layer positioned between the
(Continued)

10 second lower electrode and the second light-emitting layer; a third light-emitting layer including a region overlapping with the third lower electrode and being positioned in an opening in the partition wall; a third layer positioned between the third lower electrode and the third light-emitting layer; and an upper electrode provided across the first light-emitting layer to the third light-emitting layer, in which the upper electrode is electrically connected to the auxiliary electrode.

6 Claims, 40 Drawing Sheets

(51) Int. Cl.

| | |
|---|---|
| ***H10K 59/122*** | (2023.01) |
| ***H10K 59/35*** | (2023.01) |
| ***H10K 71/13*** | (2023.01) |
| *H10K 50/10* | (2023.01) |

(52) U.S. Cl.

CPC ....... *H10K 59/35* (2023.02); *H10K 59/80516* (2023.02); *H10K 59/80522* (2023.02); *H10K 50/10* (2023.02)

(58) Field of Classification Search

CPC ............. H10K 50/10; H10K 59/80522; H10K 59/121; H10K 50/15; H10K 50/17; G09F 9/30; H05B 33/06; H05B 33/12; H05B 33/22; H05B 33/26; H05B 33/28; H05B 33/14

See application file for complete search history.

(56) References Cited

U.S. PATENT DOCUMENTS

| | | | | |
|---|---|---|---|---|
| 7,896,721 | B2 | 3/2011 | Takei et al. | |
| 8,083,956 | B2 | 12/2011 | Fujii et al. | |
| 8,742,661 | B2 | 6/2014 | Imai et al. | |
| 9,818,808 | B2 | 11/2017 | Nendai | |
| 9,997,575 | B2 | 6/2018 | Takata | |
| 10,050,098 | B2 | 8/2018 | Nam et al. | |
| 10,312,308 | B2 | 6/2019 | Takata | |
| 10,504,985 | B2 | 12/2019 | Nam et al. | |
| 10,553,805 | B2 | 2/2020 | Maeda et al. | |
| 2009/0160322 | A1 | 6/2009 | Yoshida et al. | |
| 2009/0215350 | A1 | 8/2009 | Takei et al. | |
| 2011/0241027 | A1 * | 10/2011 | Kaneta .................. | H10K 50/17 438/22 |
| 2016/0172423 | A1 | 6/2016 | Nendai | |
| 2017/0033166 | A1 | 2/2017 | Shim et al. | |
| 2017/0069694 | A1 | 3/2017 | Ajiki et al. | |
| 2017/0117339 | A1 | 4/2017 | Takata | |
| 2017/0141176 | A1 | 5/2017 | Im et al. | |
| 2018/0358573 | A1 | 12/2018 | Maeda et al. | |
| 2022/0181572 | A1 | 6/2022 | Ohsawa et al. | |

FOREIGN PATENT DOCUMENTS

| | | | |
|---|---|---|---|
| EP | 3125294 | A | 2/2017 |
| EP | 3168880 | A | 5/2017 |
| EP | 3188274 | A | 7/2017 |
| JP | 2005-158583 | A | 6/2005 |
| JP | 2006-294395 | A | 10/2006 |
| JP | 2009-176495 | A | 8/2009 |
| JP | 2009-231264 | A | 10/2009 |
| JP | 2009-259570 | A | 11/2009 |
| JP | 2017-120782 | A | 7/2017 |
| JP | 2018-206710 | A | 12/2018 |
| KR | 2017-0015637 | A | 2/2017 |
| KR | 2017-0057076 | A | 5/2017 |
| TW | 201705469 | | 2/2017 |
| WO | WO-2015/155971 | | 10/2015 |
| WO | WO-2022/162489 | | 8/2022 |

OTHER PUBLICATIONS

Written Opinion (Application No. PCT/IB2022/051140) Dated May 17, 2022.

* cited by examiner

DISPLAY DEVICE

TECHNICAL FIELD

One embodiment of the present invention relates to a display device.

Note that one embodiment of the present invention is not limited to the above technical field. The technical field of one embodiment of the invention disclosed in this specification and the like relates to an object, a method, or a manufacturing method. Another embodiment of the present invention relates to a process, a machine, manufacture, or a composition of matter. Specific examples of the technical field of one embodiment of the present invention disclosed in this specification and the like include a semiconductor device, a display device, a light-emitting device, a power storage device, and a memory device, and a method of driving any of them, and a method of manufacturing any of them are also included in the examples.

BACKGROUND ART

In manufacturing a large organic EL device, a structure in which an auxiliary electrode is provided to inhibit a voltage drop in a counter electrode has been discussed (see Patent Document 1).

REFERENCE

Patent Document

[Patent Document 1] Japanese Published Patent Application No. 2005-158583

SUMMARY OF THE INVENTION

Problems to be Solved by the Invention

In Patent Document 1, aluminum metal covering a top surface of a partition wall (also referred to as a bank) is patterned, whereby an auxiliary electrode is formed over the partition wall. In addition, Patent Document 1 discloses that the auxiliary electrode may be formed by an ink-jet method instead of the above evaporation method.

According to Patent Document 1, the auxiliary electrode needs to have a width narrower than the width of the partition wall because of being formed on a top surface of the partition wall. Furthermore, the partition wall is miniaturized in accordance with an improvement in the aperture ratio of the display device. Accordingly, in the display device with a high aperture ratio, it is difficult to form the auxiliary electrode on the top surface of the partition wall.

In view of the above, an object of one embodiment of the present invention is to provide a novel structure of an auxiliary electrode of a display device with a high aperture ratio. Another object is to provide a display device including the auxiliary electrode and a method of manufacturing the display device.

The description of the above objects does not preclude the existence of other objects. Other objects will be apparent from and can be derived from the description of the specification, the drawings, the claims, and the like. One embodiment of the present invention does not necessarily achieve all the objects.

Means for Solving the Problems

In view of the above, one embodiment of the present invention is a display device including: a first lower electrode; a second lower electrode positioned in a region adjacent to the first lower electrode in an X direction in a top view; a third lower electrode positioned in a region adjacent to the first lower electrode in a Y direction in the top view; an auxiliary electrode positioned at least between the first lower electrode and the second lower electrode in the top view; a partition wall including a region overlapping with an end portion of the first lower electrode, an end portion of the second lower electrode, an end portion of the third lower electrode, and the auxiliary electrode; a first light-emitting layer including a region overlapping with the first lower electrode and being positioned in an opening in the partition wall; a first layer positioned between the first lower electrode and the first light-emitting layer; a second light-emitting layer including a region overlapping with the second lower electrode and being positioned in an opening in the partition wall; a second layer positioned between the second lower electrode and the second light-emitting layer; a third light-emitting layer including a region overlapping with the third lower electrode and being positioned in an opening in the partition wall; a third layer positioned between the third lower electrode and the third light-emitting layer; and an upper electrode provided across the first light-emitting layer to the third light-emitting layer. The upper electrode is electrically connected to the auxiliary electrode. Each of the first layer to the third layer includes a hole-transport layer or a hole-injection layer. The partition wall has a stacked-layer structure of a first insulator containing an inorganic material and a second insulator containing an organic material.

Another embodiment of the present invention is a display device including: a first lower electrode; a second lower electrode positioned in a region adjacent to the first lower electrode in an X direction in a top view; a third lower electrode positioned in a region adjacent to the first lower electrode in a Y direction in the top view; an auxiliary electrode positioned at least between the first lower electrode and the second lower electrode in the top view; a partition wall including a region overlapping with an end portion of the first lower electrode, an end portion of the second lower electrode, an end portion of the third lower electrode, and the auxiliary electrode; a first light-emitting layer including a region overlapping with the first lower electrode and being positioned in an opening in the partition wall; a first layer positioned between the first lower electrode and the first light-emitting layer; a second light-emitting layer including a region overlapping with the second lower electrode and being positioned in an opening in the partition wall; a second layer positioned between the second lower electrode and the second light-emitting layer; a third light-emitting layer including a region overlapping with the third lower electrode and being positioned in an opening in the partition wall; a third layer positioned between the third lower electrode and the third light-emitting layer; and an upper electrode provided across the first light-emitting layer to the third light-emitting layer. The upper electrode is electrically connected to the auxiliary electrode through a contact hole positioned at least between the first lower electrode and the second lower electrode. Each of the first layer to the third layer includes a hole-transport layer or a hole-injection layer. The partition wall has a stacked-layer structure of a first insulator containing an inorganic material and a second insulator containing an organic material. The contact hole includes a first opening in the first insulator and a second opening in the second insulator. The first insulator includes an end portion exposed from the second opening in a top view of the contact hole.

Another embodiment of the present invention is a display device including: a first lower electrode; a second lower electrode positioned in a region adjacent to the first lower electrode in an X direction in a top view; a third lower electrode positioned in a region adjacent to the first lower electrode in a Y direction in the top view; an auxiliary electrode positioned at least between the first lower electrode and the second lower electrode in the top view; a partition wall including a region overlapping with an end portion of the first lower electrode, an end portion of the second lower electrode, an end portion of the third lower electrode, and the auxiliary electrode; a first light-emitting layer including a region overlapping with the first lower electrode and being positioned in an opening in the partition wall; a first layer positioned between the first lower electrode and the first light-emitting layer; a second light-emitting layer including a region overlapping with the second lower electrode and being positioned in an opening in the partition wall; a second layer positioned between the second lower electrode and the second light-emitting layer; a third light-emitting layer including a region overlapping with the third lower electrode and being positioned in an opening in the partition wall; a third layer positioned between the third lower electrode and the third light-emitting layer; and an upper electrode provided across the first light-emitting layer to the third light-emitting layer. The upper electrode is electrically connected to the auxiliary electrode through a conductive layer. Each of the first layer to the third layer includes a hole-transport layer or a hole-injection layer. The partition wall has a stacked-layer structure of a first insulator containing an inorganic material and a second insulator containing an organic material.

Another embodiment of the present invention is a display device including: a first lower electrode; a second lower electrode positioned in a region adjacent to the first lower electrode in an X direction in a top view; a third lower electrode positioned in a region adjacent to the first lower electrode in a Y direction in the top view; an auxiliary electrode positioned at least between the first lower electrode and the second lower electrode in the top view; a partition wall including a region overlapping with an end portion of the first lower electrode, an end portion of the second lower electrode, an end portion of the third lower electrode, and the auxiliary electrode; a first light-emitting layer including a region overlapping with the first lower electrode and being positioned in an opening in the partition wall; a first layer positioned between the first lower electrode and the first light-emitting layer; a second light-emitting layer including a region overlapping with the second lower electrode and being positioned in an opening in the partition wall; a second layer positioned between the second lower electrode and the second light-emitting layer; a third light-emitting layer including a region overlapping with the third lower electrode and being positioned in an opening in the partition wall; a third layer positioned between the third lower electrode and the third light-emitting layer; and an upper electrode provided across the first light-emitting layer to the third light-emitting layer. The upper electrode is electrically connected to the auxiliary electrode through a contact hole positioned at least between the first lower electrode and the second lower electrode. Each of the first layer to the third layer includes a hole-transport layer or a hole-injection layer. The partition wall has a stacked-layer structure of a first insulator containing an inorganic material and a second insulator containing an organic material. The contact hole includes a first opening in the first insulator and a second opening in the second insulator. The first insulator includes an end portion exposed from the second opening in a top view of the contact hole. The upper electrode is electrically connected to the auxiliary electrode through a conductive layer exposed from the first opening.

In another embodiment of the present invention, the height of a partition wall along the X direction is preferably lower than the height of the partition wall along the Y direction.

Effect of the Invention

One embodiment of the present invention can provide a display device including an auxiliary electrode and a method of manufacturing the display device, so that a voltage drop caused by an upper electrode can be inhibited.

The description of the above effects does not preclude the existence of other effects. Other effects will be apparent from and can be derived from the description of the specification, the drawings, the claims, and the like. One embodiment of the present invention does not necessarily achieve all the effects.

BRIEF DESCRIPTION OF THE DRAWINGS

FIG. 1B1, FIG. 1B2, and FIG. 1C are cross-sectional views illustrating the pixel region.

FIG. 24A to FIG. 24D2 are cross-sectional views each illustrating a light-emitting device of one embodiment of the present invention.

MODE FOR CARRYING OUT THE INVENTION

Figure 1A:
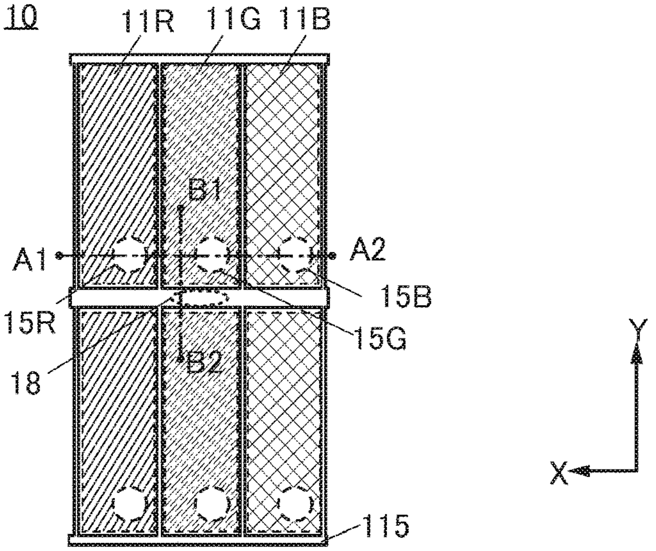
FIG. 1A is a top view illustrating a pixel region of one embodiment of the present invention.
Figure 1A:
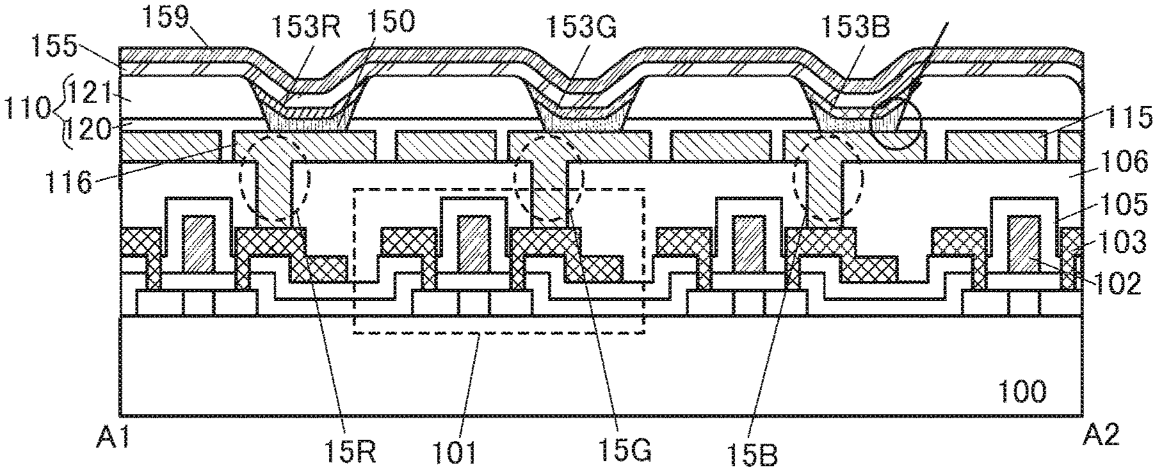
Figure 1A:
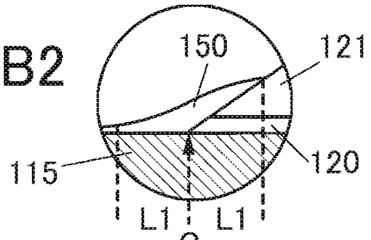

In this specification and the like, components are classified based on their functions and the components are described using independent blocks in a diagram in some cases; however, it is difficult to classify actual components based on their functions completely, and one component can have a plurality of functions.

In this specification and the like, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification and the like, for the sake of convenience, the connection relationship of a transistor is sometimes described assuming that the source and the drain are fixed; in reality, the names of the source and the drain interchange with each other according to the above relationship of the potentials.

In this specification and the like, a "source" of a transistor means a source region of a semiconductor layer functioning as an active layer or means a source electrode connected to the semiconductor layer. Similarly, a drain of a transistor means a drain region of the semiconductor layer or a drain electrode connected to the semiconductor layer. Moreover, a gate of a transistor means a gate electrode.

In this specification and the like, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification and the like, connection is sometimes referred to as electrical connection and may refer to a state where a current, a voltage, or a potential can be supplied or transmitted. Accordingly, connection may refer to connection via an element such as a wiring, a resistor, a diode, or a transistor. Electrical connection may refer to direct connection without via an element such as a wiring, a resistor, a diode, or a transistor.

In this specification and the like, a conductive layer sometimes has a plurality of functions such as those of a wiring and an electrode. In this specification and the like, the phrase “a wiring is connected to an electrode” may be used also in the case where one conductive layer has the above two functions.

In this specification and the like, a first electrode and a second electrode are used for description of a source and a drain of a transistor in some cases; when one of the first electrode and the second electrode refers to a source electrode, the other thereof refers to a drain electrode.

In this specification and the like, a light-emitting device is referred to as a light-emitting element in some cases.

In this specification and the like, a light-emitting device in which a light-emitting layer is formed using a metal mask (MM) is sometimes referred to as a light-emitting device having a metal mask (MM) structure. A metal mask may be referred to as a fine metal mask (FMM) depending on the minuteness of its opening portions. In this specification and the like, a light-emitting device including a light-emitting layer formed without using a metal mask or a fine metal mask is sometimes referred to as a light-emitting device having a metal maskless (MML) structure.

In this specification and the like, a structure in which light-emitting layers in light-emitting devices of different colors (for example, red (R), green (G), and blue (B)) are separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display device.

Light-emitting devices can be classified roughly into a single structure and a tandem structure. A device having a single structure includes one light-emitting unit between a pair of electrodes, and the light-emitting unit preferably includes one or more light-emitting layers. Therefore, the light-emitting unit is referred to as an EL layer in some cases. A light-emitting device with a single structure can emit white light when two or more light-emitting layers have complementary emission colors. For example, when the emission color of a first light-emitting layer and the emission color of a second light-emitting layer are complementary colors, the light-emitting device can be configured to emit white light as a whole. A light-emitting device including three or more light-emitting layers can also emit white light when the light-emitting layers emit light of complementary colors.

A device having a tandem structure includes two or more light-emitting units between a pair of electrodes, and each light-emitting unit preferably includes one or more light-emitting layers. In the tandem structure, an intermediate layer such as a charge-generation layer is suitably provided between the plurality of light-emitting units. To obtain white light emission with a tandem structure, the light-emitting device is configured to obtain white light emission by combining light from light-emitting layers of two or more light-emitting units. In the structure capable of white light emission, light of complementary colors is emitted as in the single structure.

When the above white-light-emitting device (having a single structure or a tandem structure) and the above light-emitting device having an SBS structure are compared to each other, the light-emitting device having an SBS structure can have lower power consumption than the white-light-emitting device. The light-emitting device having an SBS structure is suitable for the case where the power consumption is required to be low. Meanwhile, the white-light-emitting device is preferable in terms of lower manufacturing cost or higher manufacturing yield because the manufacturing process of the white-light-emitting device is simpler than that of a light-emitting device having an SBS structure.

Next, embodiments are described in detail with reference to the drawings. Note that the present invention is not limited to the following description, and it will be readily understood by those skilled in the art that modes and details of the present invention can be modified in various ways without departing from the spirit and scope of the present invention. Therefore, the present invention should not be construed as being limited to the description in the following embodiments. Note that in structures of the invention described below, the same portions or portions having similar functions are denoted by the same reference numerals in different drawings, and the description thereof is not repeated.

Embodiment 1

In this embodiment, a pixel region including an auxiliary electrode in a display device of one embodiment of the present invention will be described.

As illustrated in a top view (also referred to as a plan view) of FIG. 1A, a pixel region 10 included in a display device includes a plurality of pixels. A pixel includes at least a light-emitting device and is a minimum unit that can exhibit one emission color. Such a pixel is referred to as a subpixel in some cases.

The light-emitting device includes a pair of electrodes and a layer containing an organic material (referred to as an organic material layer or an organic compound layer) including a light-emitting layer between the pair of electrodes. In accordance with the order of stacking layers in the light-emitting device, one of the pair of electrodes can be referred to as an upper electrode and the other can be referred to as a lower electrode. The organic material layer or the organic compound layer is a stack of functional layers such as a light-emitting layer, and sometimes referred to as a light-emitting unit or an EL layer positioned between the pair of electrodes. The terms “organic material layer” or “organic compound layer” is used because a large number of organic compounds are used for the functional layers, but at least one of the functional layers may be a layer containing an inorganic material (referred to as an inorganic material layer or an inorganic compound layer). Examples of the functional layers other than the light-emitting layer are a carrier-injection layer (a hole-injection layer and an electron-injection layer) and a carrier-transport layer (a hole-transport layer and an electron-transport layer). The hole-injection layer refers to a layer containing a substance having a high hole-injection property. The electron-injection layer refers to a layer containing a substance having a high electron-injection property. The hole-transport layer refers to a layer containing a substance having a high hole-transport property. The electron-transport layer refers to a layer containing a substance having a high electron-transport property.

FIG. 1A illustrates an example in which the pixel region 10 includes a pixel 11R capable of exhibiting red, a pixel 11G capable of exhibiting green, and a pixel 11B capable of exhibiting blue. Ordinal numbers are sometimes used in order to distinguish pixels; for example, pixels are referred to as a first red pixel and a second red pixel in some cases.

Note that as illustrated in FIG. 1A, the X direction and the Y direction intersecting with the X direction are sometimes used to describe the pixel region 10. For example, in the pixel region 10, the pixel 11R, the pixel 11G, and the pixel 11B are arranged in the X direction, and a plurality of pixels

11R are arranged in the Y direction. Similarly, a plurality of pixels 11B and a plurality of pixels 11G are arranged in the Y direction. In the pixel region 10, in a region adjacent to the pixel 11R in the X direction, the pixel 11G is positioned; and in a region adjacent to the pixel 11R in the Y direction, another pixel 11R is positioned.

The pixel 11R includes at least a contact hole 15R. The contact hole 15R is an opening provided in an insulating layer positioned between a light-emitting device and a transistor driving the light-emitting device in order to obtain electrical connection between the light-emitting device and the transistor. Similarly, the pixel 11G includes at least a contact hole 15G, and the pixel 11B includes at least a contact hole 15B.

As illustrated in FIG. 1A, the pixel region 10 includes an auxiliary electrode 115. Note that the auxiliary electrode is a layer having an auxiliary function for a main electrode, and the auxiliary function includes decreasing resistance of the main electrode. To decrease the resistance of the main electrode, the auxiliary electrode is formed with use of at least a conductive material. Furthermore, the resistivity of the conductive material included in the auxiliary electrode is preferably lower than the resistivity of a conductive material included in the main electrode. In the case where the auxiliary electrode has a stacked-layer structure, a conductive material having a lower resistivity than the conductive material included in the main electrode has is preferably used for at least one layer. However, the resistivity relations are not essential because the auxiliary electrode can decrease the resistance of the main electrode by making the area of the auxiliary electrode larger than the area of the main electrode or making the thickness of the auxiliary electrode larger than the thickness of the main power supply. The auxiliary electrode is sometimes referred to as an auxiliary wiring depending on its shape, but the term auxiliary electrode is used in this specification and the like.

In FIG. 1A, the auxiliary electrodes 115 are placed between pixels in the pixel region 10. The auxiliary electrodes 115 include regions extended in the X direction and the Y direction, and form a lattice pattern in a bird's-eye view. Note that the arrangement of the auxiliary electrodes is not limited to the lattice pattern as long as the auxiliary electrodes can decrease the resistance of the main electrode.

The pixel region 10 includes a contact hole 18. The contact hole 18 is an opening provided in an insulating layer positioned between the auxiliary electrode 115 and an upper electrode 159 included in the light-emitting device in order to obtain electrical connection between the auxiliary electrode 115 and the upper electrode 159. The upper electrode 159 will be described later. A top surface shape of the contact hole 18 is preferably larger than that of the contact hole 15R or the like included in each pixel; for example, when the top surface shape is a circle, the diameter of the contact hole 18 is preferably longer than that of the contact hole 15R.

Next, FIG. 1B1 shows a cross-sectional view taken along A1-A2 across the contact hole the contact hole 15G, and the contact hole 15B in FIG. 1A. FIG. 1C shows a cross-sectional view taken along B1-B2 across the contact hole 18 in FIG. 1A.

<Transistor 101>

Figure 1C:
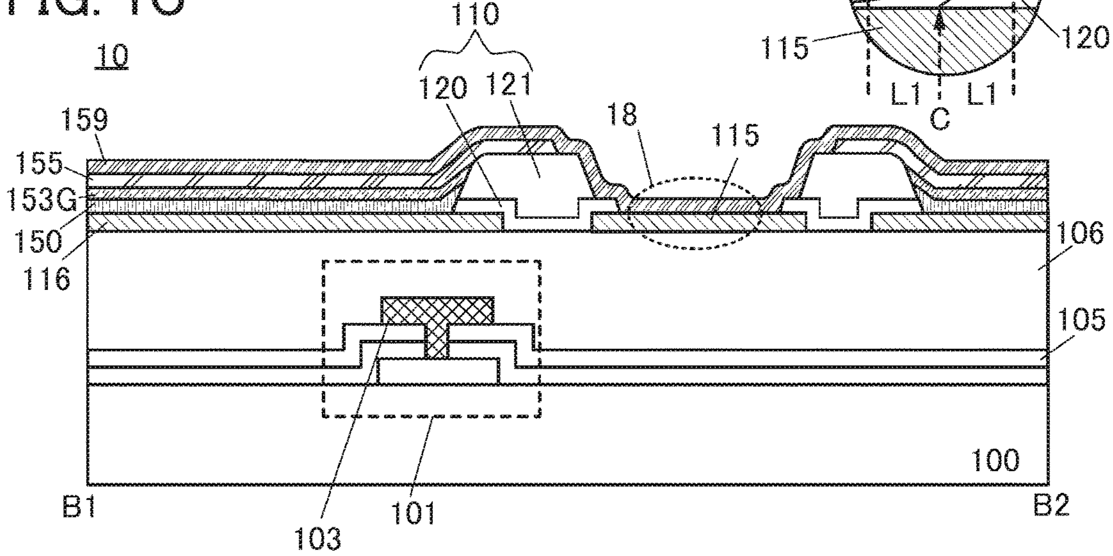

FIG. 1B1 and FIG. 1C illustrate an example in which a transistor 101 is provided over a substrate 100. The transistor 101 is an element for driving a light-emitting device (referred to as a driver element). A display device including the driver element in each pixel is referred to as an active matrix display device.

The transistor 101 includes at least a semiconductor layer, a gate 102, and a source and a drain 103; FIG. 1B1 illustrates a top-gate transistor as the transistor 101 in which the gate 102 is positioned over the semiconductor layer as an example. Needless to say, in the present invention, a bottom-gate transistor in which a gate is positioned under a semiconductor layer may be employed or a dual-gate transistor in which a gate is positioned over and under a semiconductor layer may be employed.

A gate insulating layer is positioned between the gate 102 and the semiconductor layer. The semiconductor layer can be formed with silicon or an oxide semiconductor, and can have crystallinity or include amorphous. In the case where the semiconductor layer is formed with silicon, regions in contact with the source and the drain 103 are called impurity regions, and the resistance of the impurity regions is decreased by adding an element other than silicon (referred to as an impurity element) such as phosphorus or boron to the impurity regions (the impurity region is also referred to as a low-resistance region).

The source and the drain 103 can have a single layer structure of a conductive layer or a stacked-layer structure of conductive layers. The conductive layer contains a conductive material, and the conductive material contains aluminum, titanium, copper, tungsten, molybdenum, or nickel. In the case of the stacked-layer structure, a conductive layer containing titanium, a conductive layer containing aluminum, and a conductive layer containing titanium are preferably used.

The gate 102 can have a single layer structure of a conductive layer or a stacked-layer structure of conductive layers. The conductive layer contains a conductive material, and the conductive material contains aluminum, titanium, copper, tungsten, molybdenum, or nickel. In the case of the stacked-layer structure, a conductive layer containing molybdenum and a conductive layer containing tungsten are preferably used.

The gate 102 is covered with at least an insulating layer 105. Each of the source and the drain 103 can include a region in contact with the semiconductor layer through an opening provided in the gate insulating layer and an opening provided in the insulating layer 105. Note that in FIG. 1C, a state in which one of the source and the drain 103 is in contact with the semiconductor layer can be seen.

The gate insulating layer and the insulating layer 105 preferably contain an inorganic material. When the insulating layer 105 contains an inorganic material, an impurity element can be inhibited from entering the semiconductor layer.

As the inorganic material, it is preferable to use one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Note that a material obtained by adding an impurity element, such as lanthanum (La), nitrogen, or zirconium (Zr), to the above material may be used.

An insulating layer 106 is provided over the insulating layer 105. A top surface of the insulating layer 106 corresponds to a surface where a lower electrode of a light-emitting device to be formed later is formed, and thus preferably has a flatness. For example, when the insulating layer 106 is formed with an organic material, the insulating layer 106 can have a flatness.

As the organic material, an organic resin such as a polyimide resin, a polyamide resin, an acrylic resin, a siloxane resin, a silicone resin, an epoxy resin, or a phenol resin is preferably used. Note that a material obtained by adding an impurity element, such as lanthanum, nitrogen, or zirconium, to the above material may be used.

Application Example of Transistor

Cross-sectional structures of a transistor that can be used as the transistor 101 will be described.

Structure Example 1: Top-Gate Transistor

Figure 2A:
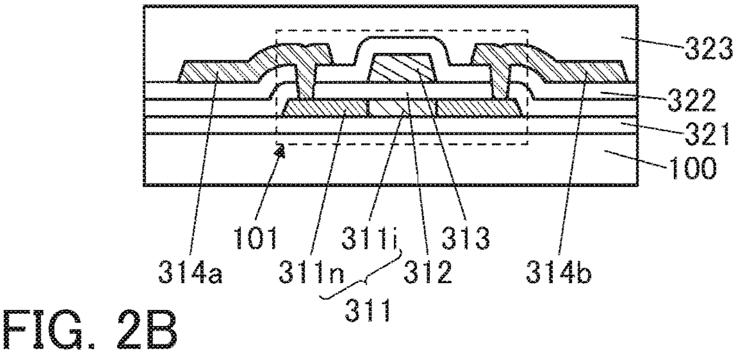
FIG. 2A to FIG. 2D are cross-sectional views illustrating structure examples of a transistor.

FIG. 2A is a cross-sectional view including the transistor 101. The transistor 101 is provided over the substrate 100, and a transistor including polycrystalline silicon, which is silicon and has crystallinity, in a semiconductor layer can be used as the transistor 101. In that case, the transistor 101 can be referred to as an LTPS transistor.

The transistor 101 includes a semiconductor layer 311, an insulating layer 312, a conductive layer 313, and the like. The semiconductor layer 311 includes a channel formation region 311*i* and low-resistance regions 311*n*. At least the channel formation region 311*i* contains silicon, preferably contains polycrystalline silicon. Part of the insulating layer 312 functions as a gate insulating layer. A region of the conductive layer 313 overlapping with the semiconductor layer 311 functions as a gate.

Note that the semiconductor layer 311 can contain an oxide semiconductor (also referred to as metal oxide exhibiting semiconductor characteristics). The transistor includes an oxide semiconductor in at least a channel formation region. At this time, the transistor 101 can be referred to as an OS transistor, and the semiconductor layer is referred to as an oxide semiconductor layer in some cases.

The transistor 101 includes a conductive layer 314*a*, a conductive layer 314*b*, and the like. The conductive layer 314*a* can function as one of a source and a drain, and the conductive layer 314*b* can function as one of a source and a drain. The one of the source and the drain of the transistor 101 can be electrically connected to a lower electrode 116 of the light-emitting device. In FIG. 2A, one of the conductive layer 314*a* and the conductive layer 314*b* can be electrically connected to the lower electrode 116 to be described later, and a contact hole can be formed in an insulating layer 323 that is positioned between the one of the conductive layer 314*a* and the conductive layer 314*b* and the lower electrode 116, for example.

An insulating layer 321 is preferably provided between the substrate 100 and the transistor 101, and in FIG. 2A, the semiconductor layer 311 is provided over the insulating layer 321. As the other components, the components described with reference to FIG. 1 can be used.

Structure Example 2: Dual-Gate Transistor

Figure 2B:
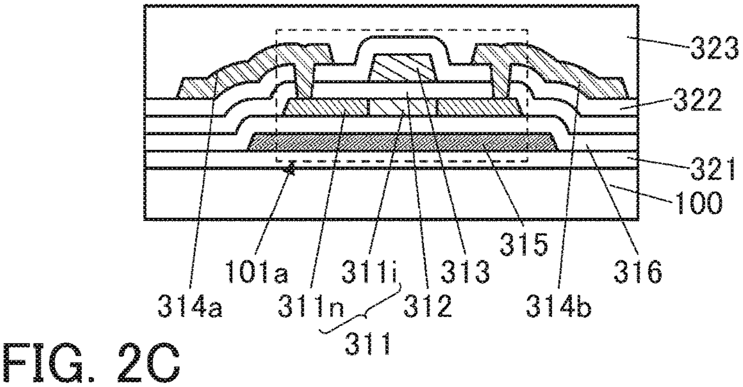

FIG. 2B illustrates a transistor 101*a* including a pair of gates. The transistor 101*a* illustrated in FIG. 2B is different from that in FIG. 2A mainly in including a conductive layer 315 and an insulating layer 316.

The conductive layer 315 is provided over the insulating layer 321. The insulating layer 316 is provided to cover the conductive layer 315 and the insulating layer 321. The semiconductor layer 311 is provided such that at least the channel formation region 311*i* overlaps with the conductive layer 315 with the insulating layer 316 therebetween.

In the transistor 101*a* illustrated in FIG. 2B, part of the conductive layer 313 functions as a first gate, and part of the conductive layer 315 functions as a second gate. At this time, part of the insulating layer 312 functions as a first gate insulating layer, and part of the insulating layer 316 functions as a second gate insulating layer.

Here, to electrically connect the first gate to the second gate, the conductive layer 313 is electrically connected to the conductive layer 315 through an opening provided in the insulating layer 312 and the insulating layer 316 in a region not illustrated. To electrically connect the second gate to a source or a drain, the conductive layer 315 is electrically connected to the conductive layer 314*a* or the conductive layer 314*b* through an opening provided in the insulating layer 322, the insulating layer 312, and the insulating layer 316 in a region not illustrated.

Also in the transistor 101*a*, the conductive layer 314*a* can function as one of a source and a drain, and the conductive layer 314*b* can function as one of a source and a drain. The one of the source and the drain of the transistor 101 can be electrically connected to a lower electrode 116 of the light-emitting device. In FIG. 2B, one of the conductive layer 314*a* and the conductive layer 314*b* can be electrically connected to the lower electrode 116 to be described later, and a contact hole can be formed in an insulating layer 323 that is positioned between the one of the conductive layer 314*a* and the conductive layer 314*b* and the lower electrode 116, for example.

In the case where LTPS transistors are used as the transistors included in the pixel 11R illustrated in FIG. 1 or the like, the transistor 101 illustrated in FIG. 2A or the transistor 101*a* illustrated in FIG. 2B can be used. In the case where OS transistors are used as the transistors included in the pixel 11R illustrated in FIG. 1 or the like, the transistor 101 illustrated in FIG. 2A or the transistor 101*a* illustrated in FIG. 2B can be used.

Structure Example 3

Figure 2C:
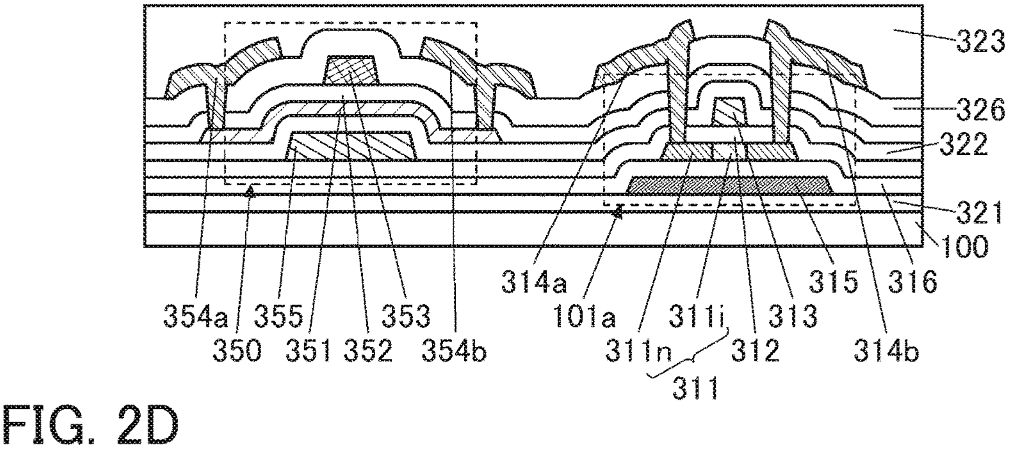

A plurality of transistors are provided in the pixel 11R and the like illustrated in FIG. 1, and a combination of the transistor 101 and the transistor 101*a* may be employed for the pixel; for example, the transistor 101 is used as one of the plurality of transistors and the transistor 101*a* is used as another one of the plurality of transistors. For example, an LTPS transistor can be used as the transistor 101 and an OS transistor can be used as the transistor 101*a*. FIG. 2C is a cross-sectional view including a plurality of transistors.

FIG. 2C is a cross-sectional view including the transistor 101*a* and a transistor 350. The transistor 101*a* is illustrated on the right side of FIG. 2C, and an LTPS transistor can be used as the transistor 101*a*. The transistor 350 is illustrated on the left side of FIG. 2C, and an OS transistor can be used as the transistor 350. The transistor 101*a* and the transistor 350 each include a pair of gates, and are different in the positions of the gates.

Although the transistor 101*a* includes an insulating layer 326 that is not illustrated in FIG. 2B, the description of FIG. 2B can be referred to for the other components. Also in the transistor 101*a* illustrated in FIG. 2C, one of the conductive layer 314*a* and the conductive layer 314*b* can be electrically connected to the lower electrode 116, and a contact hole can be formed in an insulating layer 323 that is positioned between the one of the conductive layer 314*a* and the conductive layer 314*b* and the lower electrode 116, for example.

The transistor 350 includes a conductive layer 355, the insulating layer 322, a semiconductor layer 351, an insulating layer 352, a conductive layer 353, and the like. Part of the conductive layer 353 functions as a first gate of the transistor 350, and part of the conductive layer 355 functions as a second gate of the transistor 350. At this time, part of the insulating layer 352 functions as a first gate insulating layer of the transistor 350, and part of the insulating layer 322 functions as a second gate insulating layer of the transistor 350.

The conductive layer 355 is provided over the insulating layer 312. The insulating layer 322 is provided to cover the conductive layer 355. The semiconductor layer 351 is provided over the insulating layer 322. The insulating layer 352 is provided to cover the semiconductor layer 351 and the insulating layer 322. The conductive layer 353 is provided over the insulating layer 352 and includes a region overlapping with the semiconductor layer 351 and the conductive layer 355.

The insulating layer 326 is provided to cover the insulating layer 352 and the conductive layer 353. A conductive layer 354*a* and a conductive layer 354*b* are provided over the insulating layer 326. The conductive layer 354*a* and the conductive layer 354*b* are electrically connected to the semiconductor layer 351 in openings provided in the insulating layer 326 and the insulating layer 352. The conductive layer 354*a* functions as one of a source and a drain, and the conductive layer 354*b* functions as the other of the source and the drain. The insulating layer 323 is provided to cover the conductive layer 354*a*, the conductive layer 354*b*, and the insulating layer 326.

Here, the conductive layer 314*a* and the conductive layer 314*b* of the transistor 101*a* are preferably formed by processing the same conductive film as the conductive layer 354*a* and the conductive layer 354*b*. In FIG. 2C, the conductive layer 314*a*, the conductive layer 314*b*, the conductive layer 354*a*, and the conductive layer 354*b* are formed on the same film formation surface (specifically, the top surface of the insulating layer 326) and contain the same metal element. In this case, the conductive layer 314*a* and the conductive layer 314*b* can be electrically connected to the low-resistance regions 311*n* through contact holes provided in the insulating layer 326, the insulating layer 352, the insulating layer 322, and the insulating layer 312. This is preferable because the manufacturing process can be simplified.

Moreover, the conductive layer 313 functioning as the first gate of the transistor 101*a* and the conductive layer 355 functioning as the second gate of the transistor 350 are preferably formed by processing the same conductive film. In FIG. 2C, the conductive layer 313 and the conductive layer 355 are formed on the same film formation surface (specifically, the top surface of the insulating layer 312) and contain the same metal element. This is preferable because the manufacturing process can be simplified.

Figure 2D:
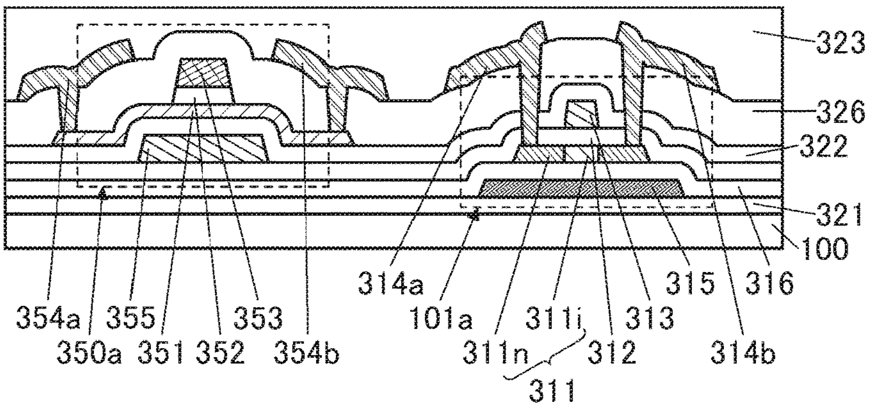

In FIG. 2C, the insulating layer 352 functioning as the first gate insulating layer of the transistor 350 covers the semiconductor layer 351; however, the insulating layer 352 may be processed to have substantially the same top surface shape as that of the conductive layer 353 as in the transistor 350*a* illustrated in FIG. 2D.

<Lower Electrode 116>

As illustrated in FIG. 1B1 and the like, the lower electrode 116 is formed over the insulating layer 106. The lower electrode 116 corresponds to an electrode in a lower position of a pair of electrodes included in the light-emitting device, and functions as an anode, for example. The lower electrode 116 is positioned on the transistor 101 side. The lower electrode 116 is electrically connected to the transistor 101, and a signal can be supplied from the transistor 101 to the light-emitting device. Since the signal differs between pixels, the lower electrodes 116 are processed to be independent between the pixels. This processing is referred to as patterning in some cases. Each of the pixel 11R, the pixel 11G, and the pixel 11B includes the lower electrode 116, and ordinal numbers are sometimes added to the lower electrodes 116 to distinguish the lower electrodes 116; for example, terms a "first lower electrode" and a "second lower electrode" are used. The lower electrode 116 may be referred to as a pixel electrode.

Although a top surface shape of the lower electrode 116 is not limited, the lower electrode 116 in FIG. 1A has a rectangle shape whose short side is along with the X direction and long side is along with the Y direction.

Although a cross-sectional shape of the lower electrode 116 is not limited, an end portion preferably has a tapered shape. In this specification and the like, a tapered shape indicates a shape in which at least part of a side surface of a structure is inclined to a formation surface or a substrate surface. For example, an angle formed by an inclined side surface and a substrate surface is referred to as a taper angle, and a tapered shape indicates a region whose taper angle is less than 90°. Note that a side surface of the structure may be a substantially planar surface having a fine curvature or a substantially planar surface having a fine unevenness. The taper angle can be measured by providing a line from a top end to a bottom end of the side surface of the structure. Similarly, the formation surface or the substrate surface may be a substantially planar surface having a fine curvature or a substantially planar surface having a fine unevenness. The taper angle of the end portion of the lower electrode 116 is greater than or equal to 35° and less than 90°, preferably greater than or equal to 40° and less than or equal to 80°.

To obtain electrical connection between the lower electrode 116 and the transistor 101, an insulating layer positioned therebetween includes an opening, and the opening functions as a contact hole. For example, in FIG. 1B1, the insulating layer 106 includes openings formed in the insulating layer 106 as the contact hole 15R, the contact hole 15G, and the contact hole 15B. Each of the contact holes includes a region where one of the source and the drain 103 and the lower electrode 116 are in contact with each other. However, for example, another conductive layer may exist between the one of the source and the drain 103 and the lower electrode 116 as long as electrical connection is obtained through the contact hole. That is, a structure in which the one of the source and the drain 103 and the lower electrode 116 are not in contact with each other may be employed.

Since the lower electrode 116 functions as an anode, a material having a large work function is preferably used. For this reason, the lower electrode 116 can have a single-layer structure of an ITO film (an oxide film containing indium and tin), an indium tin oxide film containing silicon, an indium oxide film containing zinc oxide at 2 wt % or higher and 20 wt % or lower, a titanium nitride film, a chromium film, a tungsten film, a Zn film, a Pt film, a Cu film, an Al film, or the like, a stacked-layer structure of a titanium nitride film and a film containing aluminum as its main component, or a stacked-layer structure of a titanium nitride film, a film containing aluminum as its main component, and a titanium nitride film, for example. The film containing aluminum as its main component may contain nickel, tungsten, a rare earth element (e.g., lanthanum), or the like in addition to aluminum. In the case where any of the above stacked-layer structures is used, a low-resistance material can be used for one layer and a material capable of forming favorable ohmic contact with one of the source and the drain

103 can be used for another layer, which is preferable. The thickness of the lower electrode 116 is preferably greater than or equal to 100 nm and less than or equal to 250 nm.

In the case of a display device in which light is extracted from the lower electrode 116 side, the lower electrode 116 needs to have a light-transmitting property. In order to obtain a light-transmitting property, for example, a light-transmitting material is selected from the above materials, or the lower electrode 116 is made thin when a non-light-transmitting material is selected.

<Auxiliary Electrode 115>

The auxiliary electrode 115 is formed with the same material as the lower electrode 116. In FIG. 1B1 and FIG. 1C, the auxiliary electrode 115 is provided over the insulating layer 106 provided with the lower electrode 116. The auxiliary electrode 115 is processed not to have the same potential as the lower electrode 116; in other words, the auxiliary electrode 115 and the lower electrode 116 need to be independent from each other. FIG. 1A illustrates an example in which the auxiliary electrode 115 and the lower electrode 116 are arranged to be independent from each other. The auxiliary electrodes 115 are disposed between the pixel 11R, the pixel 11G, and the pixel 11B to include regions extended in the X direction and the Y direction, that is, the auxiliary electrodes 115 are arranged in a lattice pattern. The distance between the lower electrode 116 and the auxiliary electrode 115 in a region along the Y direction is preferably larger than the distance between the lower electrode 116 and the auxiliary electrode in a region along the X direction.

The auxiliary electrode 115 can be electrically connected to the upper electrode 159 of the light-emitting device to be formed later. The resistance of the upper electrode 159 can be lowered by the auxiliary electrode 115, so that a voltage drop can be inhibited.

<Partition Wall 110>

In the case where one of an organic material layer and an organic compound layer, for example, light-emitting layers, are separately colored by a wet method, for example, by an ink-jet method, a partition for dropping a solution is needed. The partition can be formed with an insulator and such an insulator is referred to as a partition wall or a bank in some cases. In the case where each light-emitting layer is formed by an evaporation method, the insulator has a function of holding a metal mask, specifically, a fine metal mask in some cases.

A wet method is the method in which a material having a predetermined function is liquefied by being dissolved or dispersed in a solvent to obtain a liquid composition and the liquid composition is applied. Examples of the material having a predetermined function include a material having a hole-injection property, a material having a hole-transport property, a light-emitting material, a material having an electron-transport property, and a material having an electron-injection property. The liquid composition is referred to as a droplet or an ink material in some cases. After being applied, the liquid composition is solidified or made to be a thin film through a drying step or a curing step, whereby the organic material layer or the organic compound layer can be obtained. When the liquid composition is solidified or made to be a thin film, the material becomes a hole-injection layer, a hole-transport layer, a light-emitting layer, an electron-transport layer, or an electron-injection layer.

In an ink-jet method, a spin coating method, or the like, a liquid composition is referred to as a droplet in many cases, but may be referred to as an ink material. Furthermore, although description "a droplet is dropped" is used, description "an ink material is applied" may be used.

A wet method includes an inkjet method, a spin coating method, a coating method, an ink-jet nozzle printing method, gravure printing, and the like.

Examples of a solvent that can be used in the case where the wet method is employed include: chlorine-based solvents such as dichloroethane, trichloroethane, chlorobenzene, and dichlorobenzene; ether-based solvents such as tetrahydrofuran, dioxane, anisole, and methylanisole; aromatic hydrocarbon-based solvents such as toluene, xylene, mesitylene, ethylbenzene, hexylbenzene, and cyclohexylbenzene; aliphatic hydrocarbon-based solvents such as cyclohexane, methylcyclohexane, pentane, hexane, heptane, octane, nonane, decane, dodecane, and bicyclohexyl; ketone-based solvents such as acetone, methyl ethyl ketone, benzophenone, and acetophenone; ester-based solvents such as ethyl acetate, butyl acetate, ethyl cellosolve acetate, methyl benzoate, and phenyl acetate; polyalcohol-based solvents such as ethylene glycol, glycerin, and hexanediol; alcohol-based solvents such as isopropyl alcohol and cyclohexanol; a sulfoxide-based solvent such as dimethylsulfoxide; and amide-based solvents such as methylpyrrolidone and dimethylformamide. As the solvent, one or more of the above materials can be used.

The material formed by an ink-jet method preferably includes a high molecular material (also referred to as a polymer organic material in some cases). In particular, a high molecular material containing a light-emitting material is referred to as a polymer organic light-emitting material in some cases. A high molecular material is preferable because it is easily mixed with a solvent. Among the above solvents, solvents that are easily mixed with a high molecular material are toluene and xylene, for example.

In FIG. 1B1 and FIG. 1C, the partition wall 110 is formed over the lower electrode 116 and the auxiliary electrode 115. Note that a partition is not illustrated in FIG. 1A.

As illustrated in FIG. 1B1, the partition wall 110 covers an end portion of the lower electrode 116 and includes an opening so as to expose the center portion of the lower electrode 116. In FIG. 1B1, the partition wall 110 covering the entire auxiliary electrode 115 can be seen. In FIG. 1C, the contact hole 18 that is formed in the partition wall 110 in order to electrically connect the auxiliary electrode 115 to the upper electrode can be observed.

In one embodiment of the present invention, the partition wall 110 includes a first partition wall (referred to as a first insulator) 120 and a second partition wall (referred to as a second insulator) 121, and preferably has a stacked-layer structure of these partition walls. It is preferable that the first insulator 120 include an inorganic material and the second insulator 121 include an organic material. An organic material is preferably used for the second insulator 121, in which case the partition wall 110 can be made high. To make the partition wall 110 high, the first insulator 120 may also include an organic material. An ink-jet device can be moved along the high partition wall 110. The high partition wall 110 can inhibit color mixing between materials for different colors when the light-emitting layers are formed by an ink-jet method.

An inorganic material contained in the partition wall 110 preferably contains one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. In the case where the partition wall 110 has a stacked-layer structure, the first insulator 120 or the second insulator 121 preferably contains the above inorganic material.

An organic material contained in the partition wall 110 preferably contains an organic resin such as a polyimide resin, a polyamide resin, an acrylic resin, a siloxane resin, a silicone resin, an epoxy resin, or a phenol resin. In the case where the partition wall 110 has a stacked-layer structure, the second insulator 121 preferably contains the organic material. In the case where the partition wall 110 is desired to be made high, the first insulator 120 may contain the organic material.

Note that a material in which an impurity element such as lanthanum (La), nitrogen, zirconium (Zr), or the like is added to the above inorganic or organic material may be used.

In a top view of the pixel region 10, the partition wall 110 has a structure in which pixels are partitioned, in other words, the partition wall 110 has a lattice pattern including regions extended in the X direction and the Y direction. That is, the partition wall 110 is provided in a region overlapping with the auxiliary electrode 115.

When an opening is formed in a partition wall formed with an organic material, an upper end portion of the partition wall 110 is rounded as in FIG. 1B1 in some cases. Being rounded is described as having a curvature in some cases. Note that in the partition wall 110, at least an upper end portion of the second insulator 121 has a curvature. When an opening is formed, a lower end portion of the partition wall 110 can have a curvature. Note that in the partition wall 110, at least a lower end portion of the first insulator 120 has have a curvature.

As illustrated in FIG. 1B1 and FIG. 1C, in a cross-sectional view of the pixel region 10, an end portion of the partition wall 110 preferably has a tapered shape. For example, the partition wall 110 can have a forward tapered shape in which a bottom surface of the partition wall 110 has a longer diameter than a top surface thereof and the end portion is tapered. Alternatively, the partition wall 110 can have an inverse tapered shape in which the bottom surface of the partition wall 110 has a shorter diameter than the top surface thereof and the end portion is tapered. The both tapered shapes are common in that the end portion of the partition wall 110 is inclined, and the inclined end portion enables a solution from an ink-jet to drop to a target pixel, which can inhibit color mixing. Note that in the case where the second insulator 121 has a larger thickness than the first insulator 120 in the partition wall 110, at least the end portion of the second insulator 121 is inclined. The taper angle of the end portion of the partition wall 110 may be more obtuse than the taper angle of the end portion of the lower electrode 116, and is greater than or equal to and less than or equal to 70°, preferably greater than or equal to 20° and less than or equal to <Layer 150>

As illustrated in FIG. 1B1 and FIG. 1C, a layer 150 is formed over the lower electrode 116. The layers 150 are positioned between the lower electrode 116 and a light-emitting layer 153R, a light-emitting layer 153G, and a light-emitting layer 153B which are described later, and has a function of injecting holes from the lower electrode 116 to the light-emitting layer 153R, the light-emitting layer 153G, and the light-emitting layer 153B. For the layer 150, a structure including a hole-injection layer, a structure including a hole-transport layer, or a stacked-structure of a hole-injection layer and a hole-transport layer which are positioned in this order from the lower electrode 116 side can be used, for example. In order to distinguish the layers 150, ordinal numbers are added in some cases; for example, the terms a first layer and a second layer are used in some cases.

For example, the layer 150 is preferably formed by a wet method or the like. Examples of the wet method include a spin coating method, an ink-jet method, a cast method, a printing method, a dispensing method, and a spray method. By forming at least the layer 150 by a wet method, the productivity can be improved. A structure in which at least the layer 150 is formed by a wet method is suitable for a display device having flexibility. The thickness of the layer 150 formed by a wet method is described with reference to FIG. 1B2 which shows a region denoted by a circle and an arrow in FIG. 1B1, that is, an enlarged view of an end portion of the partition wall 110. FIG. 1B2 illustrates the first insulator 120 and the second insulator 121.

First, an end portion of the first insulator 120 is regarded as a center (C). A distance L1 is from the center (C) to an end of the layer 150 (an end positioned on a side overlapping with a slope of the partition wall 110). Similarly, the distance L1 is set on a side opposite to the end of the layer 150 from the center (C), and an area from the center (C) to the distance L1 is shown. An area within the distance L1 is sometimes referred to as a neighboring region of the partition wall. The thickness of the layer 150 in the neighboring region of the partition wall is larger than that in the center portion of a light-emitting area. In other words, the neighboring region of the partition wall is increased in thickness in some cases. Such a thick region is referred to as a puddle of liquid in some cases. The layer 150 has the largest thickness in a region overlapping with the center (C) in many cases. The layer 150 having an increased thickness in the neighboring region of the partition wall is regarded as being formed by a wet method.

The layer 150 may be formed in the entire pixel region 10 without being divided for pixels. That is, the layer 150 can be formed across a plurality of lower electrodes to be shared by pixels. The layer 150 can be formed by a wet method or an evaporation method. The layer 150 which can be shared by the pixels is preferably formed by a spin coating method or an evaporation method.

As illustrated in FIG. 1B1 and FIG. 1C, the layer 150 may be divided for pixels by the partition wall 110. When the layer 150 is formed by a spin coating method and liquid repellent treatment is performed on a top surface of the partition wall 110, a structure in which the layer 150 is not positioned on the top surface of the partition wall 110 can be obtained. When evaporation is performed with use of a metal mask in the formation of the layer 150 by an evaporation method, the structure in which the layer 150 is not positioned on the top surface of the partition wall 110 can be obtained.

<Light-Emitting Layer 153R, Light-Emitting Layer 153G, and Light-Emitting Layer 153B>

The light-emitting layer 153R, the light-emitting layer 153G, and the light-emitting layer 153B are formed over the layer 150 by separate coloring. The separately colored structure corresponds to an SBS structure. The emission colors of the light-emitting layer 153R, the light-emitting layer 153G, and the light-emitting layer 153B are a red color, a green color, and a blue color, respectively, which enable full color display.

The light-emitting layer 153R, the light-emitting layer 153G, and the light-emitting layer 153B are preferably formed by, for example, a wet method similar to that employed for the layer 150. Examples of the wet method include a spin coating method, an ink-jet method, a cast method, a printing method, a dispensing method, and a spray method. By forming at least a light-emitting layer by a wet method, the productivity can be improved. A structure in which at least a light-emitting layer is formed by a wet method is suitable for a display device having flexibility.

As in the description of the thickness of the layer 150 with reference to FIG. 1B2, the thicknesses of the light-emitting layer 153R, the light-emitting layer 153G, and the light-emitting layer 153B are also increased in the neighboring region of the partition wall 110. That is, the thicknesses of the light-emitting layer 153R, the light-emitting layer 153G, and the light-emitting layer 153B are larger in the neighboring region of the partition wall than those in the center region of a light-emitting area of the partition wall.

The light-emitting layer 153R, the light-emitting layer 153G, and the light-emitting layer 153B which are increased in thickness in the neighboring region of the partition wall are regarded as being formed by a wet method.

<Ink-Jet Method>

Figure 4A:
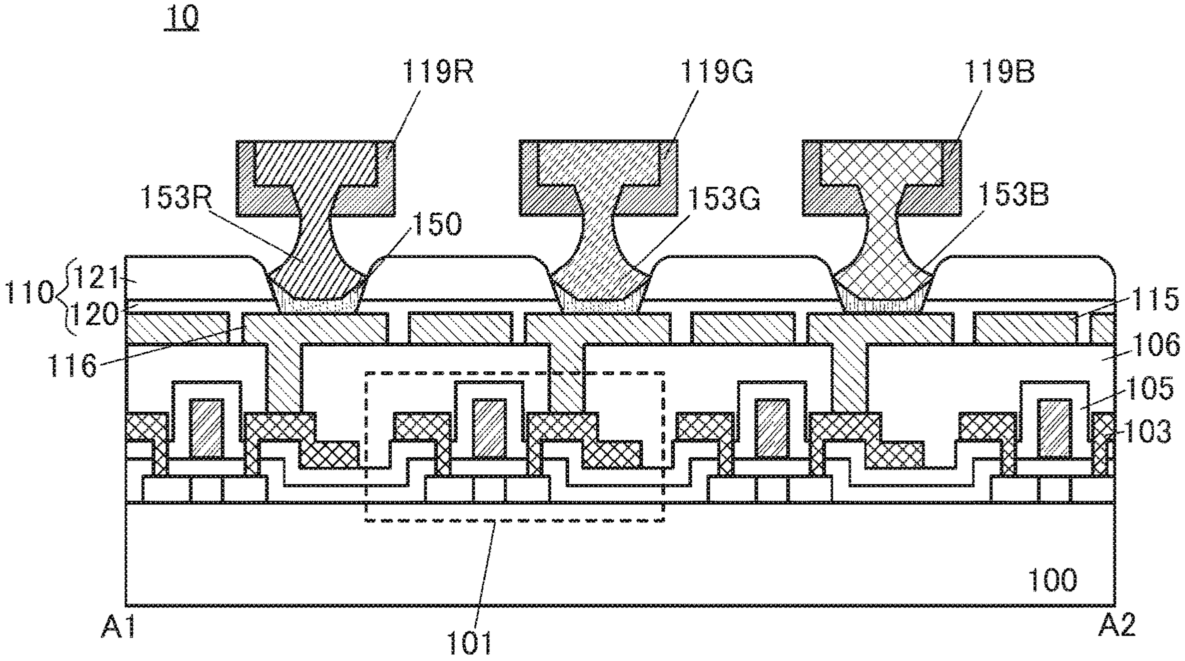
FIG. 4A and FIG. 4B are cross-sectional views illustrating a method of forming a pixel region by using an ink-jet method of one embodiment of the present invention.
Figure 4B:
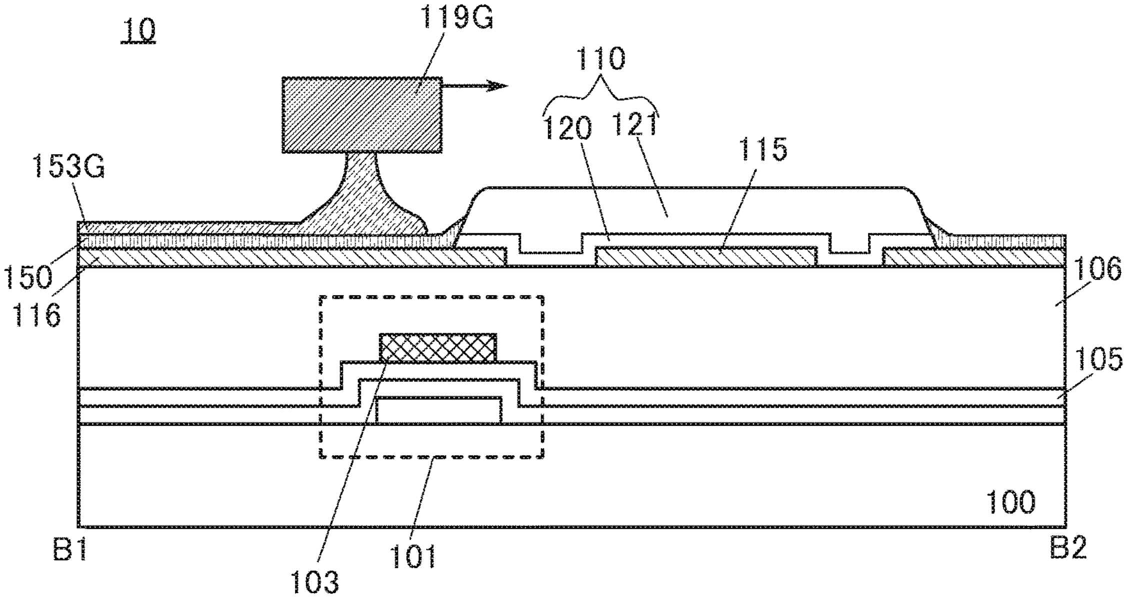

FIG. 4A and FIG. 4B illustrate an ink-jet device that can be used for the above-described ink-jet method. FIG. 4A illustrates a state where the light-emitting layer 153R, the light-emitting layer 153G, and the light-emitting layer 153B are formed, and FIG. 4B illustrates a state where the light-emitting layer 153G is formed. Note that the layer 150 may be formed with the ink-jet device illustrated in FIG. 4A and FIG. 4B, and the layer 150, the light-emitting layer 153R, the light-emitting layer 153G, and the light-emitting layer 153B can be formed with the same ink-jet device. By forming a layer by a wet method, the productivity can be improved.

FIG. 4A and FIG. 4B illustrate ink-jet nozzles 119R, 119G, and 119B included in the ink-jet device. Each of opening diameters of the ink-jet nozzles 119R, 119G, and 119B (also referred to as ink-jet nozzle diameters) is greater than or equal to several micrometers and less than or equal to several tens of micrometers. A portion having the ink-jet nozzle is sometimes referred to as a head. The head for dropping a solution is provided with a control portion for solution injection, and includes a thermoelectric conversion element (Peltier element) and the like. The solution can be dropped from the head by changing the volume of an ink tank connected to the ink-jet nozzle by a pressure element. The amount of one drop is greater than or equal to several picoliters and less than or equal to several tens of picoliters in many cases in accordance with the ink-jet nozzle diameter. Although depending on the material, approximately one picoliter droplet can be considered to form an approximately 10 μm cube.

The solution may be dropped intermittently from the ink-jet nozzles 119R, 119G, and 119B. Alternatively, the solution may be linearly dropped continuously from the ink-jet nozzles 119R, 119G, and 119B.

By the ink-jet method, the light-emitting layer 153R, the light-emitting layer 153G, and the light-emitting layer 153B, which correspond to the respective emission colors, can be formed in openings in the partition wall 110 at the same time, as illustrated in FIG. 4A. FIG. 4B shows a cross-sectional view of the light-emitting layer 153G, and shows a state before the ink-jet nozzle 119R that can transfer in the arrow direction gets over the partition wall 110. For the other components in FIG. 4A and FIG. 4B, FIG. 1 and the like can be referred to.

In a layer formed by the ink-jet method, a puddle of liquid is observed in the vicinity of the partition wall 110. For the puddle of liquid, the description with reference to FIG. 1B2 can be referred to, and the puddle of liquid corresponds to a thick portion of the light-emitting layer 153R, the light-emitting layer 153G, the light-emitting layer 153B, or the layer 150 in the vicinity of the partition wall 110.

The puddle of liquid is caused by a drying step in a normal-pressure atmosphere or a reduced-pressure atmosphere which is performed for removing a solvent. In particular, in the drying step in a reduced-pressure atmosphere, a phenomenon in which a solute gather outward using the surface tension of the solution as the driving force causes a puddle of liquid. A layer in which such a puddle of liquid is observed is regarded as being formed by a wet method such as an ink-jet method.

In the case of employing a wet method such as an ink-jet method, at least light-emitting layers can be separately colored without using a metal mask; accordingly, a light-emitting device including the light-emitting layer can be regarded as a light-emitting device having an MML structure.

<Evaporation Method>

Figure 5A:
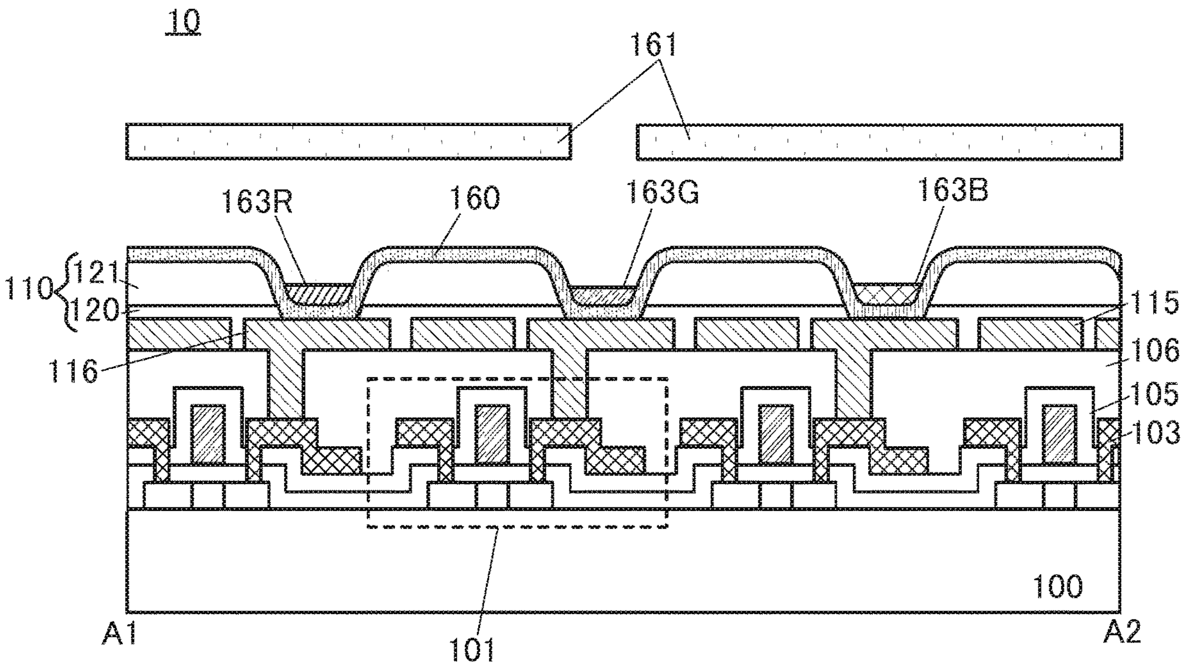
FIG. 5A and FIG. 5B are cross-sectional views illustrating a method of forming a pixel region by using an evaporation method of one embodiment of the present invention.
Figure 5B:
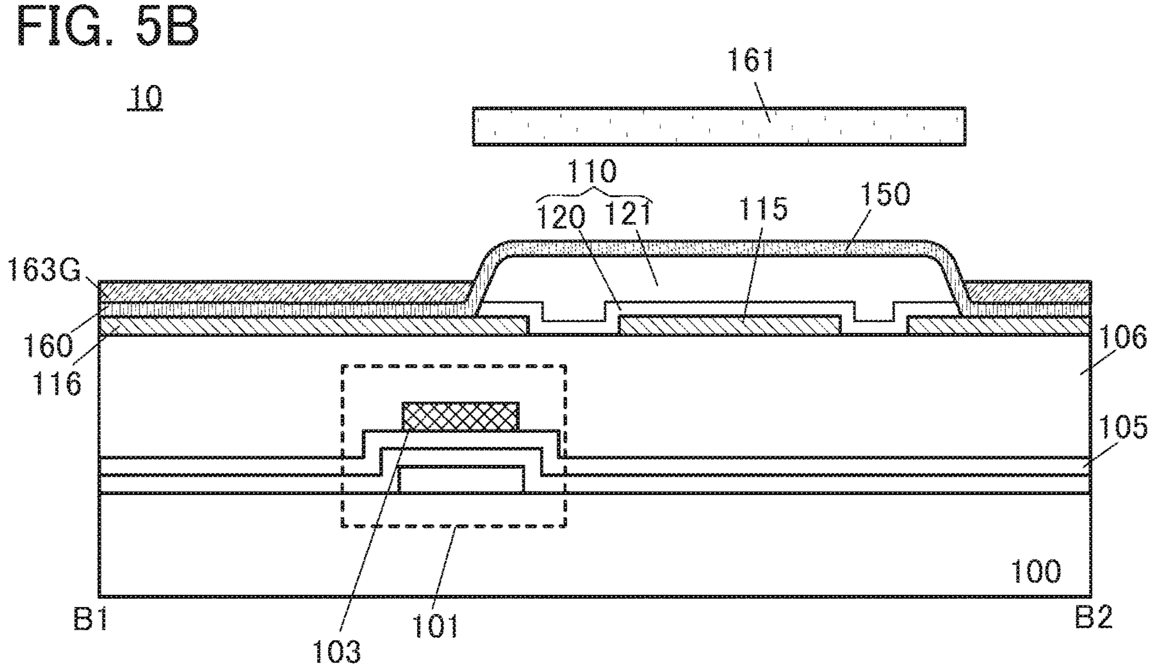

A light-emitting layer 163R, a light-emitting layer 163G, and a light-emitting layer 163B may be formed by an evaporation method. FIG. 5A and FIG. 5B illustrate a state where the light-emitting layer 163R, the light-emitting layer 163G, and the light-emitting layer 163B are formed by an evaporation method. Although a layer 160 positioned below the light-emitting layer 163R, the light-emitting layer 163G, and the light-emitting layer 163B can also be formed by an evaporation method, the layer 160 in FIG. 5A is formed by a wet method. The layer 160 is preferably formed by a spin coating method because being shared by pixels. For the other components in FIG. 5A and FIG. 5B, FIG. 1 and the like can be referred to.

FIG. 5A and FIG. 5B illustrate a metal mask 161. FIG. 5A and FIG. 5B illustrate a state where the light-emitting layer 163G and the like are formed with use of the metal mask 161 which has an opening to overlap with a pixel of the same color. By changing the positions of the metal mask 161 twice or more times, the light-emitting layers of the other colors can be formed. Specifically, a fine metal mask can be used as the metal mask 161.

In the case of employing an evaporation method, at least a light-emitting layer is formed with use of a metal mask, specifically a fine metal mask; accordingly, a light-emitting device including the light-emitting layer can be regarded as a light-emitting device having an MM structure.

In a layer formed by an evaporation method, a puddle of liquid is not observed in the vicinity of the partition wall 110.

Although a wet method such as an ink-jet method is preferably used for the formation of the light-emitting layers because the productivity can be high, an evaporation method can be used.

<Layer 155>

Next, as illustrated in FIG. 1B1 and FIG. 1C, a layer 155 is formed. The layer 155 is positioned between the upper electrode 159 and the light-emitting layer 153R, the light-emitting layer 153G, and the light-emitting layer 153B, and has a function of injecting electrons from the upper electrode 159 to the light-emitting layer 153R, the light-emitting layer 153G, and the light-emitting layer 153B. For the layer 155, a structure including an electron-injection layer, a structure including an electron-transport layer, and a stacked-structure of an electron-injection layer and an electron-transport layer which are positioned in this order from the upper electrode 159 can be used, for example.

As illustrated in FIG. 1B1 and FIG. 1C, the layer 155 may be formed in the entire pixel region 10 without being divided for pixels. The layer 150 is formed across a plurality of light-emitting layers and can be shared by pixels. The layer 155 can be formed by a wet method or an evaporation method. Examples of the wet method include a spin coating method, an ink-jet method, a cast method, a printing method, a dispensing method, and a spray method. The layer 155 which can be shared by the pixels can be formed by a spin coating method or an evaporation method.

<Upper Electrode 159>

The upper electrode 159 is formed over the layer 155. The upper electrode 159 corresponds to an electrode in an upper position of a pair of electrodes included in the light-emitting device, and functions as a cathode, for example. The upper electrode 159 may be referred to as a counter electrode.

As illustrated in FIG. 1B1 and FIG. 1C, the upper electrode 159 may be formed in the entire pixel region 10 without being divided for pixels. The upper electrode 159 is formed across a plurality of light-emitting layers and can be shared by pixels. The upper electrode 159 can be formed by a wet method or an evaporation method. Examples of the wet method include a spin coating method, an ink-jet method, a cast method, a printing method, a dispensing method, and a spray method. The upper electrode 159 which can be shared by the pixels is preferably formed by a spin coating method or an evaporation method.

Since the upper electrode 159 functions as a cathode, a material having a low work function (Al, Mg, Li, Ca, an alloy of these (an alloy containing Mg and In is referred to as MgAg, an alloy containing Mg and In is referred to as MgIn, and an alloy containing A1 and Li is referred to as AlLi) or a compound of these) is preferably used. Note that in the case where light generated by the light-emitting layer transmits the upper electrode 159, a thin metal film having a thin thickness can be used as the upper electrode 159. A transparent conductive film (e.g., ITO, indium oxide containing zinc oxide at greater than or equal to 2 wt % and less than or equal to 20 wt %, indium tin oxide containing silicon, or zinc oxide (ZnO)) can be used as the upper electrode 159. Furthermore, a stacked-layer of a metal thin film and a transparent conductive film can be used as the upper electrode 159.

In order that the upper electrode 159 may be electrically connected to the auxiliary electrode 115, the contact hole 18 is formed before the formation of the upper electrode 159 as illustrated in FIG. 1C. The contact hole 18 can be formed by a photolithography method, for example. As a photolithography method, there are a method in which a resist mask is formed over a thin film to be processed, the thin film is processed by etching or the like, and the resist mask is removed, and a method in which a photosensitive thin film is formed, and then exposed to light and developed to be processed into a desired shape. For example, after the layer 155 is formed, a mask for forming the contact hole 18 is prepared, and then a resist mask can be used as a mask.

The light-emitting layer is not positioned on the top surface of the partition wall 110 can be formed as illustrated in FIG. 1B1 and FIG. 1C. With this structure, in the formation of the contact hole 18, a top surface of the light-emitting layer is protected by the layer 155 and a side surface thereof is protected by the partition wall 110, so that the light-emitting layer is not exposed to an etchant. In such a case, the contact hole 18 can be formed using only a resist mask.

In order to reduce damage to an organic material layer or an organic compound layer such as a light-emitting layer or the like while being processed, a sacrificial layer (also referred to as a mask layer) may be formed between the resist mask and the layer 155. In this specification and the like, the sacrificial layer has a function of protecting a functional layer such as a light-emitting layer in a manufacturing process. Specifically, the sacrificial layer is formed in a position that can prevent the light-emitting layer and the like from suffering damage due to processing when the light-emitting device is processed. In the process of manufacturing the light-emitting device, the sacrificial layer may be removed entirely or may be left partly.

Providing the sacrificial layer in this manner can increase the reliability of the light-emitting device. As already described above, the sacrificial layer is a layer provided for protecting a material layer (a material layer is a target of processing and sometimes referred to as a layer to be processed) formed below the sacrificial layer from process damage when the material layer is processed by etching or the like. Thus, the sacrificial layer may be formed to have a larger thickness than the layer to be processed.

As the sacrificial layer, a metal film, an alloy film, a metal oxide film, a semiconductor film, or an inorganic insulating film can be used, for example. The sacrificial layer can be formed by any of a variety of film formation methods such as a sputtering method, an evaporation method, a CVD method, and an ALD method. Note that a film formation method that causes less damage to an organic material layer or an organic compound layer is preferably employed, and the sacrificial layer is preferably formed by an ALD method or a vacuum evaporation method.

For the sacrificial layer, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used. It is particularly preferable to use a low-melting-point material such as aluminum or silver.

For the sacrificial layer, metal oxide such as indium gallium zinc oxide (In—Ga—Zn oxide, also referred to as IGZO) can be used. Furthermore, it is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon can also be used, for example.

Note that an element M (M is one or more selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more selected from gallium, aluminum, and yttrium.

For the sacrificial layer, an inorganic insulating material such as aluminum oxide, hafnium oxide, or silicon oxide can be used.

In the case where the sacrificial layer has a stacked-layer structure, the stacked-layer structure can include the first sacrificial layer formed using any of the above-described materials and the second sacrificial layer thereover.

In the case where the sacrificial layer is provided, the sacrificial layer is also processed in some cases. In that case, a material having high etching selectivity with respect to an organic material layer or an organic compound layer is preferably used for the sacrificial layer. Furthermore, a material having high etching selectivity with respect to the partition wall 110 is preferably used for the sacrificial layer.

In the case of using the sacrificial layer, a material that can be removed by a wet etching method is preferably used for the sacrificial layer. Although the organic material layer, the organic compound layer, or the like might be damaged when the sacrificial layer is removed, the damage can be lower when the sacrificial layer is removed by a wet etching method than when the sacrificial layer is removed by a dry etching method.

The upper electrode 159 and the auxiliary electrode 115 can be electrically connected to each other through the contact hole 18 formed in this manner. In a cross-sectional view of the contact hole 18, an opening included in the first insulator 120 is smaller than an opening included in the second insulator 121 and the end portion of the first insulator 120 is exposed from the opening included in the second insulator 121; in a top view of the contact hole 18, the end portion of the first insulator 120 is exposed from the opening in the second insulator 121. The opening in the second insulator 121 is formed earlier than the first insulator 120, whereby the opening in the second insulator 121 is extended. Furthermore, since an opening in the layer 155 is the fastest formed, the opening is extended and an end portion of the layer 155 which determines the opening recedes to a position overlapping with the top surface of the partition wall 110 in some cases. That is, the diameters of the openings in the layers become gradually smaller toward the auxiliary electrode 115 positioned below the layers.

The structure in which diameters of the openings in the layers become gradually smaller toward the auxiliary electrode 115 in the contact hole 18 is preferable because disconnection (referred to as step disconnection in some cases) of the upper electrode 159 hardly occurs in the contact hole 18. In order that the upper electrode 159 may be electrically connected to the auxiliary electrode 115, part of a top surface of the auxiliary electrode 115 is preferably etched (referred to as over etching). When the part of the auxiliary electrode 115 is etched, a depressed portion is formed on the top surface of the auxiliary electrode 115, which is preferable because a contact area between the auxiliary electrode 115 and the upper electrode 159 is increased.

Figure 3:
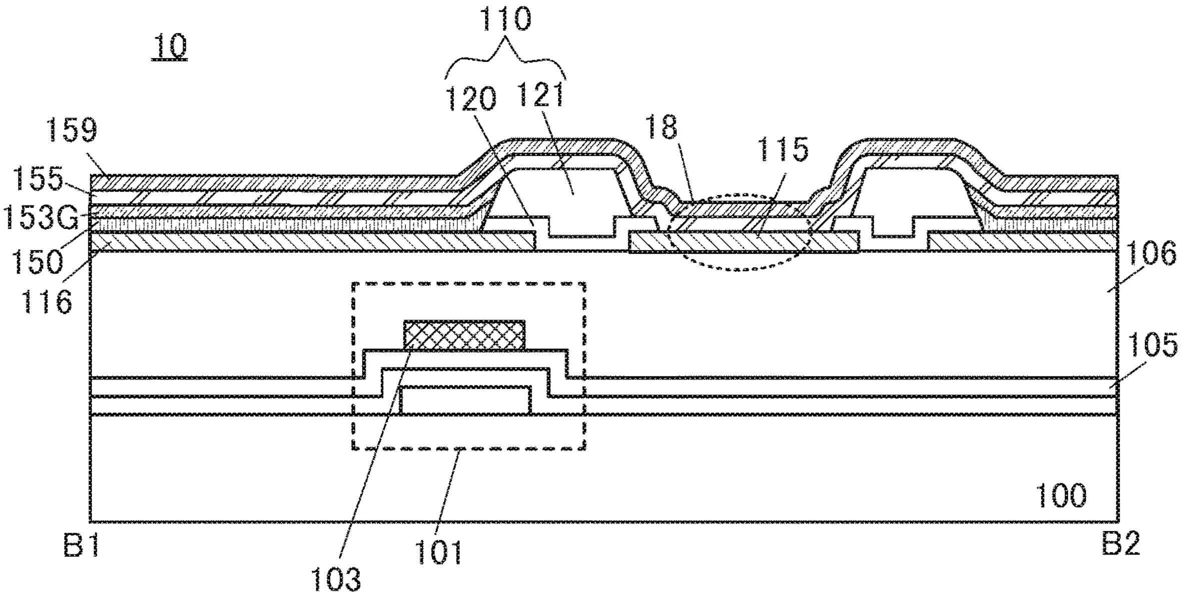
FIG. 3 is a cross-sectional view illustrating a pixel region of one embodiment of the present invention.

Although FIG. 1C illustrates the structure in which the layer 155 is not positioned in the contact hole 18, the layer 155 may be positioned in the contact hole 18. For example, as illustrated in FIG. 3, in the contact hole 18, the layer 155 can be positioned between the auxiliary electrode 115 and the upper electrode 159 as long as the auxiliary electrode 115 and the upper electrode 159 are electrically connected to each other. In the case of this structure, the contact hole 18 is formed before the layer 155 is formed. The sacrificial layer is preferably provided before the formation of the contact hole 18. For the other components in FIG. 3, FIG. 1 and the like can be referred to.

The contact hole 18 can be provided in a desired portion. For example, as illustrated in FIG. 1A, one contact hole 18 may be formed per six pixels. Since the upper electrode 159 is shared by the pixel regions 10, a voltage drop is likely to occur, which is allowable as long as the resistance of the upper electrode 159 can be reduced by the auxiliary electrode 115. Accordingly, there is no need to form the contact hole 18 per pixel, and the contact hole 18 is formed for a plurality of pixels.

<Height of Partition Wall 110>

In the pixel region 10, the partition wall 110 with a lattice pattern includes a first region 110*x* along the X direction and a second region 110*y* along the Y direction. In one embodiment of the present invention, the height of the partition wall 110 is not necessarily uniform; for example, the first region 110*x* and the second region 110*y* may have different heights. The perspective view of the pixel region 10 in FIG. 6 illustrates the case where the second region 110*y* has a larger height than the first region 110*x*, that is, the case where the height of the second region 110*y* is larger than that of the first region 110*x* when the positions of the uppermost surfaces of the regions are compared.

The partition wall 110 preferably has a stacked-layer structure in which the second insulator 121 containing an organic material is positioned over the first insulator 120 containing an inorganic material. In order to make the height of the partition wall 110 uneven, it is preferable that the first insulator 120 correspond to the first region 110*x* and the stacked-layer structure of the first insulator 120 and the second insulator 121 correspond to the second region 110*y*. For example, the first insulator 120 is formed in a lattice pattern, and then the second insulator 121 is formed only in portions corresponding to the second region 110*y*.

Even when the partition wall is formed with only an organic material, the second region 110*y* can be made a tall partition wall. First, a partition wall with a thickness Hx is formed with an organic material in the X direction including the first region 110*x*. Then, a partition wall with a thickness Hy (Hy>Hx, Hy is preferably 1.2 to 2.5 times as thick as Hx) is formed with an organic material in the Y direction including the second region 110*y*. In this manner, as in the perspective view of FIG. 6, the partition wall 110 at the intersection between the X direction and the Y direction has the largest height.

Figure 6:
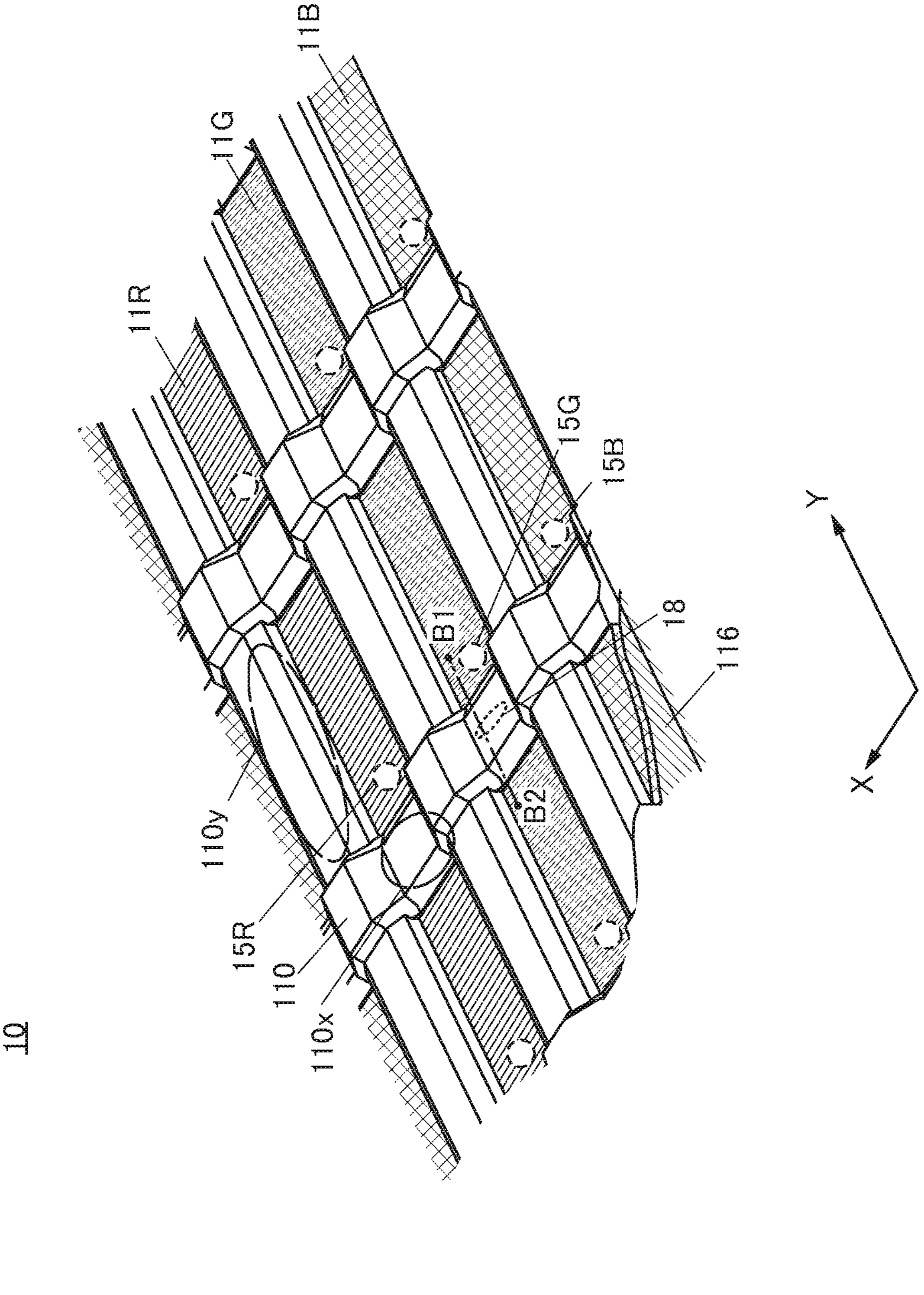
FIG. 6 is a perspective view illustrating a pixel region of one embodiment of the present invention.

The ink-jet nozzles 119R, 119G, and 119B illustrated in FIG. 4 and the like can be transferred along the second regions 110*y* illustrated in FIG. 6. The second region 110*y* serves as a tall partition wall, and can inhibit color mixing. Inhibiting color mixing is preferable particularly in the case where the light-emitting layers of different colors are formed at the same time for the pixel 11R, the pixel 11G, and the pixel 11B.

The first region 110*x* is positioned at the boundary between the pixels of the same color. The first region 110*x* is a partition wall that is lower than the second region 110*y*. Accordingly, the light-emitting layer can be formed by an ink-jet method without the first region 110*x* in view of the purpose of inhibiting color mixing. However, liquid unevenness between the pixels of the same color can be inhibited by the first region 110*x*, which is preferable.

Figure 7A:
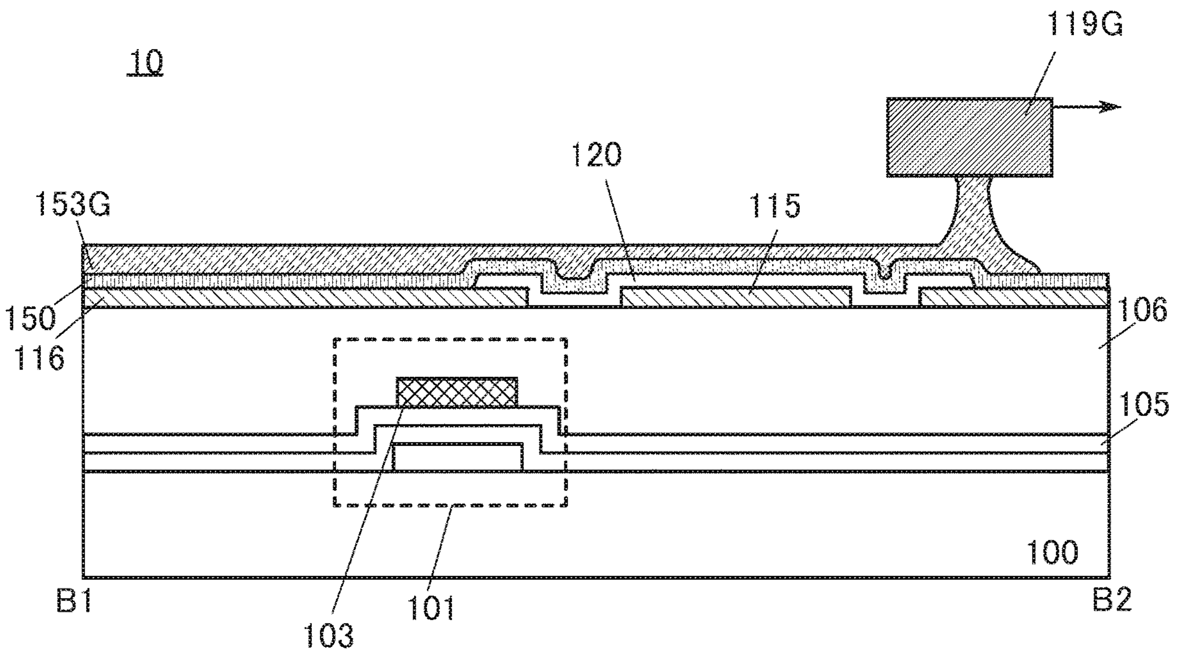
FIG. 7A is a cross-sectional view illustrating a method of forming a pixel region by using an ink-jet method of one embodiment of the present invention.
Figure 7B:
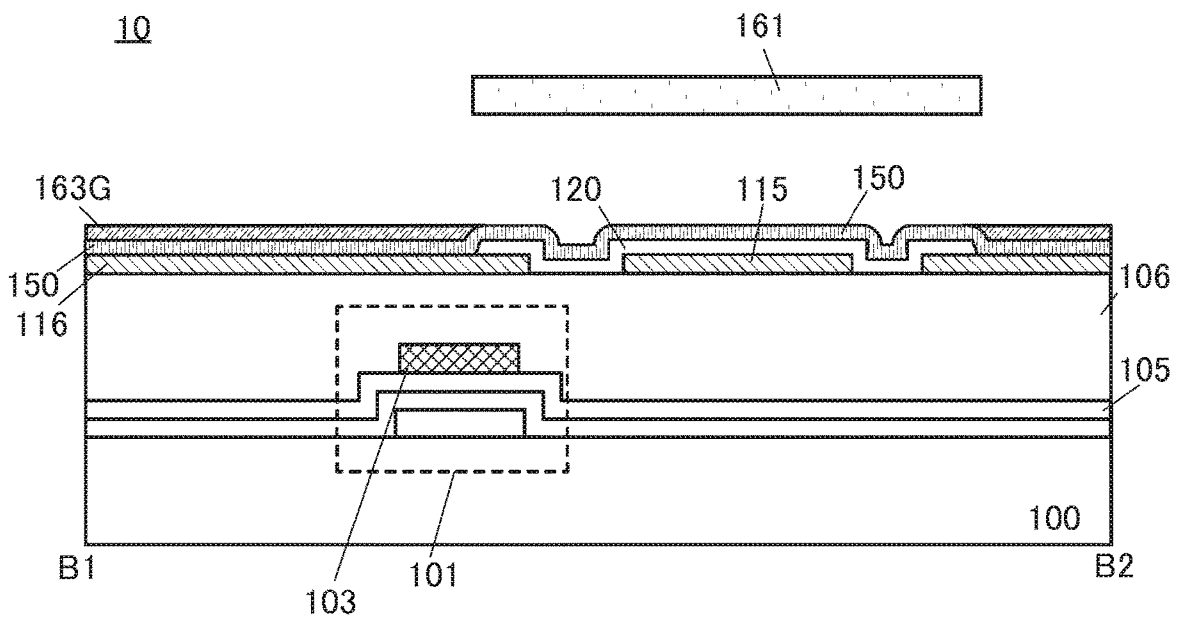
FIG. 7B is a cross-sectional view illustrating a method of forming a pixel region by using an evaporation method of one embodiment of the present invention.

FIG. 7A and FIG. 7B are cross-sectional views along the first region 110*x*. FIG. 7A and FIG. 7B illustrate the case where a partition wall having a single layer structure is used as the first region 110*x*. Specifically, the first insulator 120 is used as the partition wall having a single layer structure.

In the case where the light-emitting layer 153G is formed by an ink-jet method, the ink-jet nozzle 119G is transferred along the second region 110*y*. Then, the light-emitting layer 153G is formed over the first insulator 120. A solution dropped by the ink-jet nozzle 119G is evaporated early in a region with a small amount of the solution. With reference to FIG. 7A, the amount of the solution over the first insulator 120 is smaller than that over the other regions; thus, the solution over the first insulator 120 is evaporated early. When evaporation of the solution over the first insulator 120 is completed early, movement of the solution between pixels exhibiting light of the same color, for example, a first green pixel 11G1 and a second green pixel 11G2, is reduced, so that liquid unevenness is inhibited.

FIG. 7B illustrates the case where the light-emitting layer 163G is formed by an evaporation method. The metal mask 161 covers the first insulator 120, so that the light-emitting layer 163G is not formed over the first insulator 120.

The contact hole 18 may be formed in such a low partition wall. In forming the contact hole 18, a sacrifice layer may be formed over the light-emitting layer.

The perspective view of FIG. 6 shows an example of the height of the partition wall 110, and the first region 110*x* may have a larger height than the second region 110*y*.

In the above manner, the pixel region 10 includes a light-emitting device in each pixel and the upper electrode of the light-emitting device can be electrically connected to the auxiliary electrode. The auxiliary electrode can reduce the voltage drop due to the upper electrode. The auxiliary electrode does not decrease the aperture ratio because being positioned in a region overlapping with the partition wall. Such an auxiliary electrode is preferably used for a high-definition display device having a high aperture ratio.

This embodiment can be implemented in combination with the other embodiments described in this specification and the like as appropriate. For example, part of the structure described in this embodiment may be implemented in combination with the other embodiments described in this specification and the like as appropriate.

Embodiment 2

In this embodiment, a pixel region including an auxiliary electrode in a display device of one embodiment of the present invention will be described. Specifically, a display device having an arrangement of the auxiliary electrode 115, the lower electrode 116, and the like different from that in Embodiment 1 will be described. The description of components or the like with the same reference numerals as Embodiment 1 is omitted in this embodiment in some cases.

Figure 8A:
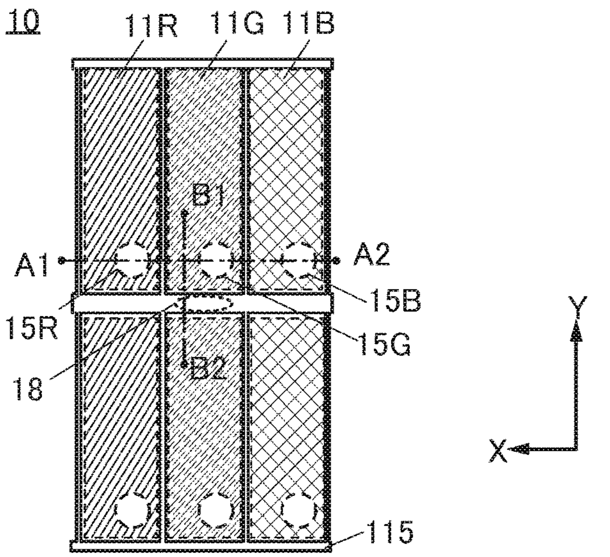
FIG. 8A is a top view illustrating a pixel region of one embodiment of the present invention.
Figure 8B:
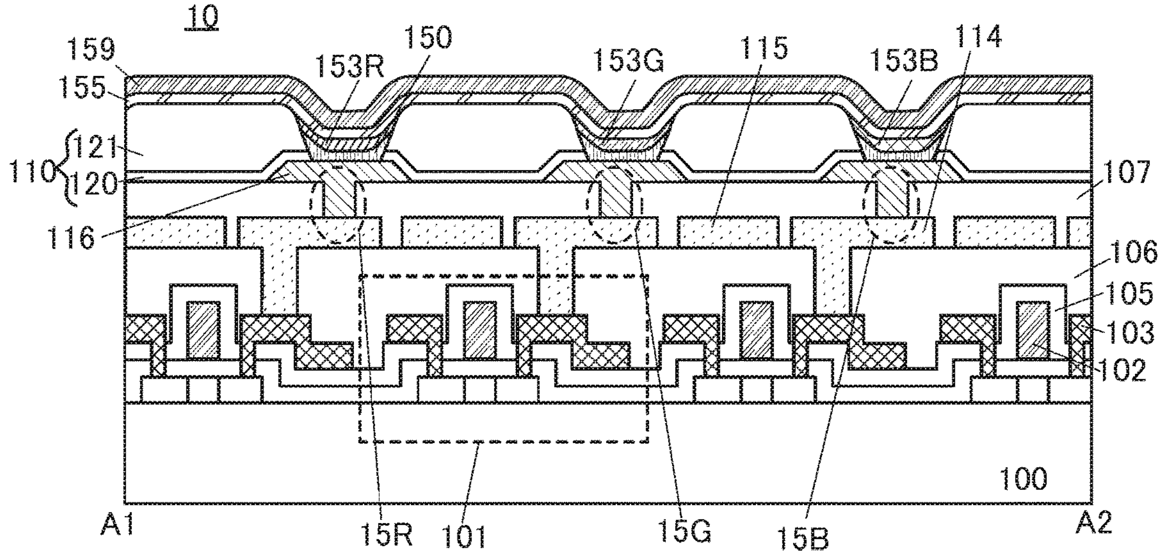
FIG. 8B and FIG. 8C are cross-sectional views illustrating the pixel region.
Figure 8C:
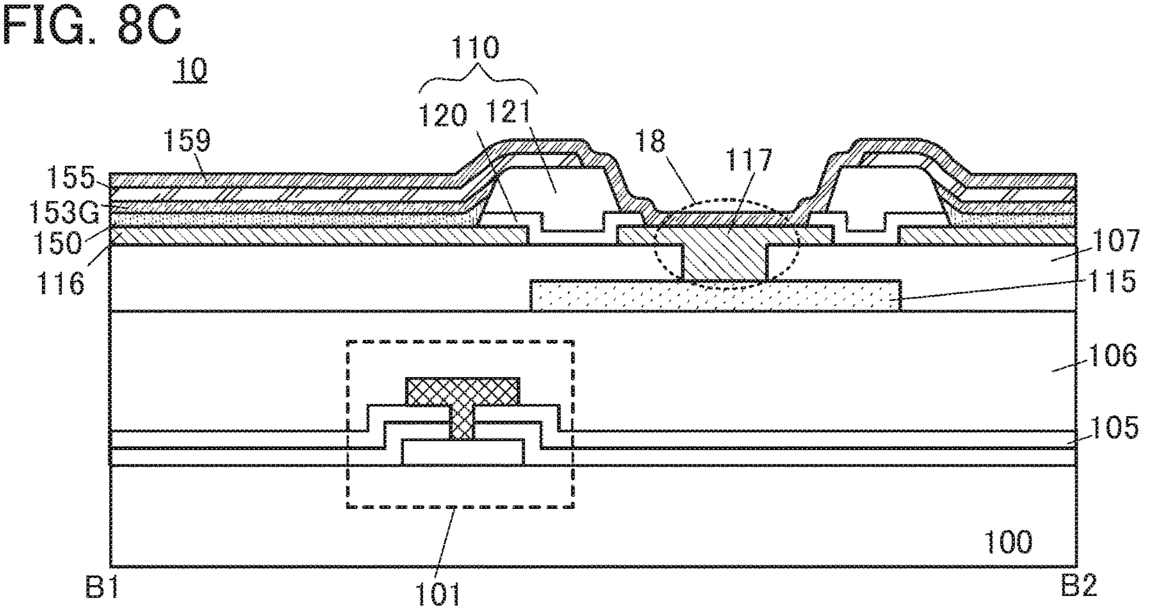

As illustrated in FIG. 8B and FIG. 8C, the auxiliary electrode 115 is formed over the insulating layer 106, an insulating layer 107 is newly formed over the auxiliary electrode 115, and the lower electrode 116 is formed over the insulating layer 107. This arrangement is different from that in the above embodiment.

FIG. 8A shows a top view (also referred to as a plan view) including the auxiliary electrodes 115. The auxiliary electrodes 115 may be arranged in a lattice pattern similar to that in FIG. 1A, and may be extended to a region overlapping with the lower electrode 116. Thus, the lattice interval of the auxiliary electrode 115 in this embodiment can be shorter than that in FIG. 1A. The auxiliary electrode 115 may include a region that crosses the center portion of the pixel 11R along the X direction. The auxiliary electrode 115 in this embodiment can have a larger area than that in the above embodiment and does not necessarily contain the same conductive material as the lower electrode 116; thus, the selectivity of the materials is high. The structure of the auxiliary electrode 115 in this embodiment can reduce the voltage drop due to the upper electrode 159 effectively.

As described above, when the auxiliary electrode 115 and the lower electrode 116 are formed on different surfaces, the selection flexibility of a conductive material used for the auxiliary electrode 115 is increased. For example, a material having a lower resistivity than the lower electrode 116 can be used for the auxiliary electrode 115.

Furthermore, since the surface where the auxiliary electrode 115 is formed can be different from the surface where the lower electrode 116 is formed as described above, the flexibility of layout of the auxiliary electrodes 115 is increased. In the above embodiment where the auxiliary electrode 115 and the lower electrode 116 are formed on the same surface, the auxiliary electrode 115 cannot be in contact with the lower electrode 116; however, in this embodiment, the auxiliary electrode 115 and the lower electrode 116 can overlap with each other in a top view because the insulating layer 107 is positioned therebetween, so that the auxiliary electrode 115 can have a larger area.

As illustrated in FIG. 8B and FIG. 8C, the lower electrode 116 is electrically connected to the source and the drain 103 through the contact holes 15R, 15G, and 15B. A conductive layer 114 is preferably positioned between the lower electrode 116 and the source and the drain 103. The conductive layer 114 is formed with the same material as the auxiliary electrode 115. With the interposition of the conductive layer 114, openings can be formed in each of the insulating layer 106 and the insulating layer 107. The openings of the insulating layer 106 are formed to have regions not overlapping with the openings of the insulating layer 107 in a cross-sectional view. The openings formed in this manner are preferably used as the contact holes 15R, 15G, and 15B, in which case the yield can be increased.

As illustrated in FIG. 8C, the upper electrode 159 is electrically connected to the auxiliary electrode 115 through the contact hole 18. A conductive layer 117 is preferably positioned between the upper electrode 159 and the auxiliary electrode 115. The conductive layer 117 is formed with the same material as the lower electrode 116. With the interposition of the conductive layer 117, openings can be formed in each of the insulating layer 107 and the partition wall 110. Forming an opening in each of the insulating layer 107 and the partition wall 110 independently is better than forming openings in the insulating layer 107 and the partition wall at once because the yield can be increased.

The components in FIG. 8A to FIG. 8C except the above-described components are similar to those in the above embodiment.

Figure 9:
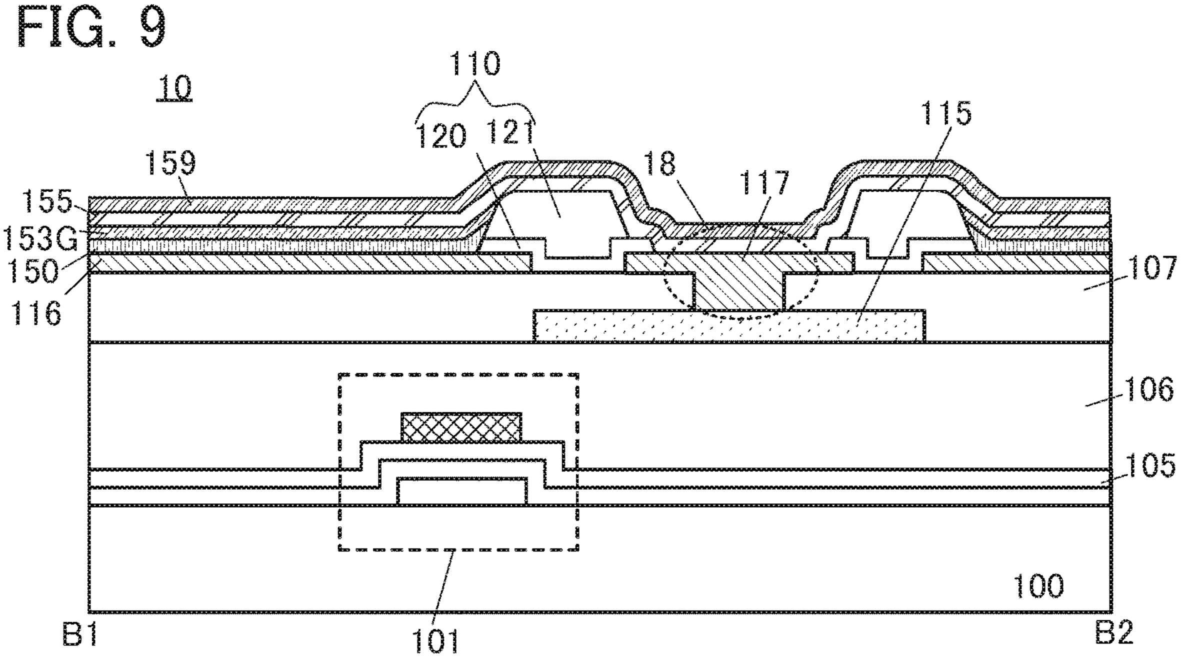
FIG. 9 is a cross-sectional view illustrating a pixel region of one embodiment of the present invention.

FIG. 9 illustrates the case where the layer 155 is positioned between the upper electrode 159 and the auxiliary electrode 115 in the contact hole 18 as in FIG. 3. The structure is similar to that in Embodiment 1 except for that the layer 155 is positioned between the upper electrode 159 and the auxiliary electrode 115.

Figure 10A:
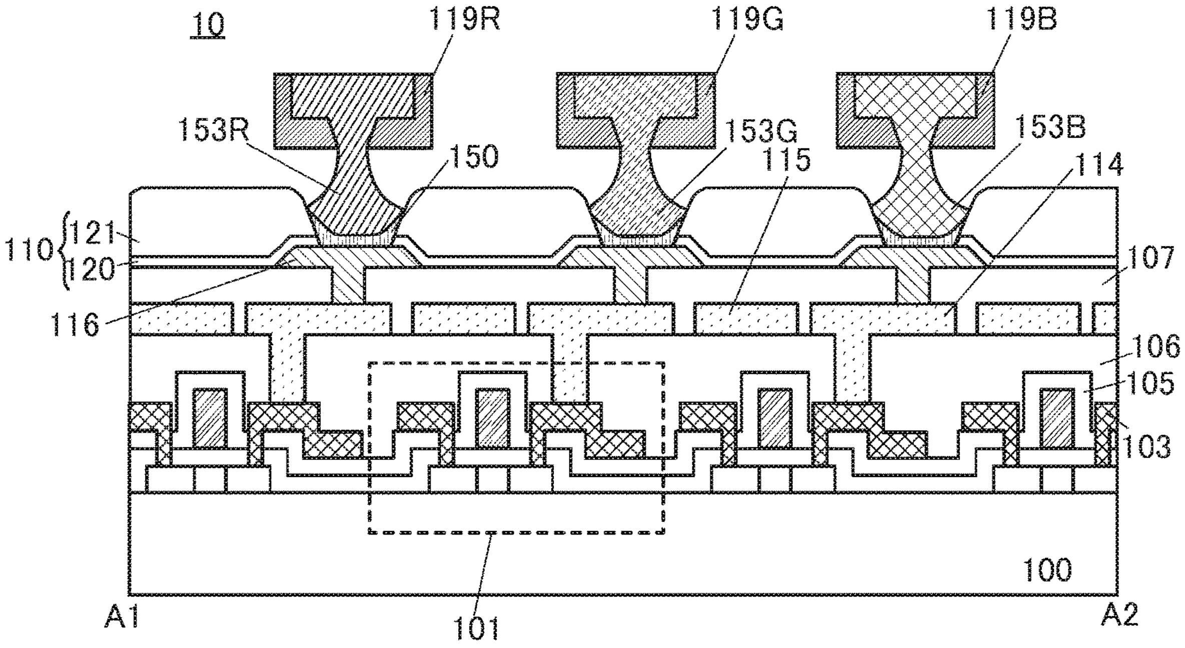
FIG. 10A and FIG. 10B are cross-sectional views illustrating a method of forming a pixel region by using an ink-jet method of one embodiment of the present invention.
Figure 10B:
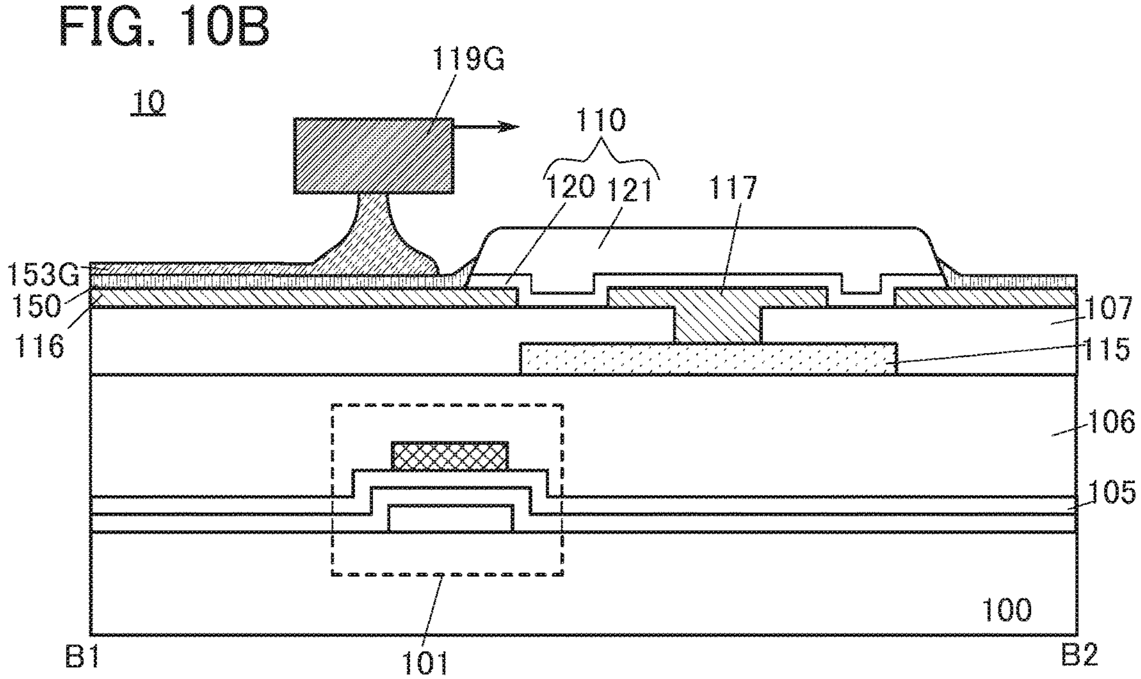

FIG. 10A and FIG. 10B illustrate a state where the light-emitting layer 153R, the light-emitting layer 153G, and the light-emitting layer 153B are formed by an ink-jet method as in FIG. 4A and FIG. 4B. In FIG. 10A, the conductive layer 114 is positioned between the lower electrode 116 and the source and the drain 103. In FIG. 10B, the conductive layer 117 electrically connected to the auxiliary electrode 115 is included. FIG. 10B is a cross-sectional view before the upper electrode 159 is formed, and the auxiliary electrode 115 in FIG. 10B is electrically connected to the upper electrode 159 through the conductive layer 117. The other components are similar to those in Embodiment 1 described above.

Figure 11A:
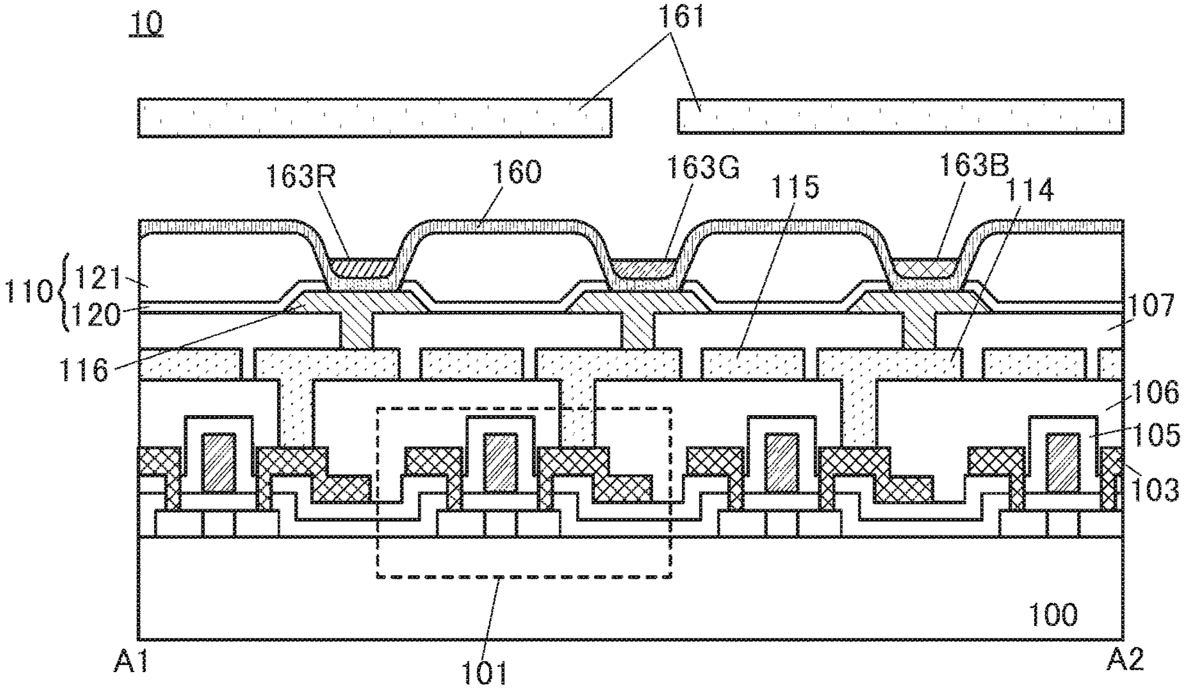
FIG. 11A and FIG. 11B are cross-sectional views illustrating a method of forming a pixel region by using an evaporation method of one embodiment of the present invention.
Figure 11B:
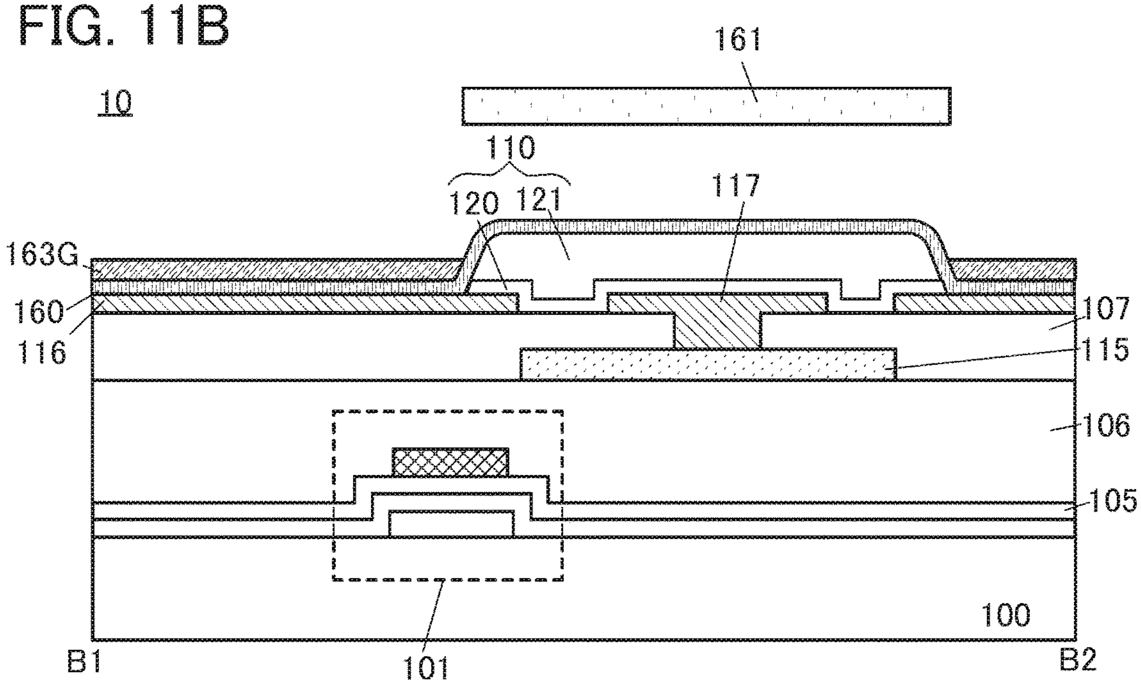

FIG. 11A and FIG. 11B illustrate a state where the light-emitting layer 163R, the light-emitting layer 163G, and the light-emitting layer 163B are formed by an evaporation method as in FIG. 5A and FIG. 5B. In FIG. 11A, the conductive layer 114 is positioned between the lower electrode 116 and the source and the drain 103. In FIG. 11B, the conductive layer 117 electrically connected to the auxiliary electrode 115 is included. FIG. 11B is a cross-sectional view before the upper electrode 159 is formed, and the auxiliary electrode 115 in FIG. 11B is electrically connected to the upper electrode 159 through the conductive layer 117. The other components are similar to those in Embodiment 1 described above.

Also in this embodiment, the height of the partition wall 110 may be uneven as in the perspective view of FIG. 6.

Figure 12A:
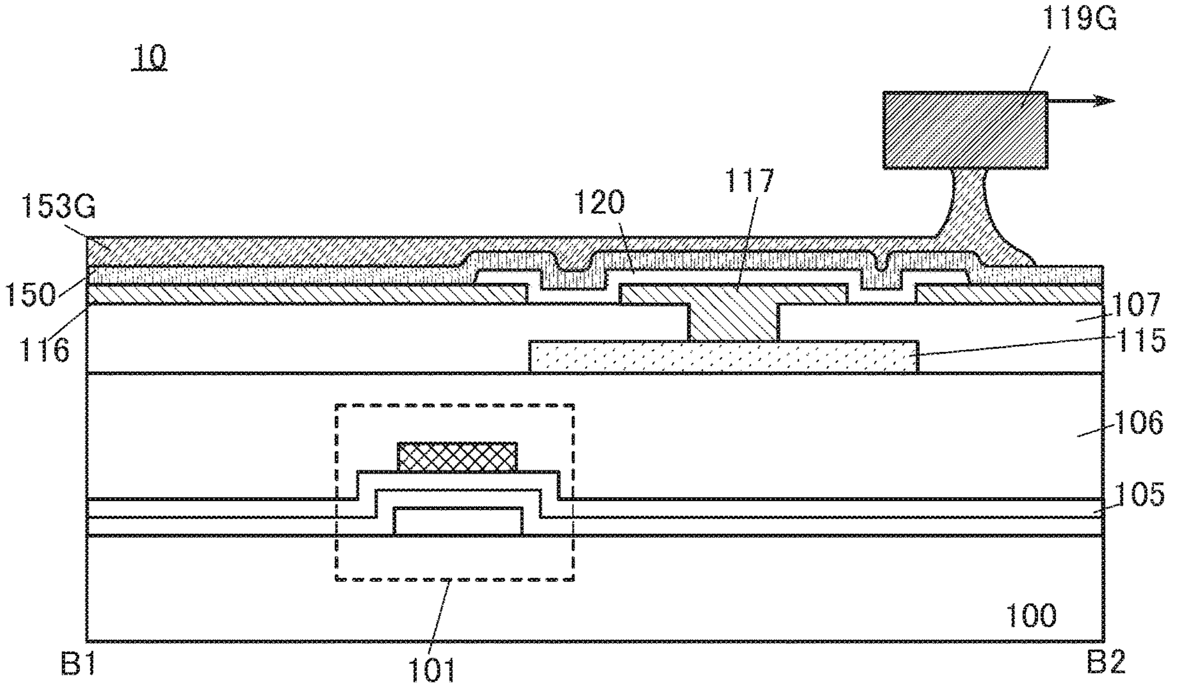
FIG. 12A is a cross-sectional view illustrating a method of forming a pixel region by using an ink-jet method of one embodiment of the present invention.
Figure 12B:
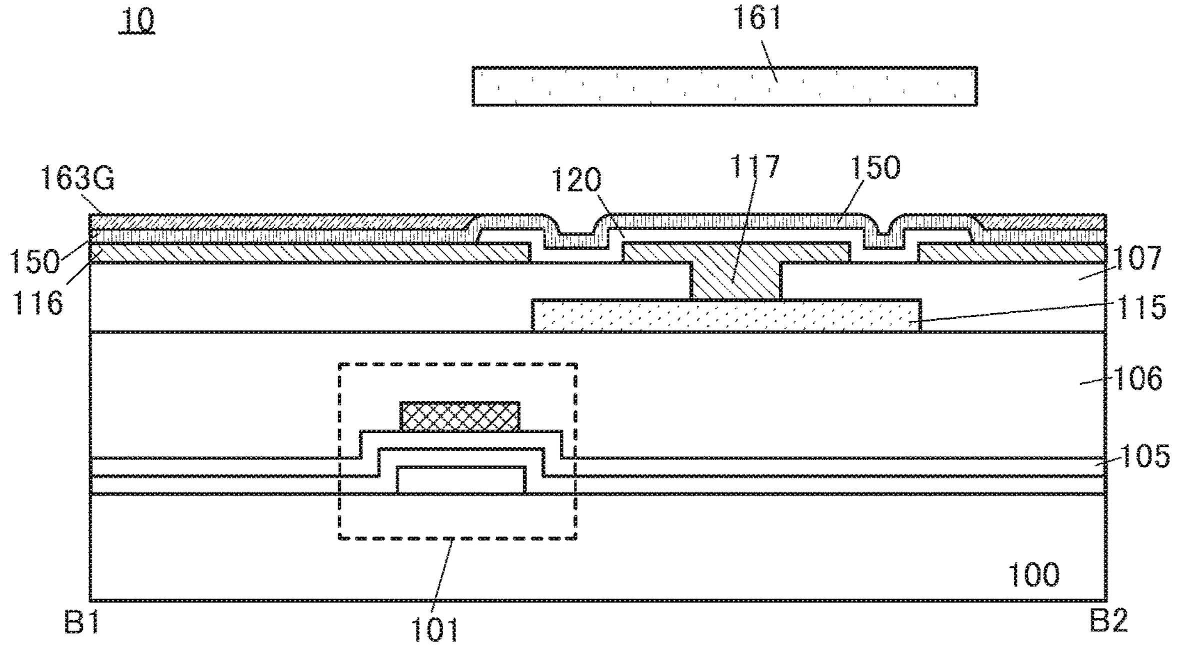
FIG. 12B is a cross-sectional view illustrating a method of forming a pixel region by using an evaporation method of one embodiment of the present invention.

FIG. 12A and FIG. 12B are cross-sectional views along the first region 110*x*, like FIG. 7A and FIG. 7B. For example, the first region 110*x* includes the first insulator 120. In FIG. 12A, in the case where the light-emitting layer 153G is formed by an ink-jet method, the ink-jet nozzle 119G is transferred along the second region 110*y*. Then, the light-emitting layer 153G is formed over the first insulator 120. In FIG. 12A, the conductive layer 117 electrically connected to the auxiliary electrode 115 is included. FIG. 12A is a cross-sectional view before the upper electrode 159 is formed, and the auxiliary electrode 115 in FIG. 12A is electrically connected to the upper electrode 159 through the conductive layer 117. The other components are similar to those in Embodiment 1 described above.

FIG. 12B illustrates the case where the light-emitting layer 163G is formed by an evaporation method. The metal mask 161 covers the first insulator 120, so that the light-emitting layer 163G is not formed over the first insulator 120. In FIG. 12B, the conductive layer 117 electrically connected to the auxiliary electrode 115 is included. FIG. 12B is a cross-sectional view before the upper electrode 159 is formed, and the auxiliary electrode 115 in FIG. 12B is electrically connected to the upper electrode 159 through the conductive layer 117. The other components are similar to those in Embodiment 1 described above.

In the above manner, the pixel region 10 includes a light-emitting device in each pixel and the upper electrode of the light-emitting device can be electrically connected to the auxiliary electrode. The auxiliary electrode can reduce the voltage drop due to the upper electrode. Since the auxiliary electrode is positioned below the partition wall, the auxiliary electrode is preferably used for a high-definition display device having a high aperture ratio.

This embodiment can be implemented in combination with the other embodiments described in this specification and the like as appropriate. For example, part of the structure described in this embodiment may be implemented in combination with the other embodiments described in this specification and the like as appropriate.

Embodiment 3

In this embodiment, a pixel region including an auxiliary electrode in a display device of one embodiment of the present invention will be described.

Figure 13A:
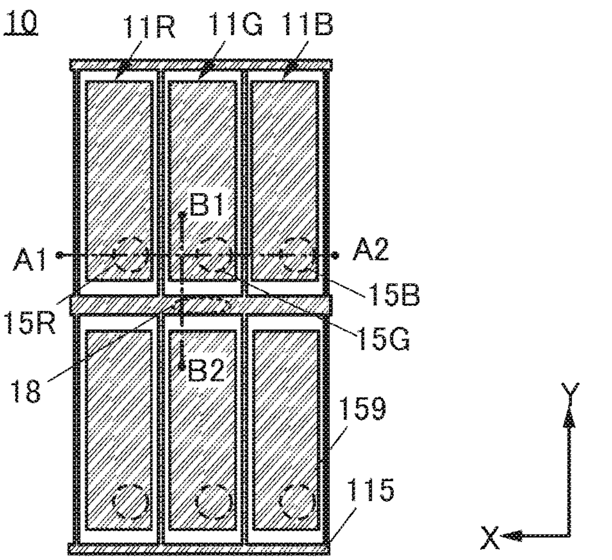
FIG. 13A is a top view illustrating a pixel region of one embodiment of the present invention.

As illustrated in FIG. 13A, a pixel region 10 included in a display device includes a plurality of pixels. A pixel includes at least a light-emitting device and is regarded as a minimum unit that can exhibit one emission color. Such a pixel is referred to as a subpixel in some cases. The components of the light-emitting device are similar to those in Embodiment 1. In regions indicated by the arrows in FIG. 13A, the pixel region 10 includes the pixel 11R capable of exhibiting red, the pixel 11G capable of exhibiting green, and the pixel 11B capable of exhibiting blue. Ordinal numbers are sometimes used in order to distinguish pixels; for example, pixels are referred to as a first red pixel and a second red pixel in some cases.

Note that as illustrated in FIG. 13A, the X direction and the Y direction intersecting with the X direction are sometimes used to describe the pixel region 10. For example, in the pixel region 10, the pixel 11R, the pixel 11G, and the pixel 11B are arranged in the X direction, and a plurality of pixels 11R are arranged in the Y direction. Similarly, a plurality of pixels 11B and a plurality of pixels 11G are arranged in the Y direction. In the pixel region 10, in a region adjacent to the pixel 11R in the X direction, the pixel 11G is positioned; and in a region adjacent to the pixel 11R in the Y direction, another pixel 11R is positioned. Ordinal numbers are sometimes used in order to distinguish the same elements. For example, another pixel 11R is referred to as a second pixel 11R in some cases.

The pixel 11R includes at least the contact hole 15R. The contact hole 15R is an opening provided in an insulating layer positioned between a light-emitting device and a transistor driving the light-emitting device in order to obtain electrical connection between the light-emitting device and the transistor. Similarly, the pixel 11G includes at least the contact hole 15G, and the pixel 11B includes at least the contact hole 15B.

As illustrated in FIG. 13A, the pixel region 10 includes the auxiliary electrode 115.

In FIG. 13A, the auxiliary electrodes 115 are placed between pixels in the pixel region 10. The auxiliary electrodes 115 include regions extended in the X direction and the Y direction, and form a lattice pattern in a bird's-eye view. Note that the arrangement of the auxiliary electrodes is not limited to the lattice pattern as long as the auxiliary electrodes can decrease the resistance of the main electrode.

The pixel region 10 includes the contact hole 18. The contact hole 18 is an opening provided in an insulating layer positioned between the auxiliary electrode 115 and an upper electrode 216 included in the light-emitting device in order to obtain electrical connection between the auxiliary electrode 115 and the upper electrode 216. The upper electrode 216 will be described later. The diameter of the contact hole 18 is preferably larger than that of the contact hole 15R or the like included in each pixel.

Figure 13B:
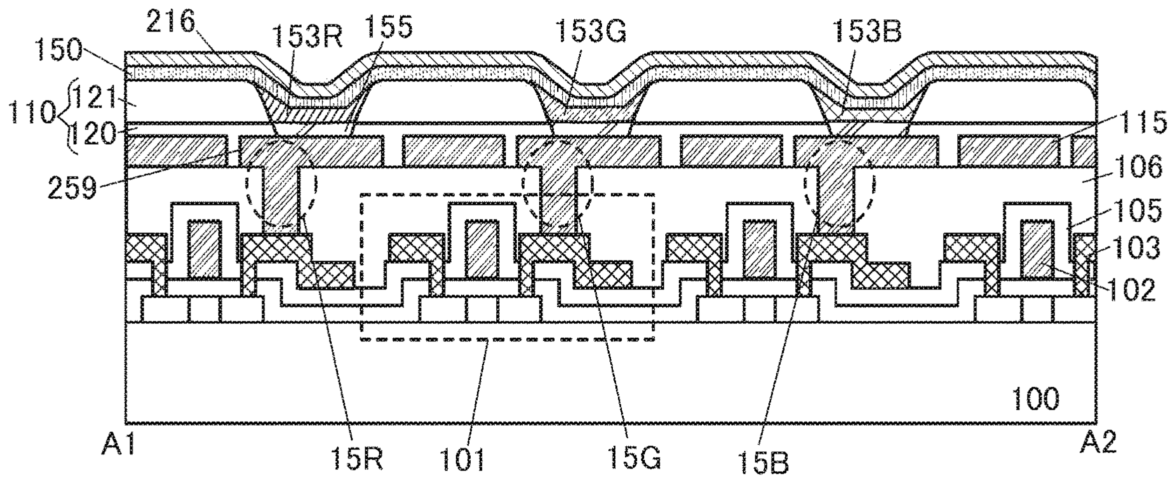
FIG. 13B and FIG. 13C are cross-sectional views illustrating the pixel region.
Figure 13C:
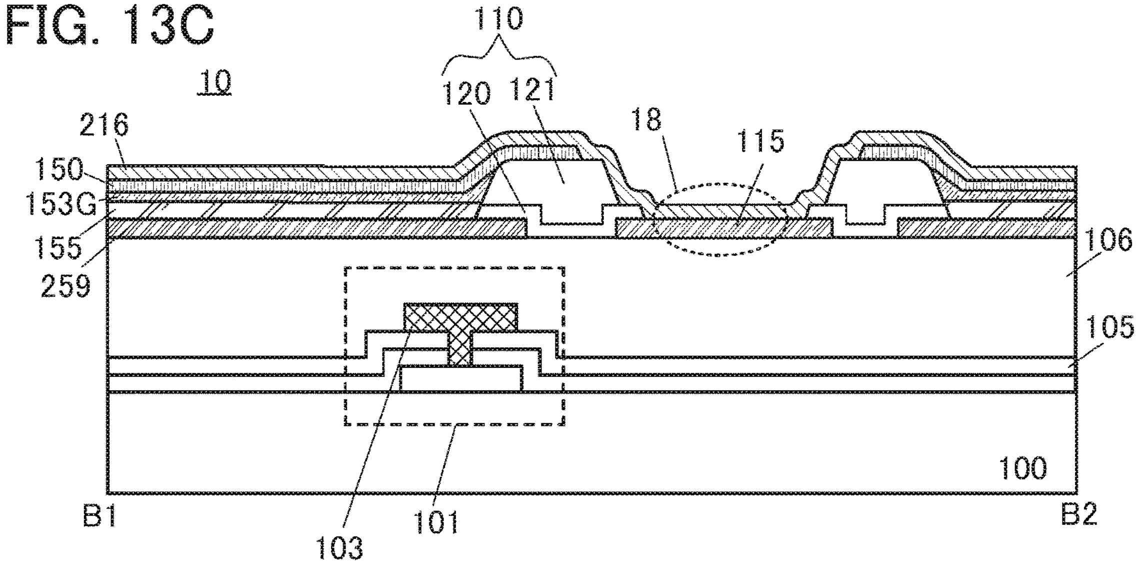

FIG. 13B shows a cross-sectional view taken along A1-A2 across the contact hole 15R, the contact hole 15G, and the contact hole 15B. FIG. 13C shows a cross-sectional view taken along B1-B2 across the contact hole 18. The pixel region 10 is described with reference to FIG. 13B and FIG. 13C.

<Transistor 101>

FIG. 13B and FIG. 13C illustrate an example in which the transistor 101 is provided over the substrate 100. The transistor 101 is an element for driving a light-emitting device (referred to as a driver element). A display device including the driver element in each pixel is referred to as an active matrix display device.

The transistor 101 includes at least the semiconductor layer, the gate 102, and the source and the drain 103; FIG. 13B illustrates a top-gate transistor as the transistor 101 in which the gate 102 is positioned over the semiconductor layer as an example. Needless to say, in the present invention, a bottom-gate transistor in which a gate is positioned under a semiconductor layer may be employed or a dual-gate transistor in which a gate is positioned over and under a semiconductor layer may be employed.

A gate insulating layer is positioned between the gate 102 and the semiconductor layer. The semiconductor layer can be formed with silicon or an oxide semiconductor, and can have crystallinity or include amorphous. In the case where the semiconductor layer is formed with silicon, regions in contact with the source and the drain 103 are called impurity regions, and the resistance of the impurity regions is decreased by adding an element other than silicon (referred to as an impurity element) such as phosphorus or boron to the impurity regions (the impurity region is also referred to as a low-resistance region).

The gate 102 is covered with at least the insulating layer 105. Each of the source and the drain 103 can include a region in contact with the semiconductor layer through an opening provided in the gate insulating layer and an opening provided in the insulating layer 105. In FIG. 13C, a state in which one of the source and the drain 103 is in contact with the semiconductor layer can be seen.

The gate insulating layer and the insulating layer 105 preferably contain an inorganic material. When the insulating layer 105 contains an inorganic material, an impurity element can be inhibited from entering the semiconductor layer.

As the inorganic material, it is preferable to use one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Note that a material obtained by adding an impurity element, such as lanthanum (La), nitrogen, or zirconium (Zr), to the above material may be used.

The insulating layer 106 is provided over the insulating layer 105. The top surface of the insulating layer 106 corresponds to a surface where a lower electrode of a light-emitting device to be formed later is formed, and thus preferably has a flatness. For example, when the insulating layer 106 is formed with an organic material, the insulating layer 106 can have a flatness.

As the organic material, an organic resin such as a polyimide resin, a polyamide resin, an acrylic resin, a siloxane resin, a silicone resin, an epoxy resin, or a phenol resin is preferably used. Note that a material obtained by adding an impurity element, such as lanthanum, nitrogen, or zirconium, to the above material may be used.

Application Example of Transistor

For cross-sectional structures of a transistor that can be used as the transistor 101, the structures described in [Application example of transistor] in Embodiment 1 can be referred to.

<Lower Electrode 259>

A lower electrode 259 is formed over the insulating layer 106. FIG. 13A is a top view of the lower electrode 259. The lower electrode 259 corresponds to an electrode in a lower position of a pair of electrodes included in the light-emitting device, and functions as a cathode, for example. The lower electrode 259 is positioned on the transistor 101 side. The lower electrode 259 is electrically connected to the transistor 101, and a signal can be supplied from the transistor 101 to the light-emitting device. Since the signal differs between pixels, the lower electrodes 259 are processed to be independent between the pixels. This processing is referred to as patterning in some cases. Each of the pixel 11R, the pixel 11G, and the pixel 11B includes the lower electrode 259, and the lower electrode 259 is sometimes referred to as a pixel electrode.

Although a top surface shape of the lower electrode 259 is not limited, the lower electrode 259 in FIG. 13A has a rectangle shape whose short side is along with the X direction and long side is along with the Y direction.

Although a cross-sectional shape of the lower electrode 259 is not limited, an end portion preferably has a tapered shape.

To obtain electrical connection between the lower electrode 259 and the transistor 101, the insulating layer 106 positioned therebetween includes an opening, and the opening functions as a contact hole. For example, in FIG. 13B, the insulating layer 106 includes openings formed in the insulating layer 106 as the contact hole 15R, the contact hole 15G, and the contact hole 15B. Each of the contact holes includes a region where one of the source and the drain 103 and the lower electrode 259 are in contact with each other. However, for example, another conductive layer may exist between the one of the source and the drain 103 and the lower electrode 259 as long as electrical connection is obtained through the contact hole. That is, a structure in which the one of the source and the drain 103 and the lower electrode 259 are not in contact with each other may be employed.

Since the lower electrode 259 functions as a cathode, a material having a small work function is preferably used. For this reason, the lower electrode 259 can be a single layer of an ITO film (an oxide film containing indium and tin), an indium tin oxide film containing silicon, an indium oxide film containing zinc oxide at 2 wt % or higher and 20 wt % or lower, a titanium nitride film, a chromium film, a tungsten film, a Zn film, a Pt film, a Cu film, an Al film, or the like, or can have a stacked-layer structure of a titanium nitride film and a film containing aluminum as its main component or a stacked-layer structure of a titanium nitride film, a film containing aluminum as its main component, and a titanium nitride film, for example. The film containing aluminum as its main component may contain nickel, tungsten, a rare earth element (e.g., lanthanum), or the like in addition to aluminum. In the case where any of the above stacked-layer structures is used, a low-resistance material can be used for one layer and a material capable of forming favorable ohmic contact with one of the source and the drain 103 can be used for another layer, which is preferable. The thickness of the lower electrode 259 is preferably greater than or equal to 100 nm and less than or equal to 250 nm.

In the case of a display device in which light is extracted from the lower electrode 259 side, the lower electrode 259 needs to have a light-transmitting property. In order to obtain a light-transmitting property, for example, a light-transmitting material is selected from the above materials, or the lower electrode 259 is made thin when a non-light-transmitting material is selected.

<Auxiliary Electrode 115>

The auxiliary electrode 115 is formed with the same material as the lower electrode 259. FIG. 13A is a top view of the lower electrode 259 and the auxiliary electrode 115. FIG. 13B and FIG. 13C are cross-sectional views in which the lower electrode 259 and the auxiliary electrode 115 are provided over the insulating layer 106. The auxiliary electrode 115 is processed not to have the same potential as the lower electrode 259; in other words, the auxiliary electrode 115 and the lower electrode 259 need to be independent from each other. FIG. 13A illustrates an example in which the auxiliary electrode 115 and the lower electrode 259 are independent of each other, and the auxiliary electrode 115 includes regions extended in the X direction and the Y direction, that is, the lower electrodes 115 are arranged in a lattice pattern not to be in contact with the lower electrode 259. The distance between the lower electrode 259 and the auxiliary electrode 115 in a region along the Y direction is preferably larger than the distance between the lower electrode 259 and the auxiliary electrode in a region along the X direction.

The auxiliary electrode 115 can be electrically connected to the upper electrode 216 of the light-emitting device to be formed later. The resistance of the upper electrode 216 can be lowered by the auxiliary electrode 115, so that a voltage drop can be inhibited.

<Partition Wall 110>

In FIG. 13B and FIG. 13C, the partition wall 110 is formed over the lower electrode 259 and the auxiliary electrode 115.

As illustrated in FIG. 13B, the partition wall 110 covers an end portion of the lower electrode 259 and includes an opening so as to expose the center portion of the lower electrode 259. Although FIG. 13B illustrates the state where the partition wall 110 covers the whole of the auxiliary electrode 115, an opening is formed in the partition wall 110 to be the contact hole 18 in order that the auxiliary electrode 115 may be electrically connected to the upper electrode as illustrated in FIG. 13C. The auxiliary electrode 115 in a region overlapping with the contact hole 18 is extended along the X direction. The auxiliary electrode in the region overlapping with the contact hole 18 preferably has a larger width than the auxiliary electrode in a region not overlapping with the contact hole 18.

In one embodiment of the present invention, the partition wall 110 preferably includes the first insulator 120 and the second insulator 121 as in Embodiment 1.

In a top view of the pixel region 10, the partition wall 110 has a structure in which pixels are partitioned, in other words, the partition wall 110 has a lattice pattern including regions extended in the X direction and the Y direction. That is, the partition wall 110 is provided in a region overlapping with the auxiliary electrode 115.

When an opening is formed in a partition wall formed with an organic material, an upper end portion of the partition wall 110 is rounded as in FIG. 13B and FIG. 13C in some cases. Being rounded is described as having a curvature in some cases. Note that in the partition wall 110, at least an upper end portion of the second insulator 121 has a curvature. When an opening is formed, a lower end portion of the partition wall 110 can have a curvature. Note that in the partition wall 110, at least a lower end portion of the first insulator 120 has have a curvature.

As illustrated in FIG. 13B and FIG. 13C, in a cross-sectional view of the pixel region 10, an end portion of the partition wall 110 preferably has a tapered shape. For example, the partition wall 110 can have a forward tapered shape in which a bottom surface of the partition wall 110 has a longer diameter than a top surface thereof and the end portion is tapered. Alternatively, the partition wall 110 can have an inverse tapered shape in which the bottom surface of the partition wall 110 has a shorter diameter than the top surface thereof and the end portion is tapered. The both tapered shapes are common in that the end portion of the partition wall 110 is inclined, and the inclined end portion enables a solution from an ink-jet to drop to a target pixel, which can inhibit color mixing. Note that since the second insulator 121 has a larger thickness than the first insulator 120 in the partition wall 110, at least the end portion of the second insulator 121 is inclined. The taper angle of the end portion of the partition wall 110 may be more obtuse than the taper angle of the end portion of the lower electrode 259, and is greater than or equal to 15° and less than or equal to 70°, preferably greater than or equal to 20° and less than or equal to 60°.

<Layer 155>

As illustrated in FIG. 13B and FIG. 13C, a layer 155 is formed over the lower electrode 259. The layers 155 are positioned between the lower electrode 259 and a light-emitting layer 153R, a light-emitting layer 153G, and a light-emitting layer 153B, and has a function of injecting electrons from the lower electrode 259 to the light-emitting layer 153R, the light-emitting layer 153G, and the light-emitting layer 153B. For the layer 155, a structure including an electron-injection layer, a structure including an electron-transport layer, or a stacked-structure of an electron-injection layer and an electron-transport layer can be used, for example.

The layer 155 may be formed in the entire pixel region 10 without being divided for pixels. That is, the layer 155 can be formed across a plurality of lower electrodes to be shared by pixels. The layer 155 can be formed by an evaporation method.

As illustrated in FIG. 13B and FIG. 13C, the layer 155 may be divided for pixels by the partition wall 110. When evaporation is performed with use of a metal mask in the formation of the layer 155 by an evaporation method, the structure in which the layer 155 is not positioned on the top surface of the partition wall 110 can be obtained.

<Light-Emitting Layer 153R, Light-Emitting Layer 153G, and Light-Emitting Layer 153B>

The light-emitting layer 153R, the light-emitting layer 153G, and the light-emitting layer 153B are formed over the layer 155 by separate coloring. The separately colored structure corresponds to an SBS structure. The emission colors of the light-emitting layer 153R, the light-emitting layer 153G, and the light-emitting layer 153B are a red color, a green color, and a blue color, respectively, which enable full color display. The other components are similar to those in Embodiment 1 described above.

<Ink-jet Method>

Figure 15A:
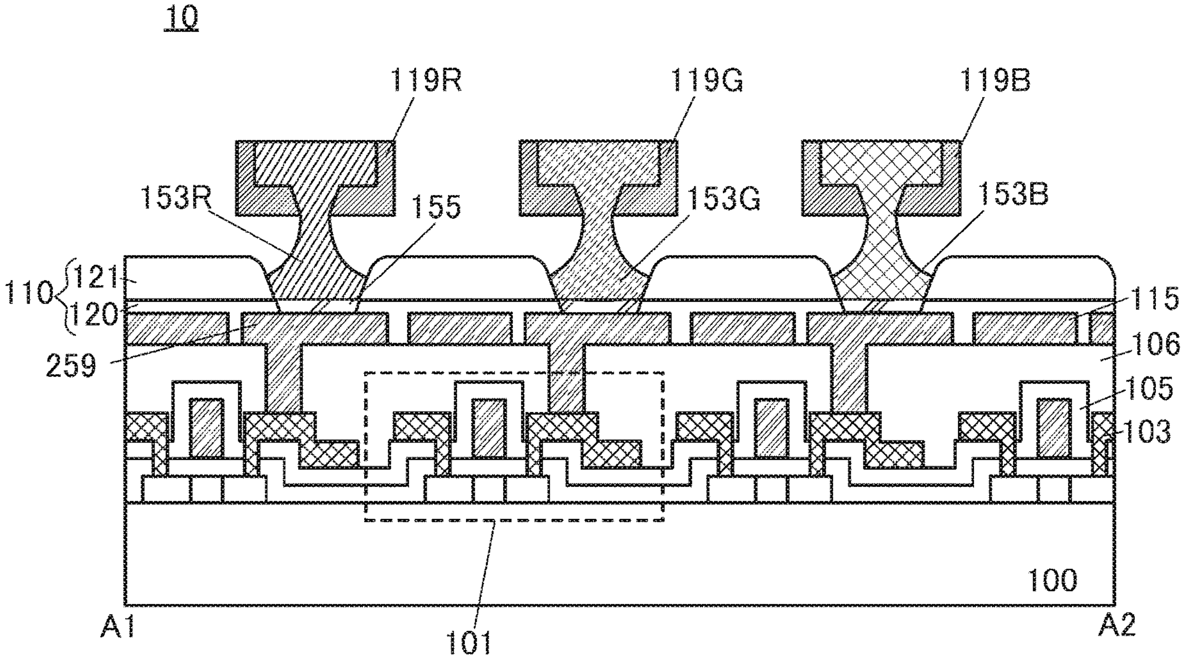
FIG. 15A and FIG. 15B are cross-sectional views illustrating a method of forming a pixel region by using an ink-jet method of one embodiment of the present invention.
Figure 15B:
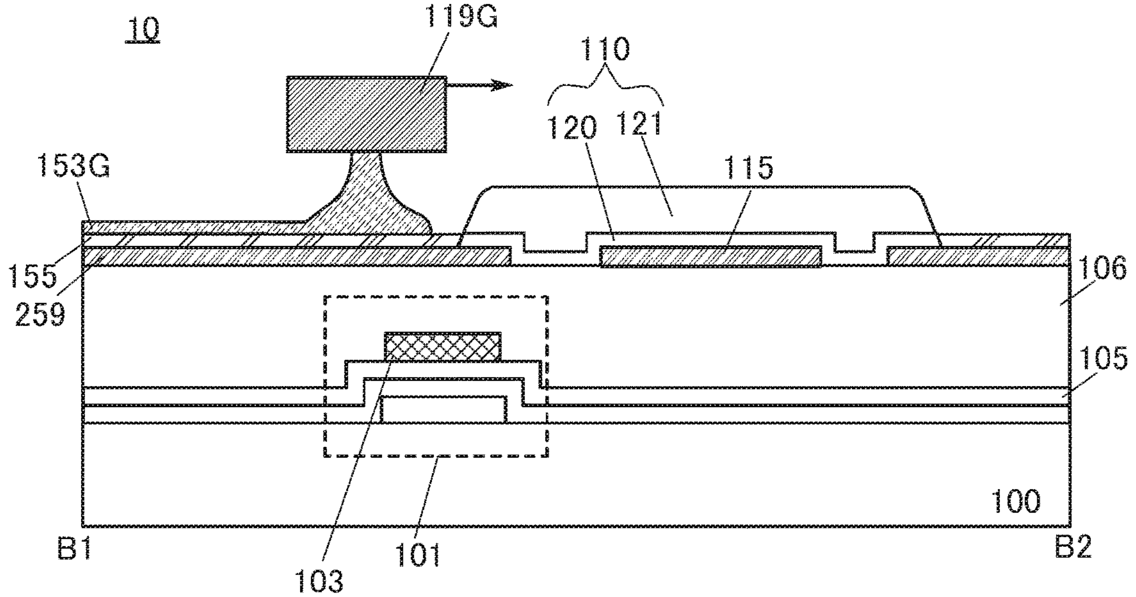

FIG. 15A and FIG. 15B illustrate an ink-jet device that can be used for the above-described ink-jet method. FIG. 15A illustrates a state where the light-emitting layer 153R, the light-emitting layer 153G, and the light-emitting layer 153B are formed, and FIG. 15B illustrates a state where the light-emitting layer 153G is formed.

FIG. 15A and FIG. 15B illustrate the ink-jet nozzles 119R, 119G, and 119B included in the ink-jet device. Each of opening diameters of the ink-jet nozzles 119R, 119G, and 119B (also referred to as ink-jet nozzle diameters) is greater than or equal to several micrometers and less than or equal to several tens of micrometers. A portion having the ink-jet nozzle is sometimes referred to as a head. The head for dropping a solution is provided with a control portion for solution injection, and includes a thermoelectric conversion element (Peltier element) and the like. The solution can be dropped from the head by changing the volume of an ink tank connected to the ink-jet nozzle by a pressure element. The amount of one drop is greater than or equal to several picoliters and less than or equal to several tens of picoliters in many cases in accordance with the ink-jet nozzle diameter. Although depending on the material, approximately one picoliter droplet can be considered to form an approximately 10 lam cube.

By the ink-jet method, the light-emitting layer 153R, the light-emitting layer 153G, and the light-emitting layer 153B, which correspond to the respective emission colors, are formed in openings in the partition wall 110 at the same time, as illustrated in FIG. 15A. FIG. 15B shows a cross-sectional view of the light-emitting layer 153G, and shows a state before the ink-jet nozzles 119R, 119G, and 119B that can transfer in the arrow direction get over the partition wall 110. For the other components in FIG. 15A and FIG. 15B, FIG. 13 and the like can be referred to.

In a layer formed by the ink-jet method, a puddle of liquid is observed in the vicinity of the partition wall 110. The puddle of liquid corresponds to a thick portion of the light-emitting layer 153R, the light-emitting layer 153G, or the light-emitting layer 153B in the vicinity of the partition wall 110. A layer in which a puddle of liquid is observed is regarded as being formed by a wet method such as an ink-jet method.

In the case of employing a wet method such as an ink-jet method, at least light-emitting layers are formed without using a metal mask; accordingly, a light-emitting device including the light-emitting layer can be regarded as a device having an MML structure.

<Evaporation Method>

Figure 16A:
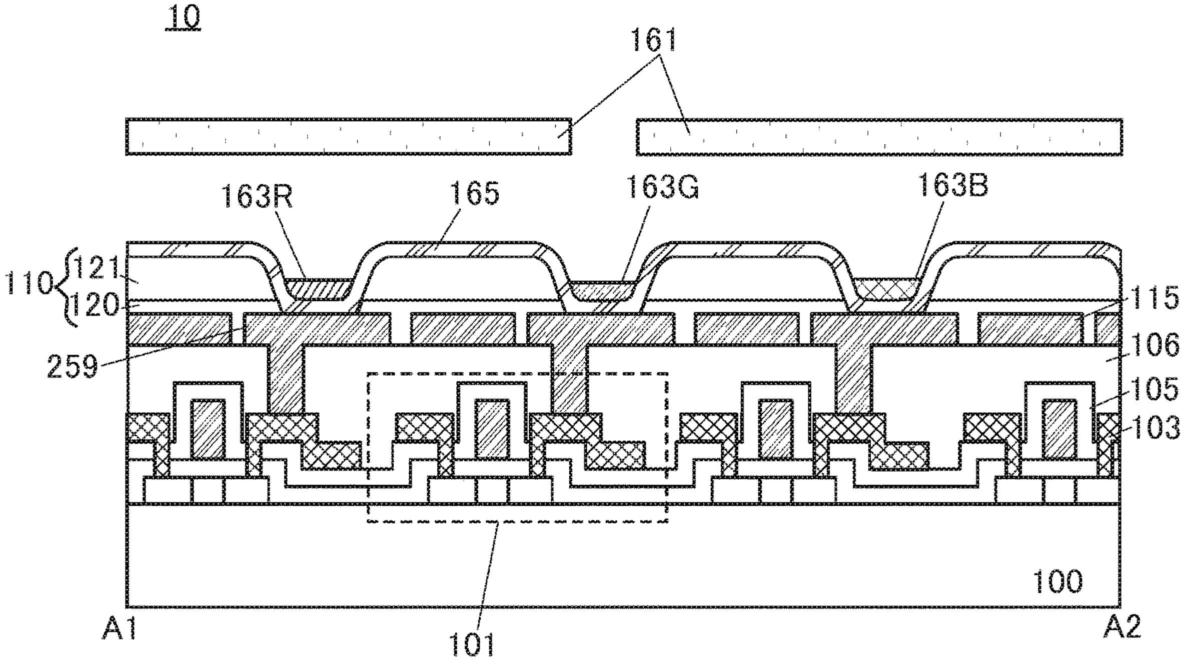
FIG. 16A and FIG. 16B are cross-sectional views illustrating a method of forming a pixel region by using an evaporation method of one embodiment of the present invention.
Figure 16B:
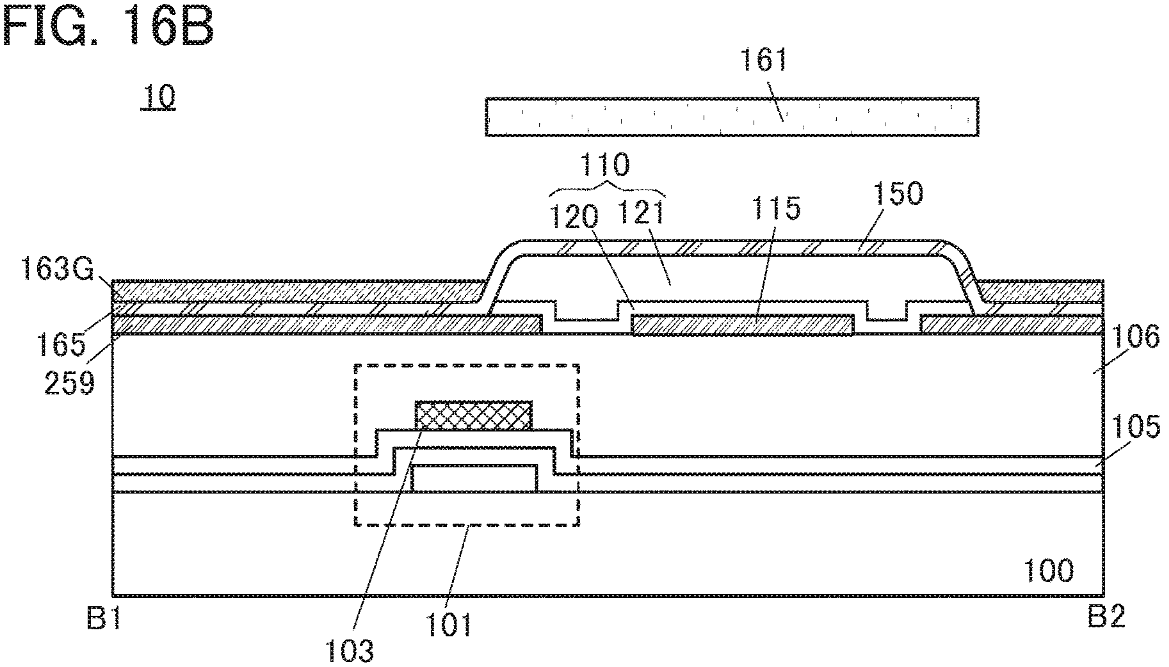

FIG. 16A and FIG. 16B illustrate a state where the light-emitting layer 163R, the light-emitting layer 163G, and the light-emitting layer 163B are formed by an evaporation method. These correspond to the light-emitting layer 153R, the light-emitting layer 153G, and the light-emitting layer 153G formed by an ink-jet method. A layer 165 corresponding to the layer 155 can also be formed by an evaporation method. FIG. 16A illustrates the state where the layer 165 that can be shared by pixels is divided by the partition wall 110. For the other components in FIG. 16A and FIG. 16B, Embodiment 1 described above can be referred to.

FIG. 16A and FIG. 16B illustrate the metal mask 161. The metal mask 161 includes an opening overlapping with pixels of the same color. In the case of the pixel region 10 illustrated in FIG. 13A, the metal mask 161 includes an opening in a stripe pattern corresponding to the pixels 11R. The metal mask 161 with such a structure is moved, for example, two or more times for the pixel 11B and the pixel 11G, whereby the light-emitting layer 163R, the light-emitting layer 163G, and the light-emitting layer 163B can be formed. Specifically, a fine metal mask can be used as the metal mask 161.

In the case of employing an evaporation method, at least a light-emitting layer is formed with use of a metal mask or a fine metal mask; accordingly, a light-emitting device including the light-emitting layer can be regarded as a light-emitting device having an MM structure.

In a layer formed by an evaporation method, a puddle of liquid is not observed in the vicinity of the partition wall 110.

Although a wet method such as an ink-jet method is preferably used for the formation of the light-emitting layers because the mass productivity can be high, an evaporation method can be used.

<Layer 150>

As illustrated in FIG. 13B and FIG. 13C, the layer 150 is formed. The layers 150 are positioned between the upper electrode 216 and a light-emitting layer 153R, a light-emitting layer 153G, and a light-emitting layer 153B, and has a function of injecting holes from the upper electrode 216 to the light-emitting layer 153R, the light-emitting layer 153G, and the light-emitting layer 153B. For the layer 150, a structure including a hole-injection layer, a structure including a hole-transport layer, or a stacked-structure of a hole-injection layer and a hole-transport layer can be used, for example.

As illustrated in FIG. 13B1 and FIG. 13C, the layer 150 may be formed in the entire pixel region 10 without being divided for pixels. The layer 150 is formed across a plurality of light-emitting layers and can be shared by pixels. The layer 150 can be formed by a wet method or an evaporation method. Examples of the wet method include a spin coating method, an ink-jet method, a cast method, a printing method, a dispensing method, and a spray method. The layer 150 which can be shared by the pixels can be formed by a spin coating method or an evaporation method.

<Upper Electrode 216>

The upper electrode 216 is formed over the layer 150. The upper electrode 216 corresponds to an electrode in an upper position of a pair of electrodes included in the light-emitting device, and functions as an anode, for example. The upper electrode 216 may be referred to as a counter electrode.

As illustrated in FIG. 13B and FIG. 13C, the upper electrode 216 may be formed in the entire pixel region 10 without being divided for pixels. The upper electrode 216 is formed across a plurality of light-emitting layers and can be shared by pixels. The upper electrode 216 can be formed by a wet method or an evaporation method. Examples of the wet method include a spin coating method, an ink-jet method, a cast method, a printing method, a dispensing method, and a spray method. The upper electrode 216 which can be shared by the pixels is preferably formed by a spin coating method or an evaporation method.

Since the upper electrode 216 functions as an anode, a material ITO film with a high work function (an oxide film containing indium and tin), an oxide film containing tin and indium containing silicon, an indium oxide film containing zinc oxide at greater than or equal to 2 wt % and less than or equal to 20 wt %, or the like is preferably used. The ITO film, the oxide film containing tin and indium containing silicon, the indium oxide film containing zinc oxide at greater than or equal to 2 wt % and less than or equal to 20 wt %, or the like is a transparent conductive film, and light generated by the light-emitting layer can pass through the upper electrode 216. Furthermore, a stacked-layer of a transparent conductive film and a metal thin film can be used as the upper electrode 216. As the metal thin film, a chromium film, a tungsten film, a Zn film, a Pt film, a Cu film, an A1 film, or the like can be used.

In order that the upper electrode 216 may be electrically connected to the auxiliary electrode 115, the contact hole 18 is formed before the formation of the upper electrode 216 as illustrated in FIG. 13C. For example, after the layer 150 is formed, a mask used for forming the contact hole 18 is prepared. For example, a resist mask is used as a mask.

The light-emitting layer is not positioned on the top surface of the partition wall 110 can be formed as illustrated in FIG. 13B and FIG. 13C. With this structure, in the formation of the contact hole 18, a top surface of the light-emitting layer is protected by the layer 150 and a side surface thereof is protected by the partition wall 110, so that the light-emitting layer is not exposed to an etchant. In such a case, the contact hole 18 can be formed using only a resist mask.

In order to reduce damage to an organic material layer or an organic compound layer such as a light-emitting layer or the like while the contact hole or the like is processed, a sacrificial layer (also referred to as a mask layer) may be formed between the layer 150 and the resist mask. Providing the sacrificial layer can improve the reliability of the light-emitting device. For the sacrificial layer, Embodiment 1 described above can be referred to.

The upper electrode 216 and the auxiliary electrode 115 can be electrically connected to each other through the contact hole 18 formed in this manner. In a cross-sectional view of the contact hole 18, an opening included in the first insulator 120 is smaller than an opening included in the second insulator 121 and the end portion of the first insulator 120 is exposed from the opening included in the second insulator 121; in a top view of the contact hole 18, the end portion of the first insulator 120 is exposed from the opening in the second insulator 121. The opening in the second insulator 121 is formed earlier than the first insulator 120, whereby the opening in the second insulator 121 is extended. Furthermore, since an opening in the layer 150 is the fastest formed, the opening is extended and an end portion of the layer 150 which determines the opening recedes to a position overlapping with the top surface of the partition wall 110 in some cases. That is, the diameters of the openings in the layers become gradually smaller toward the auxiliary electrode 115 positioned below the layers.

The structure in which diameters of the openings in the layers become gradually smaller toward the auxiliary electrode 115 in the contact hole 18 is preferable because disconnection (step disconnection) of the upper electrode 216 hardly occurs in the contact hole 18. In order that the upper electrode 216 may be electrically connected to the auxiliary electrode 115, part of a top surface of the auxiliary electrode 115 is preferably etched (referred to as over etching). When the part of the auxiliary electrode 115 is etched, a depressed portion is formed on the top surface of the auxiliary electrode 115, which is preferable because a contact area between the auxiliary electrode 115 and the upper electrode 216 is increased.

Figure 14:
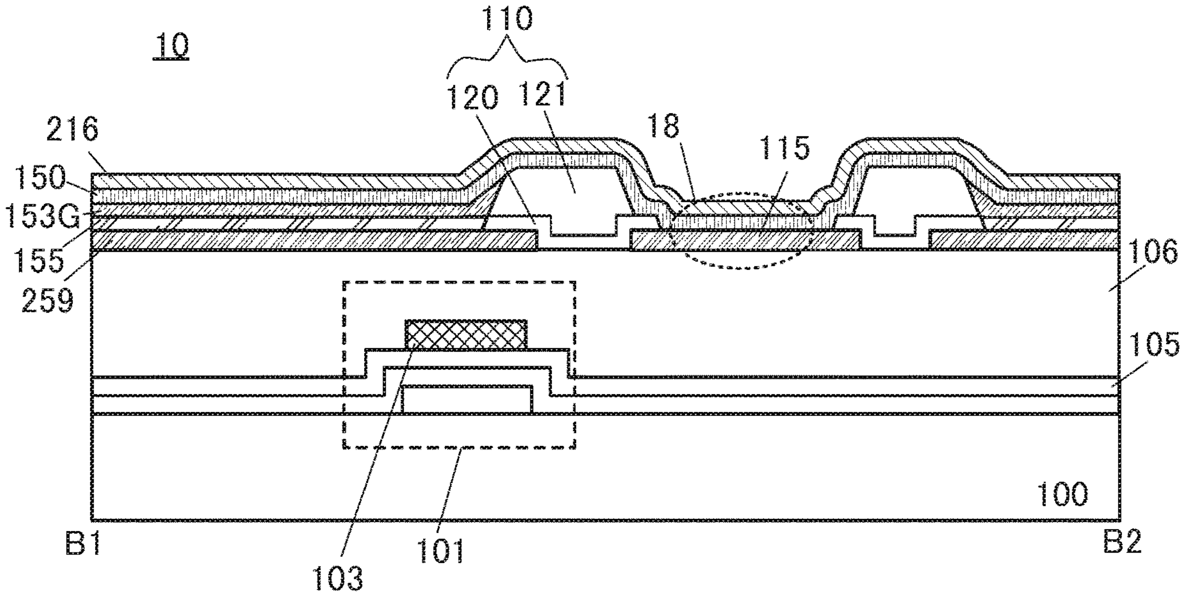
FIG. 14 is a cross-sectional view illustrating a pixel region of one embodiment of the present invention.

Although FIG. 13C illustrates the structure in which the layer 150 is not positioned in the contact hole 18, the layer 150 may be positioned in the contact hole 18. For example, as illustrated in FIG. 14, in the contact hole 18, the layer 150 can be positioned between the auxiliary electrode 115 and the upper electrode 216 as long as the auxiliary electrode 115 and the upper electrode 216 are electrically connected to each other. In the case of this structure, the contact hole 18 is formed before the layer 150 is formed. The sacrificial layer is preferably provided before the formation of the contact hole 18. For the other components in FIG. 14, FIG. 1 and the like can be referred to.

The contact hole 18 can be provided in a desired portion. For example, as illustrated in FIG. 13A, one contact hole 18 may be formed per six pixels. As long as the auxiliary electrode 115 can decrease the resistance of the upper electrode 216 shared by the pixel regions 10, there is no need to form the contact hole 18 per pixel, and the contact hole 18 is formed for a plurality of pixels.

<Height of Partition Wall 110>

In the pixel region 10, the partition wall 110 with a lattice pattern includes the first region 110*x* along the X direction and the second region 110*y* along the Y direction. In one embodiment of the present invention, the height of the partition wall 110 is not necessarily uniform; for example, the first region 110*x* and the second region 110*y* may have different heights. The perspective view of the pixel region 10 in FIG. 17 illustrates the case where the second region 110*y* has a larger height than the first region 110*x*, that is, the case where the height of the second region 110*y* is larger than that of the first region 110*x* when the positions of the uppermost surfaces of the regions are compared.

The partition wall 110 preferably has a stacked-layer structure in which the second insulator 121 containing an organic material is positioned over the first insulator 120 containing an inorganic material. In order to make the height of the partition wall 110 uneven, it is preferable that the first insulator 120 correspond to the first region 110*x* and the stacked-layer structure of the first insulator 120 and the second insulator 121 correspond to the second region 110*y*. For example, the first insulator 120 is formed in a lattice pattern, and then the second insulator 121 is formed only in portions corresponding to the second region 110*y*. For the other components, Embodiment 1 described above can be referred to.

Figure 17:
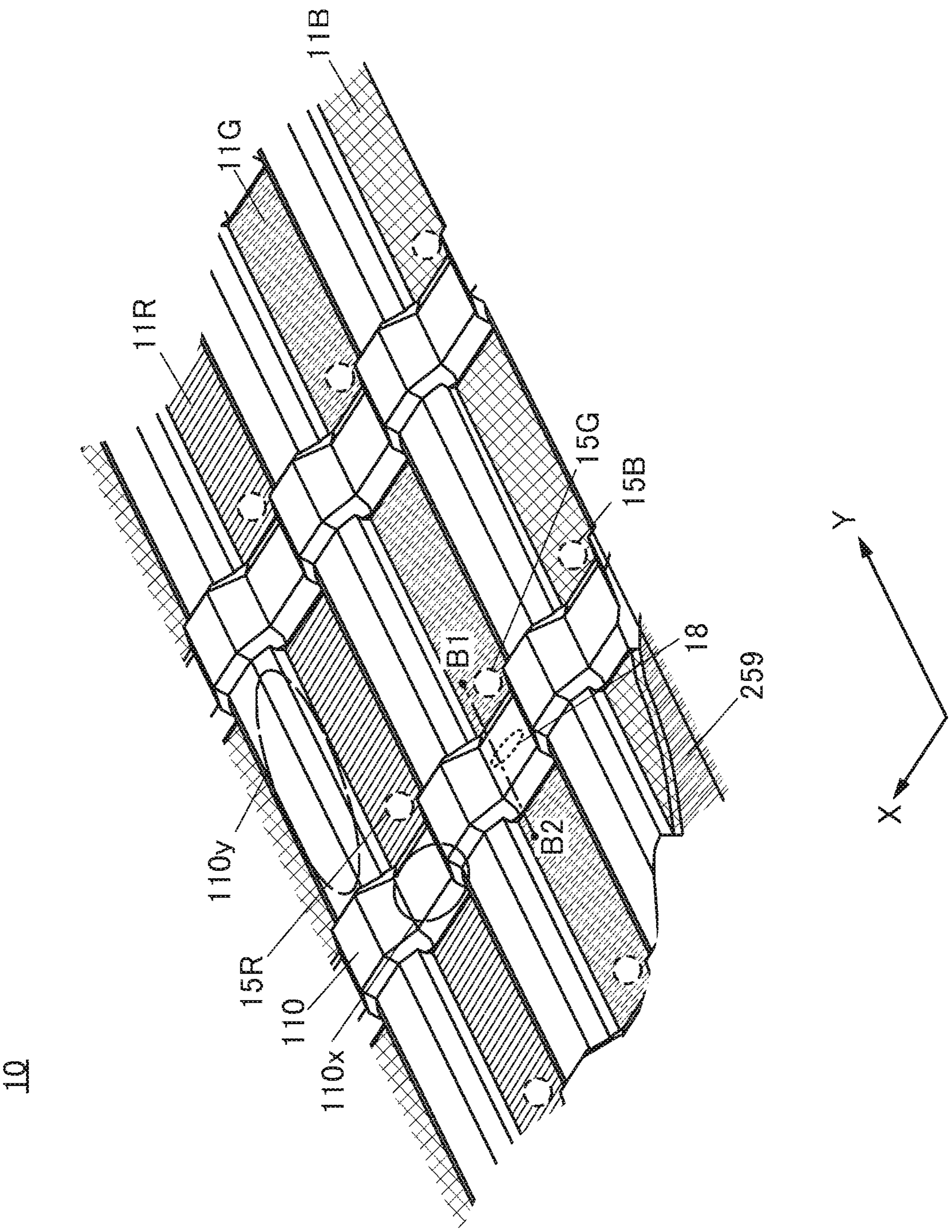
FIG. 17 is a perspective view illustrating a pixel region of one embodiment of the present invention.

The ink-jet nozzles 119R, 119G, and 119B illustrated in FIG. 15 and the like can be transferred along the second regions 110*y* illustrated in FIG. 17. The second region 110*y* serves as a tall partition wall, and can inhibit color mixing. Inhibiting color mixing is preferable particularly in the case where the light-emitting layers of different colors are formed at the same time for the pixel 11R, the pixel 11G, and the pixel 11B.

The first region 110*x* is positioned at the boundary between the pixels of the same color. The first region 110*x* is a partition wall that is lower than the second region 110*y*. Accordingly, the light-emitting layer can be formed by an ink-jet method without the first region 110*x* in view of the purpose of inhibiting color mixing. However, liquid unevenness between the pixels of the same color can be inhibited by the first region 110*x*, which is preferable.

Figure 18A:
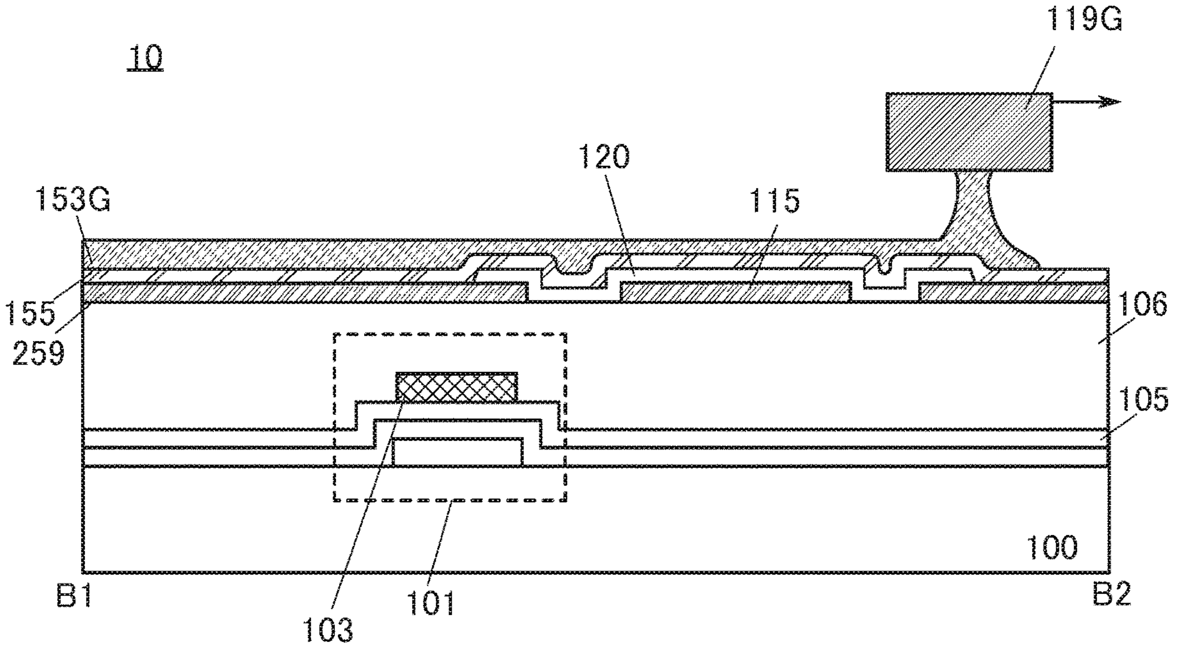
FIG. 18A is a cross-sectional view illustrating a method of forming a pixel region by using an ink-jet method of one embodiment of the present invention.
Figure 18B:
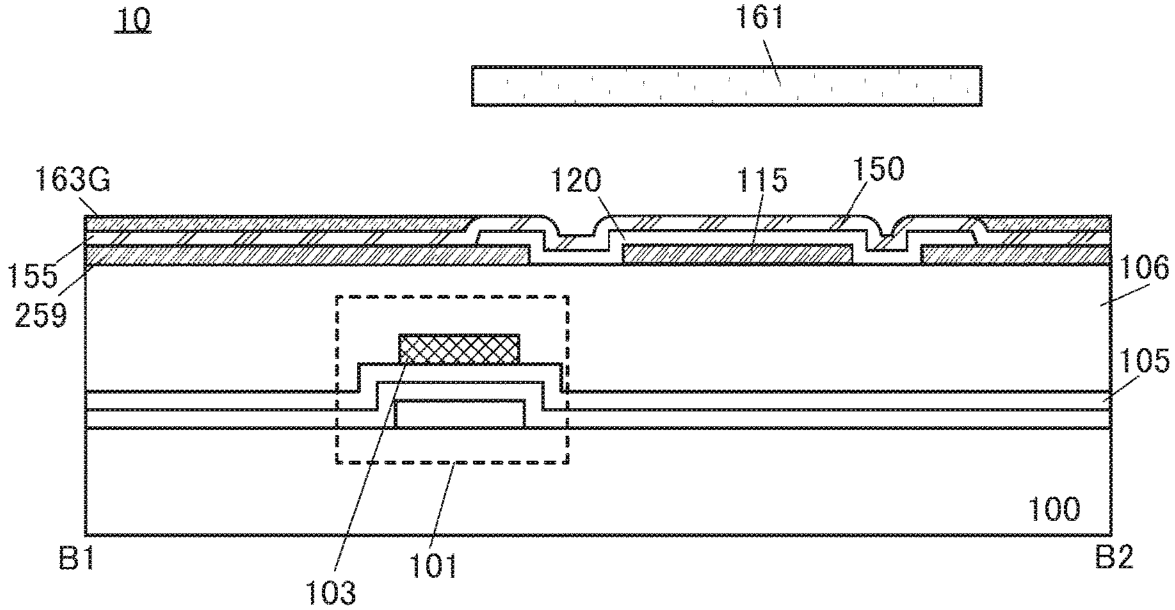
FIG. 18B is a cross-sectional view illustrating a method of forming a pixel region by using an evaporation method of one embodiment of the present invention.

FIG. 18A and FIG. 18B are cross-sectional views along the first region 110*x*. FIG. 18A and FIG. 18B illustrate the case where a partition wall having a single layer structure is used as the first region 110*x*. Specifically, the first insulator 120 is used as the partition wall having a single layer structure.

In the case where the light-emitting layer 153G is formed by an ink-jet method, the ink-jet nozzle 119G is transferred along the second region 110*y*. Then, the light-emitting layer 153G is formed over the first insulator 120. A solution dropped by the ink-jet nozzle 119G is evaporated early in a region with a small amount of the solution. With reference to FIG. 18A, the amount of the solution over the first insulator 120 is smaller than that over the other regions; thus, the solution over the first insulator 120 is evaporated early. When evaporation of the solution over the first insulator 120 is completed early, movement of the solution between pixels exhibiting light of the same color, for example, a first pixel 11G and a second pixel 11G, is reduced, so that liquid unevenness is inhibited.

FIG. 18B illustrates the case where the light-emitting layer 163G is formed by an evaporation method. The metal mask 161 covers the first insulator 120, so that the light-emitting layer 163G is not formed over the first insulator 120.

The contact hole 18 may be formed in such a low partition wall. In forming the contact hole 18, a sacrifice layer may be formed over the light-emitting layer.

The perspective view of FIG. 17 shows an example of the height of the partition wall 110, and the first region 110*x* may have a larger height than the second region 110*y*.

In the above manner, the pixel region 10 includes a light-emitting device in each pixel and the upper electrode of the light-emitting device can be electrically connected to the auxiliary electrode. The auxiliary electrode can reduce the voltage drop due to the upper electrode. The auxiliary electrode does not decrease the aperture ratio because being positioned in a region overlapping with the partition wall. Such an auxiliary electrode is preferably used for a high-definition display device having a high aperture ratio.

This embodiment can be implemented in combination with the other embodiments described in this specification and the like as appropriate. For example, part of the structure described in this embodiment may be implemented in combination with the other embodiments described in this specification and the like as appropriate.

Embodiment 4

In this embodiment, a pixel region including an auxiliary electrode in a display device of one embodiment of the present invention will be described. Specifically, a display device having an arrangement of the auxiliary electrode 115, the upper electrode 159, and the like different from that in Embodiment 1 will be described. The description of components with the same reference numerals as Embodiment 1 is omitted in this embodiment in some cases.

Figure 19A:
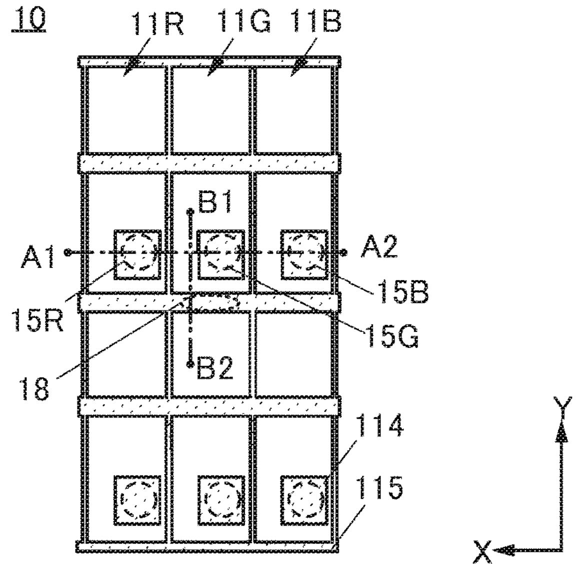
FIG. 19A is a top view illustrating a pixel region of one embodiment of the present invention.
Figure 19B:
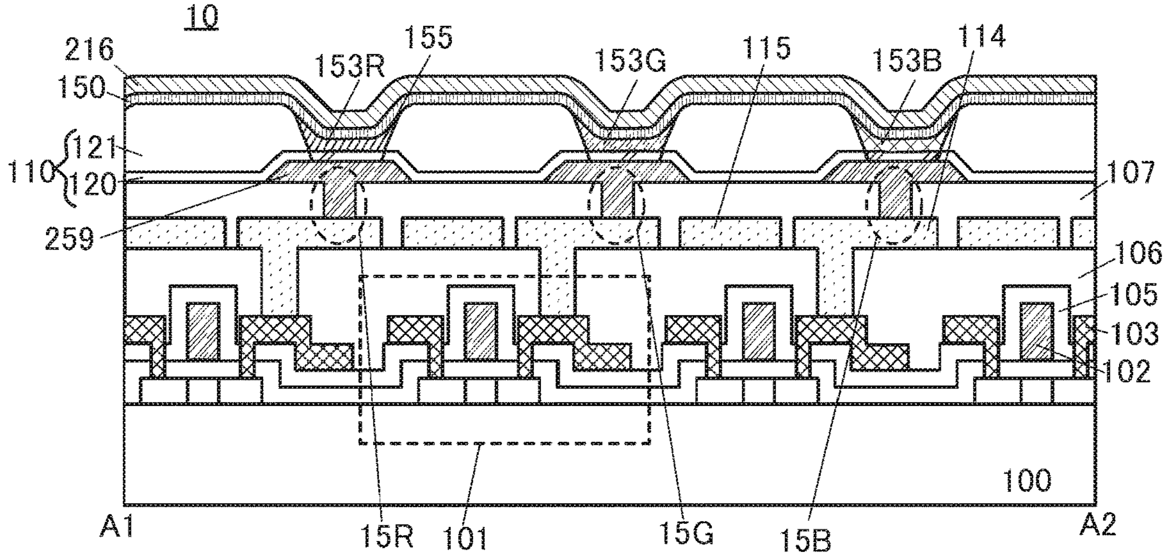
FIG. 19B and FIG. 19C are cross-sectional views illustrating the pixel region.
Figure 19C:
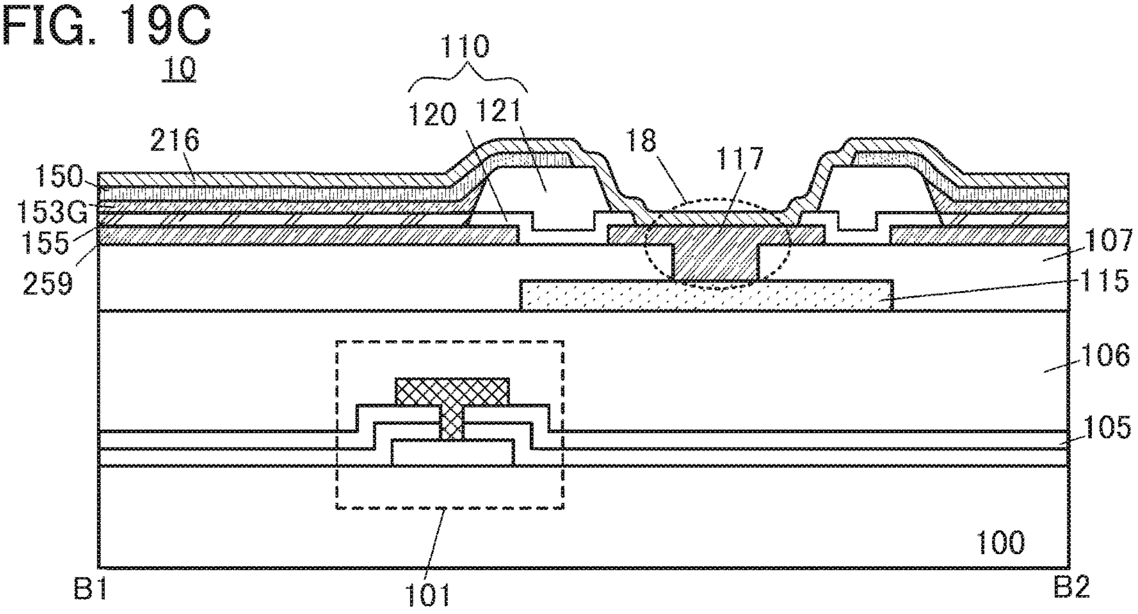

As illustrated in FIG. 19B and FIG. 19C, the auxiliary electrode 115 is formed over the insulating layer 106, an insulating layer 107 is newly formed over the auxiliary electrode 115, and the lower electrode 259 is formed over the insulating layer 107. This arrangement is different from that in the above embodiment.

FIG. 19A shows a top view of the auxiliary electrodes 115. The auxiliary electrodes 115 may be arranged in a lattice pattern similar to that in FIG. 13A, and may be extended to a region overlapping with the lower electrode 259. Thus, the lattice interval of the auxiliary electrode 115 in FIG. 19A can be shorter than that in FIG. 13A. The auxiliary electrode 115 includes a region that crosses the center portion of the pixel 11R along the X direction. The auxiliary electrode 115 in FIG. 19A can have a larger area than that in the above embodiment and does not necessarily contain the same conductive material as the lower electrode 259; thus, the selectivity of the materials is high. The structure of the auxiliary electrode 115 in this embodiment can reduce the voltage drop due to the upper electrode 216 effectively.

As described above, when the auxiliary electrode 115 and the lower electrode 259 are formed on different surfaces, the selection flexibility of a conductive material used for the auxiliary electrode 115 is increased. For example, a material having a lower resistivity than the lower electrode 259 can be used for the auxiliary electrode 115, which is preferable.

Furthermore, since the surface where the auxiliary electrode 115 is formed can be different from the surface where the lower electrode 259 is formed as described above, the flexibility of layout of the auxiliary electrodes 115 is increased. In the above embodiment where the auxiliary electrode 115 and the lower electrode 259 are formed on the same surface, the auxiliary electrode 115 cannot be in contact with the lower electrode 259; however, in this embodiment, the auxiliary electrode 115 and the lower electrode 259 can overlap with each other in a top view because the insulating layer 107 is positioned therebetween, so that the auxiliary electrode 115 can have a larger area.

As illustrated in FIG. 19B and FIG. 19C, the lower electrode 259 is electrically connected to the source and the drain 103 through the contact holes 15R, 15G, and 15B. A conductive layer 114 is preferably positioned between the lower electrode 259 and the source and the drain 103. FIG. 19A shows a top view of the conductive layer 114 in addition to a top view of the auxiliary electrode 115. The conductive layer 114 is formed with the same material as the auxiliary electrode 115. With the interposition of the conductive layer 114, openings can be formed in each of the insulating layer 106 and the insulating layer 107. The openings of the insulating layer 106 are formed to have regions not overlapping with the openings of the insulating layer 107 in a cross-sectional view. The openings formed in this manner are preferably used as the contact holes 15R, 15G, and 15B, in which case the yield can be increased.

As illustrated in FIG. 19C, the upper electrode 216 is electrically connected to the auxiliary electrode 115 through the contact hole 18. A conductive layer 117 is preferably positioned between the upper electrode 216 and the auxiliary electrode 115. The conductive layer 117 is formed with the same material as the lower electrode 259. With the interposition of the conductive layer 117, openings can be formed in each of the insulating layer 107 and the partition wall 110. Forming an opening in each of the insulating layer 107 and the partition wall 110 independently is better than forming openings in the insulating layer 107 and the partition wall at once because the yield can be increased.

The components in FIG. 19A to FIG. 19C except the above-described components are similar to those in the above embodiment.

Figure 20:
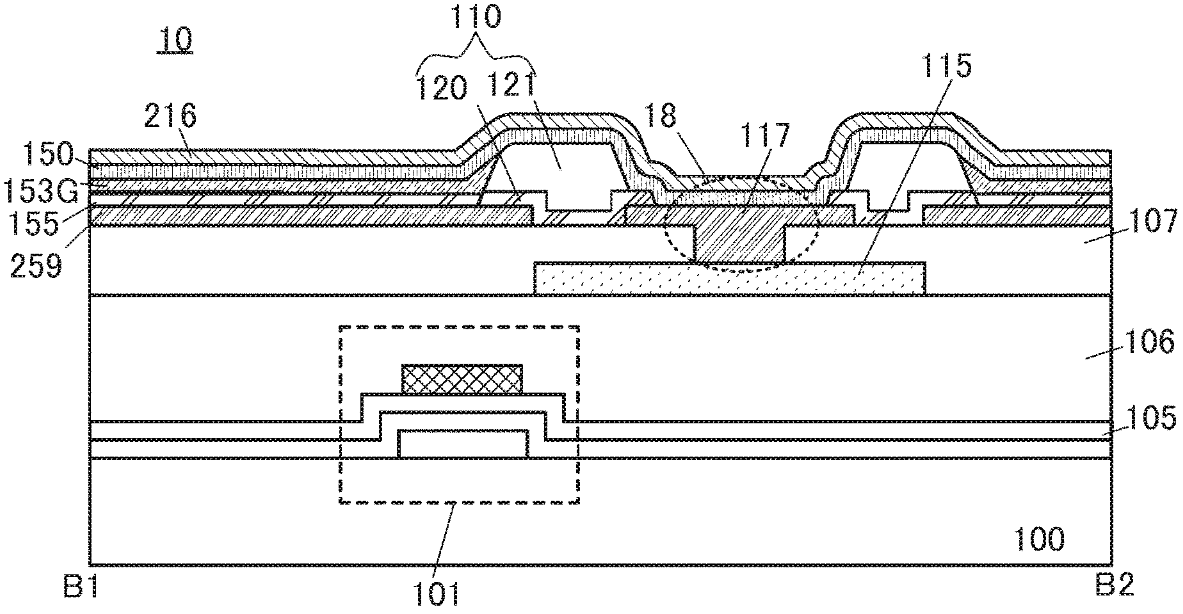
FIG. 20 is a cross-sectional view illustrating a pixel region of one embodiment of the present invention.

FIG. 20 illustrates the case where the layer 150 is positioned between the upper electrode 216 and the auxiliary electrode 115 in the contact hole 18 as in FIG. 14. The structure is similar to that in Embodiment 1 except for that the layer 150 is positioned between the upper electrode 216 and the auxiliary electrode 115.

Figure 21A:
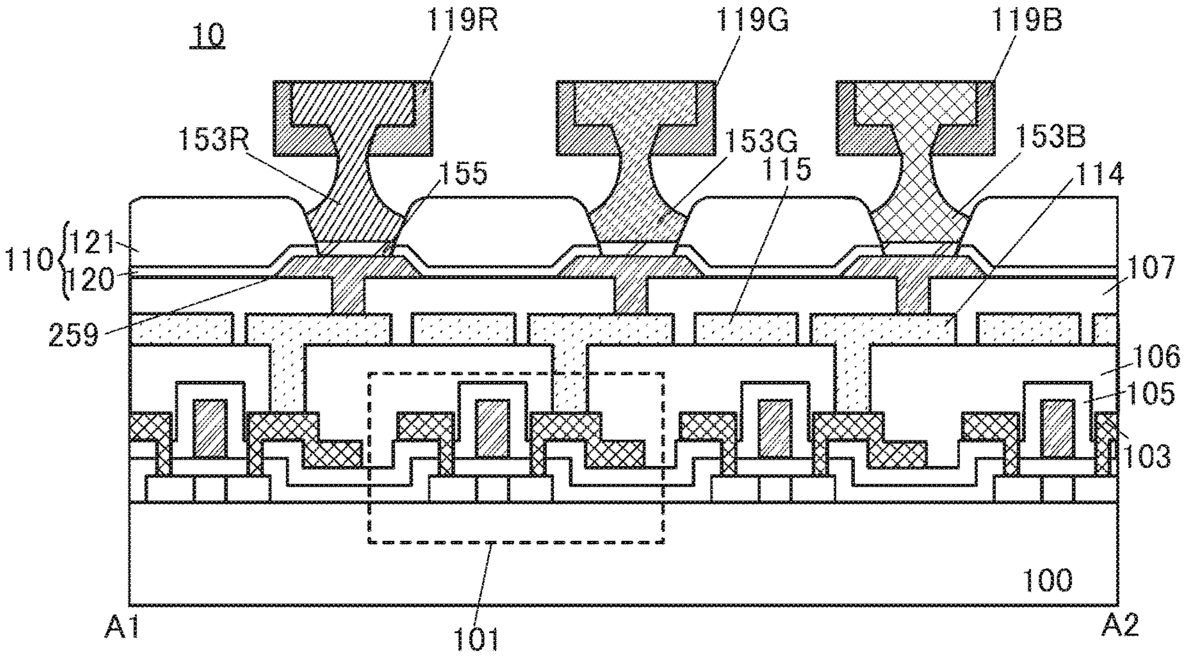
FIG. 21A and FIG. 21B are cross-sectional views illustrating a method of forming a pixel region by using an ink-jet method of one embodiment of the present invention.
Figure 21B:
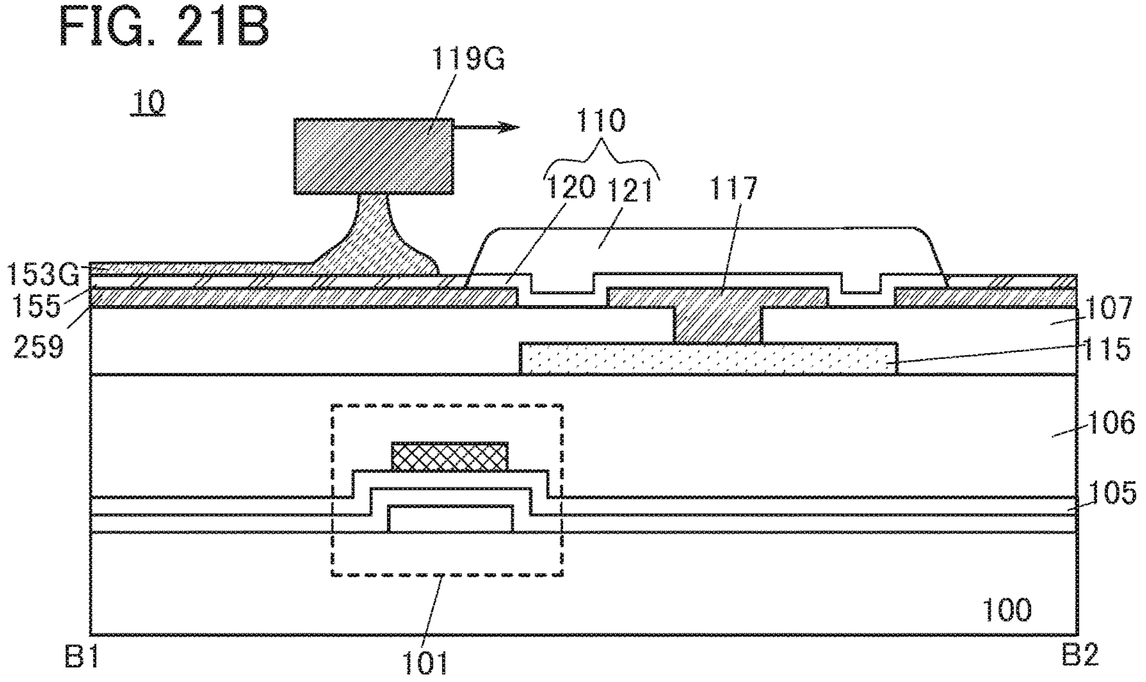

FIG. 21A and FIG. 21B illustrate a state where the light-emitting layer 153R, the light-emitting layer 153G, and the light-emitting layer 153B are formed by an ink-jet method as in FIG. and FIG. 15B. In FIG. 21A, the conductive layer 114 is positioned between the lower electrode 259 and the source and the drain 103. In FIG. 21B, the conductive layer 117 electrically connected to the auxiliary electrode 115 is included. FIG. 21B is a cross-sectional view before the upper electrode 216 is formed, and the auxiliary electrode 115 in FIG. 21B is electrically connected to the upper electrode 216 through the conductive layer 117. The other components are similar to those in Embodiment 1 described above.

Figure 22A:
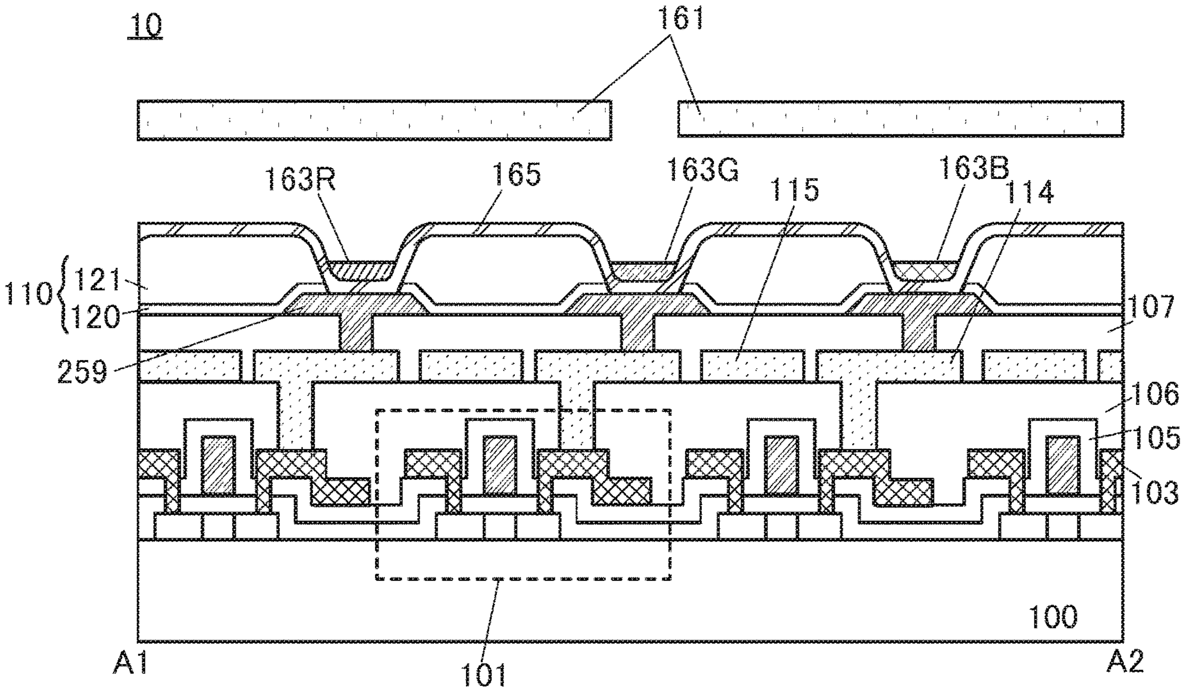
FIG. 22A and FIG. 22B are cross-sectional views illustrating a method of forming a pixel region by using an evaporation method of one embodiment of the present invention.
Figure 22B:
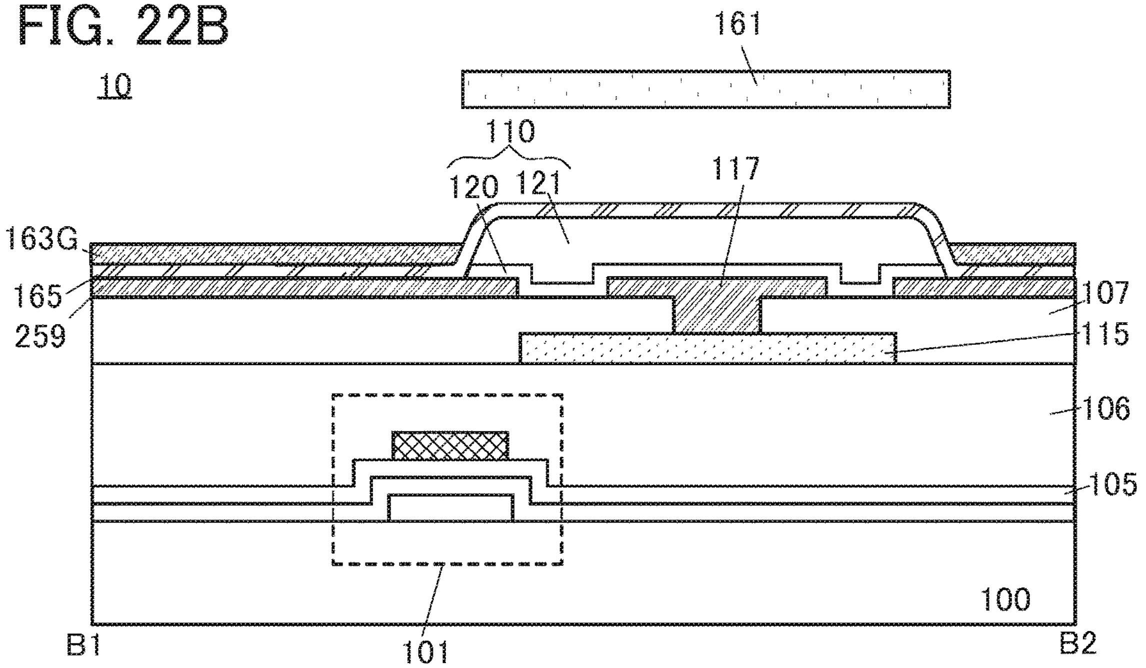

FIG. 22A and FIG. 22B illustrate a state where the light-emitting layer 163R, the light-emitting layer 163G, and the light-emitting layer 163B are formed by an evaporation method as in FIG. 16A and FIG. 16B. In FIG. 22A, the conductive layer 114 is positioned between the lower electrode 259 and the source and the drain 103. In FIG. 22B, the conductive layer 117 electrically connected to the auxiliary electrode 115 is included. FIG. 22B is a cross-sectional view before the upper electrode 216 is formed, and the auxiliary electrode 115 in FIG. 22B is electrically connected to the upper electrode 216 through the conductive layer 117. The other components are similar to those in Embodiment 1 described above.

Also in this embodiment, the height of the partition wall 110 may be uneven as in the perspective view of FIG. 17.

Figure 23A:
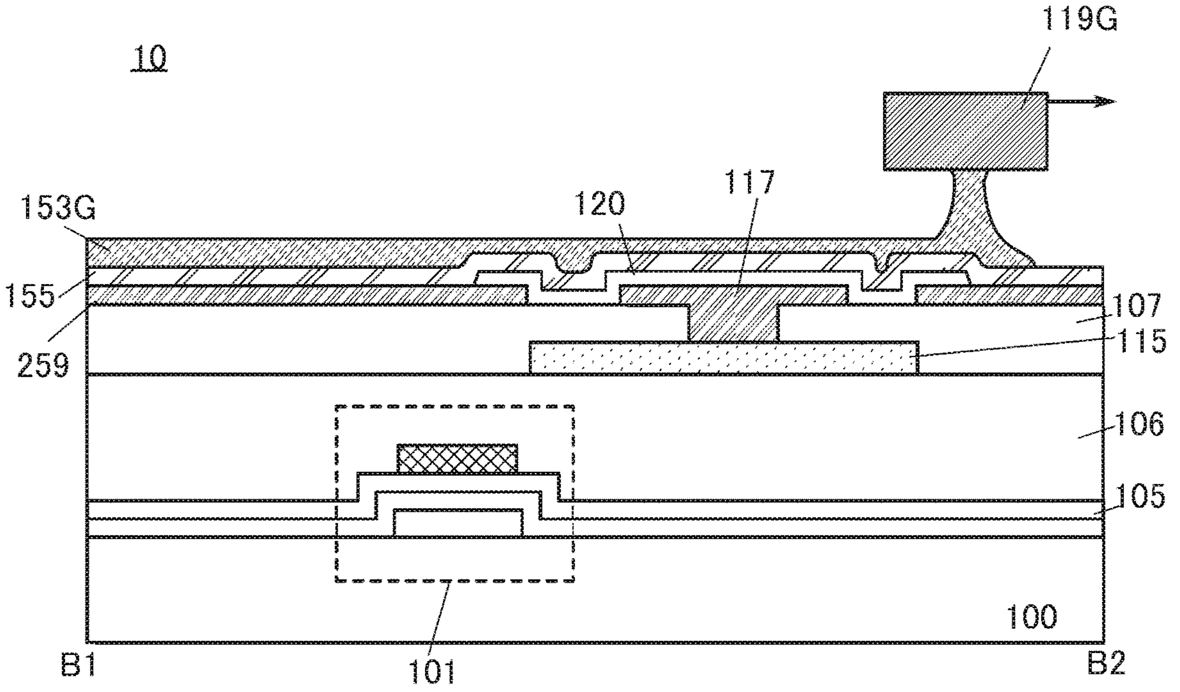
FIG. 23A is a cross-sectional view illustrating a method of forming a pixel region by using an ink-jet method of one embodiment of the present invention.
Figure 23B:
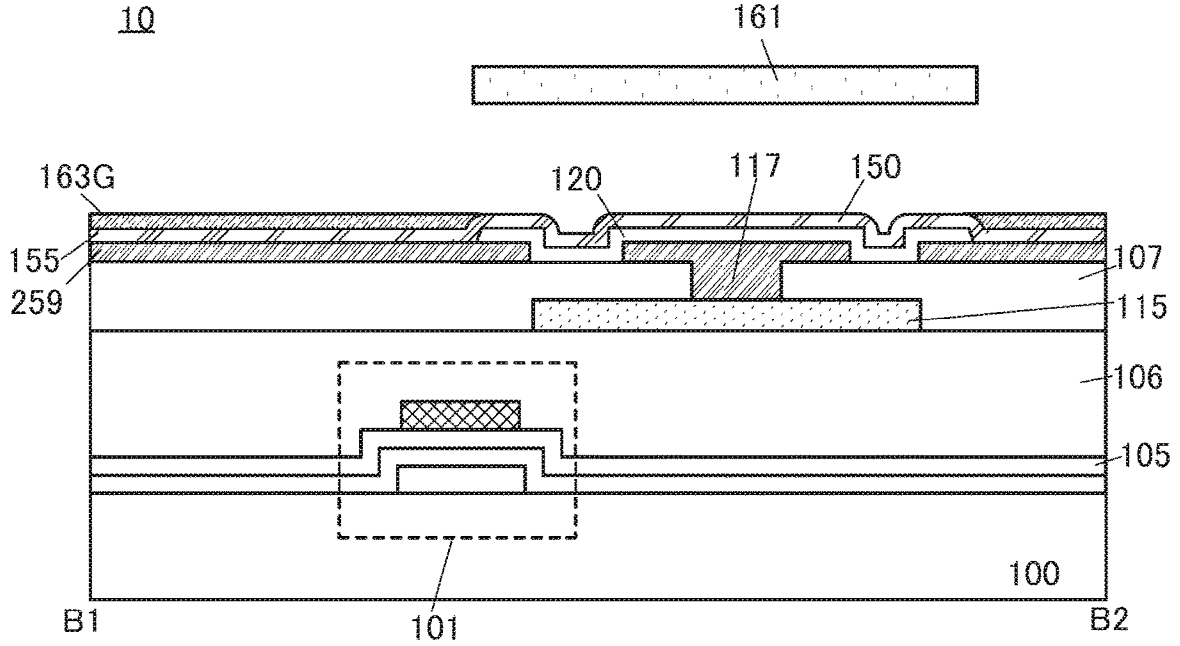
FIG. 23B is a cross-sectional view illustrating a method of forming a pixel region by using an evaporation method of one embodiment of the present invention.

FIG. 23A and FIG. 23B are cross-sectional views along the first region 110*x*, like FIG. 18A and FIG. 18B. For example, the first region 110*x* includes the first insulator 120.

In FIG. 23A, in the case where the light-emitting layer 153G is formed by an ink-jet method, the ink-jet nozzle 119G is transferred along the second region 110*y*. Then, the light-emitting layer 153G is formed over the first insulator 120. In FIG. 23A, the conductive layer 117 electrically connected to the auxiliary electrode 115 is included. FIG. 23A is a cross-sectional view before the upper electrode 216 is formed, and the auxiliary electrode 115 in FIG. 23A is electrically connected to the upper electrode 216 through the conductive layer 117. The other components are similar to those in Embodiment 1 described above.

FIG. 23B illustrates the case where the light-emitting layer 163G is formed by an evaporation method. The metal mask 161 covers the first insulator 120, so that the light-emitting layer 163G is not formed over the first insulator 120. In FIG. 23B, the conductive layer 117 electrically connected to the auxiliary electrode 115 is included. FIG. 23A is a cross-sectional view before the upper electrode 216 is formed, and the auxiliary electrode 115 in FIG. 23B is electrically connected to the upper electrode 216 through the conductive layer 117. The other components are similar to those in Embodiment 1 described above.

In the above manner, the pixel region 10 includes a light-emitting device in each pixel and the upper electrode of the light-emitting device can be electrically connected to the auxiliary electrode. The auxiliary electrode can reduce the voltage drop due to the upper electrode. Since the auxiliary electrode is positioned below the partition wall, the auxiliary electrode is preferably used for a high-definition display device having a high aperture ratio.

This embodiment can be implemented in combination with the other embodiments described in this specification and the like as appropriate. For example, part of the structure described in this embodiment may be implemented in combination with the other embodiments described in this specification and the like as appropriate.

Embodiment 5

In this embodiment, a light-emitting device of one embodiment of the present invention will be described.

<Example of Light-Emitting Device>

Figure 24A:
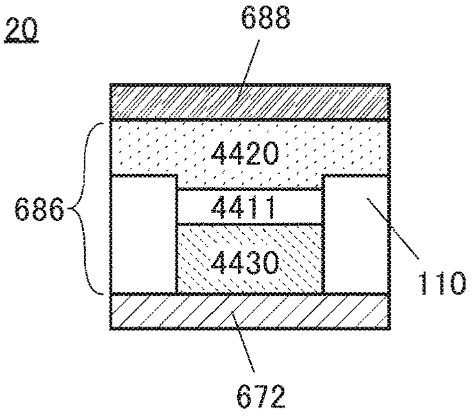

As illustrated in FIG. 24A, a light-emitting device 20 includes a light-emitting unit 686 between a pair of electrodes (a lower electrode 672 and an upper electrode 688). The light-emitting unit 686 can be formed with a plurality of functional layers such as a layer 4420, a light-emitting layer 4411, and a layer 4430, and the partition wall 110 is positioned with respect to a layer formed by a wet method. For example, in the case where the light-emitting layer 4411 is formed by a wet method, the partition wall 110 is provided for separating the light-emitting layer 4411. Although not illustrated, the partition wall 110 may include the first region and the second region which have different heights as in the above embodiment.

As the light-emitting layer 4411, a functional layer containing a light-emitting material may be used, for example.

The layer 4420 and the layer 4430 are described. For example, in the case where the lower electrode 672 is an anode and the upper electrode 688 is a cathode, the layer 4430 corresponds to the layer 150 in Embodiment 1 or the like. For the layer 4430, a hole-injection layer, a hole-transport layer, and the like can be used, for example. The hole-injection layer is expressed by HIL (abbreviation of Hole Injection Layer) in some cases. The hole-transport layer is expressed by HTL (abbreviation of Hole Transport Layer) in some cases. The layer 4430 includes any one of the hole-injection layer and the hole-transport layer in some cases. The layer 4420 corresponds to the layer 155 in Embodiment 1 or the like. For the layer 4420, an electron-injection layer, an electron-injection layer, and the like may be used. The electron-injection layer is expressed by EIL (abbreviation of Electron Injection Layer) in some cases. The electron-transport layer is expressed by ETL (abbreviation of Electron Transport Layer) in some cases. The layer 4420 includes any one of the electron-injection layer and the electron-transport layer in some cases.

In FIG. 24A, the light-emitting layer 4411 is formed over the layer 4430 in the partition wall 110 by a wet method such as an ink-jet method or an evaporation method. The light-emitting layer 4411 corresponds to the light-emitting layer 153R, the light-emitting layer 153G, and the light-emitting layer 153B in Embodiment 1 or the like. Alternatively, the light-emitting layer 4411 corresponds to the light-emitting layer 163R, the light-emitting layer 163G, and the light-emitting layer 163B in Embodiment 1 or the like. The lower electrode 672 and the upper electrode 688 can be formed by an evaporation method, a CVD method, or a sputtering method. The layer 4430 and the layer 4420 can be formed by a wet method or an evaporation method. The layer 4420 and the upper electrode 688 can be shared by a plurality of light-emitting devices. The layers that can be shared are formed over the entire pixel region. The layer that can be shared is formed across the partition wall 110, and in the case where a step disconnection is prevented from generating on the partition wall 110, the layer that can be shared is preferably increased in thickness. In the case where the increase in the thickness is limited, the solution or the like for the ink-jet is preferably controlled to fill the level of the light-emitting layer 4411, which is formed below the layer that can be shared, to be greater than or equal to ⅔ times and less than 1 time the level of the partition wall 110.

Figure 24B:
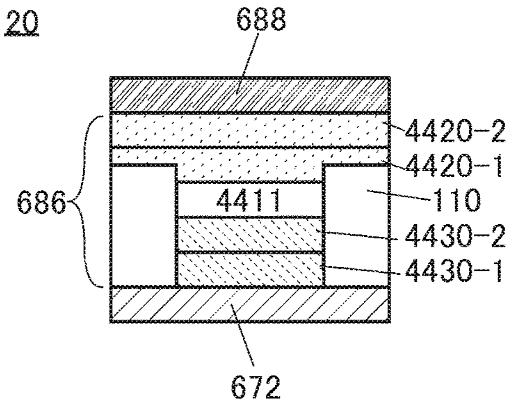
Figure 24B:
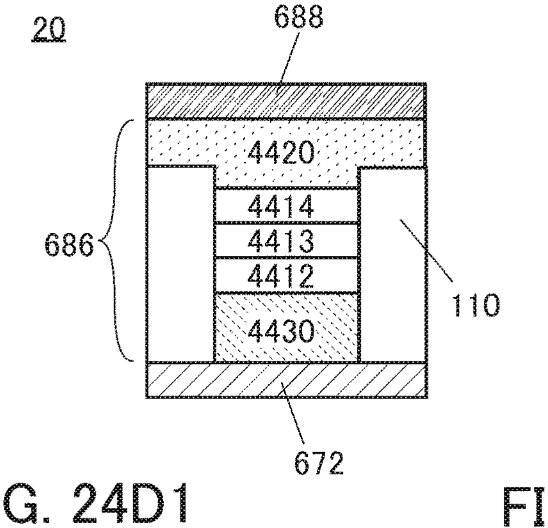
Figure 24B:
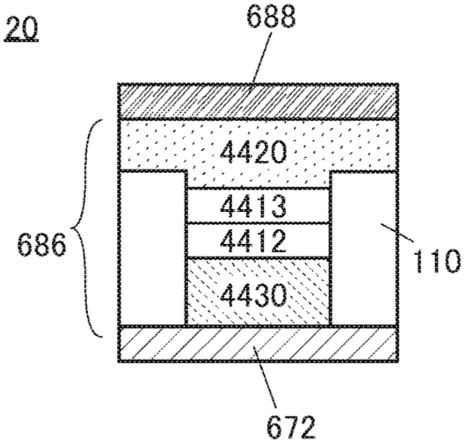
Figure 24B:
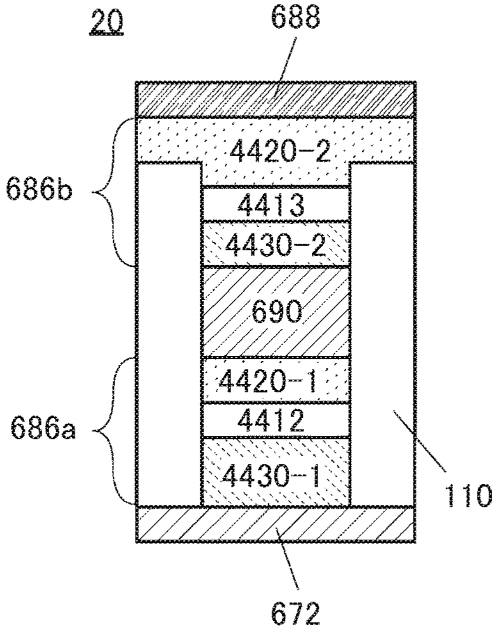
Figure 24B:
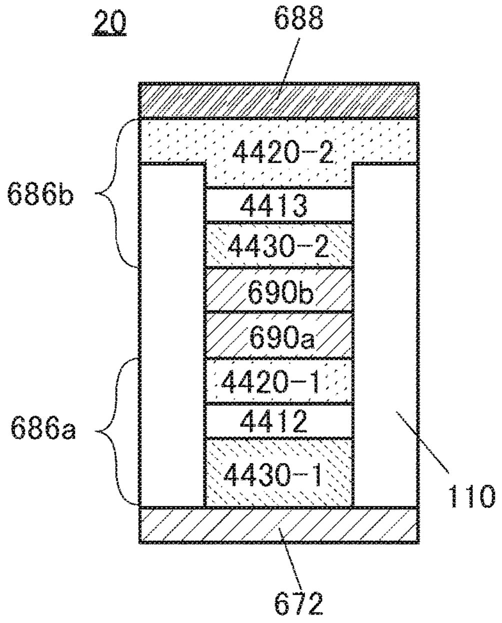

Next, FIG. 24B illustrates a specific structure of FIG. 24A. The light-emitting device illustrated in FIG. 24B includes a layer 4430-1 over the lower electrode 672, a layer 4430-2 over the layer 4430-1, the light-emitting layer 4411 over the layer 4430-2, a layer 4420-1 over the light-emitting layer 4411, a layer 4420-2 over the layer 4420-1, and the upper electrode 688 over the layer 4420-2, and the partition wall 110 is positioned with respect to a layer formed by a wet method. For example, in the case where the light-emitting layer 4411 is formed by a wet method, the partition wall 110 is provided for separating the light-emitting layer 4411. Although not illustrated, the partition wall 110 may include the first region and the second region which have different heights.

For example, when the lower electrode 672 functions as a positive electrode and the upper electrode 688 functions as a negative electrode, the layer 4430-1 functions as a hole-injection layer, the layer 4430-2 functions as a hole-transport layer, the layer 4420-1 functions as an electron-transport layer, and the layer 4420-2 functions as an electron-injection layer.

With such a light-emitting device, carriers (holes and electrons) can be efficiently injected to the light-emitting layer 4411, and the efficiency of recombination of carriers in the light-emitting layer 4411 can be enhanced. Note that a layer interposed between the light-emitting layer 4411 and the lower electrode 672 and a layer interposed between the light-emitting layer 4411 and the upper electrode 688 are not limited to these layers, and a carrier-block layer, an exciton-block layer, or the like may be included as appropriate. A layer having both functions of transporting carriers and injecting carriers may be used.

In FIG. 24B, the light-emitting layer 4411 is formed over the layer 4430-2 in the partition wall 110 by a wet method such as an ink-jet method or an evaporation method. The lower electrode 672 and the upper electrode 688 can be formed by an evaporation method, a CVD method, or a sputtering method. The layer 4430-1, the layer 4430-2, the layer 4420-1, and the layer 4420-2 can be formed by a wet method or an evaporation method. The layer 4420-1 and the layer 4420-2 and the upper electrode 688 can be shared by a plurality of light-emitting devices in some cases. The layers that can be shared are formed over the entire pixel region. The layer that can be shared is formed across the partition wall 110, and in the case where a step disconnection is prevented from generating on the partition wall 110, the layer that can be shared is preferably increased in thickness. In the case where the increase in the thickness is limited, the solution for the ink-jet is preferably controlled to fill the level of the light-emitting layer 4411, which is formed below the layer that can be shared, to be greater than or equal to ⅔ times and less than 1 time the level of the partition wall 110.

Next, modification examples of FIG. 24A and FIG. 24B are illustrated in FIG. 24C1 and FIG. 24C2. In FIG. 24C1, a plurality of light-emitting layers (a first light-emitting layer 4412, a second light-emitting layer 4413, and a third light-emitting layer 4414) are provided between the layer 4420 and the layer 4430. In FIG. 24C2, a plurality of light-emitting layers (the first light-emitting layer 4412 and the second light-emitting layer 4413) are provided between the layer 4420 and the layer 4430. Note that the light-emitting layers are distinguished from one another by being added with the ordinal numbers from the bottom. The partition wall 110 is positioned with respect to a layer formed by a wet method. For example, in the case where all the plurality of light-emitting layers are formed by a wet method, the partition wall 110 is provided to separate these layers. Although not illustrated, the partition wall 110 may include the first region and the second region which have different heights.

As light-emitting materials contained in the plurality of light-emitting layers, a light-emitting material emitting light of the same color or light-emitting materials emitting light of different colors can be selected. In the case where a light-emitting material emitting light of the same color is selected, the driving current can be decreased while the driving voltage is increased, which is advantageous in terms of increasing the luminance and the lifetime. In the case where light-emitting materials emitting light of different colors are selected, a light-emitting device exhibiting white light can be obtained by selecting light-emitting materials emitting light of complementary colors. For example, in FIG. 24C2, when light-emitting materials are selected such that the emission color of the first light-emitting layer 4412 and the emission color of the second light-emitting layer 4413 are complementary colors, white light emission can be obtained from the light-emitting device 20.

Although FIG. 24C1 and FIG. 24C2 illustrate a stacked-layer structure of three light-emitting layers and a stacked-layer structure of two light-emitting layers, four or more light-emitting layers may be stacked.

In the case where white light is exhibited and full color display is desired to be performed, there is a method of obtaining a desired color such as red (R), blue (B), or green (G) by using a color filter or a color conversion layer.

In FIG. 24C1 and FIG. 24C2, separate coloring is performed for each light-emitting device, which enables full color display.

In FIG. 24C1 and FIG. 24C2, a plurality of light-emitting layers such as the light-emitting layer 4411 are formed over the layer 4430 in the partition wall 110 by a wet method such as an ink-jet method. The lower electrode 672 and the upper electrode 688 can be formed by an evaporation method, a CVD method, or a sputtering method. The layer 4430 and the layer 4420 can be formed by a wet method or an evaporation method. The layer 4420 and the upper electrode 688 can be shared by a plurality of light-emitting devices in some cases. The layers that can be shared are formed over the entire pixel region. The layer that can be shared is formed across the partition wall 110, and in the case where a step disconnection is prevented from generating on the partition wall 110, the layer that can be shared is preferably increased in thickness. In the case where the increase in the thickness is limited, the solution for the ink-jet is preferably controlled to fill the level of the first light-emitting layer 4412, which is formed below the layer that can be shared, to be greater than or equal to ⅔ times and less than 1 time the level of the partition wall 110.

Note that also in FIG. 24C1 and FIG. 24C2, the layer 4420 and the layer 4430 may each have a stacked-layer structure of two or more layers as illustrated in FIG. 24B.

Next, modification examples of FIG. 24C2 are illustrated in FIG. 24D1 and FIG. 24D2. FIG. 24D1 and FIG. 24D2 each illustrate an example in which light-emitting units are stacked. In FIG. 24D1 and FIG. 24D2, a first light-emitting unit 686*a* and a second light-emitting unit 686*b* are included, and an intermediate layer (sometimes referred to as a charge-generation layer) 690 is included therebetween. The first light-emitting unit 686*a* includes the layer 4430-1, the first light-emitting layer 4412, and the layer 4420-1. The second light-emitting unit 686*b* includes the layer 4430-2, the second light-emitting layer 4413, and the layer 4420-2. The partition wall 110 is positioned with respect to a layer formed by a wet method among the layers. For example, in the case where the first light-emitting layer 4412 and the second light-emitting layer 4413 are formed by a wet method, the partition wall 110 is provided to separate each of the light-emitting layers. Although not illustrated, the partition wall 110 includes the first region and the second region which have different heights. Note that the light-emitting layers are distinguished from one another by being added with the ordinal numbers from the bottom.

The layer 4420-1 and the layer 4430-1 are functional layers similar to the layer 4420 and the layer 4430, respectively. The layer 4420-2 and the layer 4430-2 are functional layers similar to the layer 4420 and the layer 4430, respectively.

The intermediate layer 690 illustrated in FIG. 24D1 contains a dopant material. For example, the intermediate layer 690 contains the same donor material as the layer 4420-1 and the same acceptor material as the layer 4430-2. In the intermediate layer 690, a layer containing a donor material is positioned on the layer 4420-1 side and a layer containing an acceptor material is positioned on the layer 4430-2 side.

An intermediate layer 690*a* illustrated in FIG. 24D2 is a layer containing the same donor material as the layer 4420-1 and an intermediate layer 690*b* is a layer containing the same acceptor material as the layer 4430-2, and the case where these can be distinguished is described.

In FIG. 24D1 and FIG. 24D2, as light-emitting materials contained in the plurality of light-emitting layers, a light-emitting material emitting light of the same color or light-emitting materials emitting light of different colors can be selected as in FIG. 24C2. In the case where a light-emitting material emitting light of the same color is selected, the driving current can be decreased while the driving voltage is increased, which is advantageous in terms of increasing the luminance and the lifetime. In the case where light-emitting materials emitting light of different colors are selected, a light-emitting device exhibiting white light can be obtained by selecting light-emitting materials emitting light of complementary colors.

In the case where white light is exhibited and full color display is desired to be performed in FIG. 24D1 and FIG. 24D2, a color filter or a color conversion layer may be used as in FIG. 24C2 and the like.

In FIG. 24D1 and FIG. 24D2, separate coloring of emission colors red (R), blue (B), or green (G) is performed for each light-emitting device as in FIG. 24C2 and the like, which enables full color display.

The color purity can be further increased when any of the light-emitting devices 20 illustrated in FIG. 24 has a microcavity structure. In the microcavity structure, the thickness of the lower electrode 672 is changed or the thicknesses of the light-emitting layers are changed depending on emission colors. In the case where the lower electrode 672 has a stacked-layer structure of a first conductive film and a second conductive film over the first conductive film, a microcavity structure can be easily obtained by changing the thickness of the second conductive film.

Here, a specific structure example of the light-emitting device is described.

The light-emitting device 20 includes at least the light-emitting layer. The light-emitting device 20 may further include, as a layer other than the light-emitting layer, a layer containing a substance with a high hole-injection property, a substance with a high hole-transport property, a hole-blocking material, a substance with a high electron-transport property, an electron-blocking material, a substance with a high electron-injection property, a substance with a bipolar property (a substance with a high electron-transport property and a high hole-transport property), or the like.

<Hole-Injection Layer>

The hole-injection layer is a layer that contains a substance having a high hole-injection property and that can inject holes from the anode to the hole-transport layer.

Specifically, the substance having a high hole-injection property can be formed with a phthalocyanine-based complex compound, an aromatic amine compound, or a high molecular compound such as poly(3,4-ethylenedioxythiophene)/poly(styrenesulfonic acid) (PEDOT/PSS).

A hole-injection layer different from the above may be formed with a substance having an acceptor property. The substance having an acceptor property can extract electrons from an adjacent hole-transport layer (or hole-transport material) by application of voltage between the electrodes.

When an organic compound is used as the substance having an acceptor property, an organic compound having an electron-withdrawing group (e.g., a halogen group or a cyano group) is given as an example. A compound in which electron-withdrawing groups are bonded to a fused aromatic ring having a plurality of hetero atoms, such as 2,3,6,7,10,11-hexacyano-1,4,5,8,9,12-hexaazatriphenylene (abbreviation: HAT-CN), is particularly preferable because it is thermally stable. Alternatively, a [3]radialene derivative including an electron-withdrawing group (in particular, a cyano group or a halogen group such as a fluoro group) is preferable because it has a very high electron-accepting property.

As the substance having an acceptor property, an inorganic compound such as molybdenum oxide, vanadium oxide, ruthenium oxide, tungsten oxide, or manganese oxide can also be used, other than the above-described organic compounds.

The hole-injection layer may be formed using a composite material containing any of the aforementioned materials having an acceptor property and a material having a hole-transport property. Note that the material having a hole-transport property used for the composite material preferably has a hole mobility higher than or equal to $1\times10^{-6}$ $cm^2/Vs$.

As the material having a hole-transport property used for the composite material, any of organic compounds such as aromatic amine compounds, heteroaromatic compounds, aromatic hydrocarbons, and high molecular compounds (e.g., oligomers, dendrimers, or polymers) can be used. That is, the material having a hole-transport property used in the composite material is preferably an organic compound having a fused aromatic hydrocarbon ring or a π-electron rich heteroaromatic ring. As the fused aromatic hydrocarbon ring, an anthracene ring, a naphthalene ring, or the like is preferable. As the π-electron rich heteroaromatic ring, a fused aromatic ring having at least one of a pyrrole skeleton, a furan skeleton, and a thiophene skeleton is preferable; specifically, a carbazole ring, a dibenzothiophene ring, or a ring in which an aromatic ring or a heteroaromatic ring is further fused to a carbazole ring or a dibenzothiophene ring is preferable. Another aromatic amine compound may be used as the material having a hole-transport property.

<Hole-Transport Layer>

The hole-transport layer is a layer that transports holes, which are injected from the positive electrode by the hole-injection layer, to the light-emitting layer. The hole-transport layer is a layer containing a hole-transport material. As the hole-transport material, a substance having a hole mobility greater than or equal to $1\times10^{-6}$ $cm^2/Vs$ is preferable. As the hole-transport material, a material having a high hole-transport property, such as a π-electron rich heteroaromatic compound or aromatic amine, is specifically preferable. Note that other substances can be used as the hole-transport material as long as they have a property of transporting holes than electrons.

As the π-electron rich heteroaromatic ring, a fused aromatic ring having at least one of a pyrrole skeleton, a furan skeleton, and a thiophene skeleton is preferable; specifically, a carbazole ring, a dibenzothiophene ring, or a ring in which an aromatic ring or a heteroaromatic ring is further fused to a carbazole ring or a dibenzothiophene ring is preferable.

<Electron-Transport Layer>

The electron-transport layer is a layer that transports electrons, which are injected from the negative electrode by the electron-injection layer, to the light-emitting layer. The electron-transport layer is a layer containing an electron-transport material. As the electron-transport material, a substance having an electron mobility greater than or equal to $1\times10^{-6}$ $cm^2/Vs$ is preferable. As the electron-transport material, a metal complex, an organic compound having a π-electron deficient heteroaromatic ring skeleton, and the like are preferable. Note that other substances can also be used as the electron-transport material as long as they have a property of transporting more electrons than holes.

Specifically, it is possible to use a material with a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound. In particular, the heterocyclic compound having a diazine skeleton, the heterocyclic compound having a triazine skeleton, or the heterocyclic compound having a pyridine skeleton has high reliability and thus is preferable. Among them, the heterocyclic compound having a diazine (pyrimidine, pyrazine, or the like) skeleton or a triazine skeleton has a high electron-transport property and contributes to a reduction in driving voltage.

<Electron-Injection Layer>

The electron-injection layer is a layer that injects electrons from a cathode to the electron-transport layer and that contains a material having a high electron-injection property. As the material having a high electron-injection property, alkali metal, alkaline earth metal, or a compound or complex thereof can be used. As a material of the electron-injection layer, a layer which is formed with electride or a substance having an electron-transport property and which contains alkali metal, alkaline earth metal, or a compound thereof can also be used.

Alternatively, a material having an electron-transport property may be used for the electron-injection layer. For example, a compound having an unshared electron pair and an electron deficient heteroaromatic ring can be used as the material having an electron-transport property. Specifically, a compound having at least one of a pyridine ring, a diazine ring (a pyrimidine ring, a pyrazine ring, or a pyridazine ring), and a triazine ring, for example, 4,7-diphenyl-1,10-phenanthroline (abbreviation: BPhen), 2,9-bis(naphthalen-2-yl)-4,7-diphenyl-1,10-phenanthroline (abbreviation: NBPhen), or the like can also be used.

<Light-Emitting Layer>

The light-emitting layer contains a light-emitting substance. The light-emitting layer can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

As the light-emitting substance, a fluorescent material, a phosphorescent material, a substance exhibiting thermally activated delayed fluorescence (a thermally activated delayed fluorescent (TADF) material), a quantum dot material, or the like can be used.

A known material can be used as the fluorescent material, and a heteroaromatic diamine compound or a fused aromatic diamine compound is particularly preferable as a blue fluorescent material. Examples of such compounds include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. In particular, a fused aromatic diamine compound typified by a pyrenediamine compound is preferable because of its high hole-trapping property, high emission efficiency, and high reliability.

Examples of the phosphorescent material include an organometallic complex (particularly an iridium complex) having a 4H-triazole skeleton, a 1H-triazole skeleton, an imidazole skeleton, a carbene skeleton, a pyrimidine skeleton, a pyrazine skeleton, a pyridine skeleton, or a quinoline skeleton; an organometallic complex (particularly an iridium complex) having a phenylpyridine derivative including an electron-withdrawing group as a ligand; a platinum complex; and a rare earth metal complex.

As the TADF material, fullerene and a derivative thereof, acridine and a derivative thereof, an eosine derivative, porphyrin containing metal such as magnesium (Mg), zinc (Zn), cadmium (Cd), tin (Sn), platinum (Pt), indium (In), or palladium (Pd), a heterocyclic compound having one or both of a π-electron rich heteroaromatic ring and a π-electron deficient heteroaromatic ring, or the like can be used.

Among skeletons having the π-electron deficient heteroaromatic ring, a pyridine skeleton, a diazine skeleton (a pyrimidine skeleton, a pyrazine skeleton, or a pyridazine skeleton), and a triazine skeleton are preferable because of the high stability and reliability. In particular, a benzofuropyrimidine skeleton, a benzothienopyrimidine skeleton, a benzofuropyrazine skeleton, and a benzothienopyrazine skeleton are preferable because of their high acceptor property and favorable reliability. Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included in the TADF material. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, or a 3-(9-phenyl-9H-carbazol-3-yl)-9H-carbazole skeleton is particularly preferable.

Instead of at least one of the π-electron deficient heteroaromatic ring and the π-electron rich heteroaromatic ring, a π-electron deficient skeleton or a π-electron rich skeleton can be used. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a boron-containing skeleton such as phenylborane or boranthrene, an aromatic ring or a heteroaromatic ring having a nitrile group or a cyano group, such as benzonitrile or cyanobenzene, a carbonyl skeleton such as benzophenone, a phosphine oxide skeleton, a sulfone skeleton, or the like can be used.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material described above can be used. Alternatively, as one or more kinds of organic compounds, a bipolar material or a TADF material may be used.

The light-emitting layer preferably contains a phosphorescent material and a combination of a hole-transport material and an electron-transport material that easily forms an exciplex. With such a structure, light emission can be efficiently obtained by ExTET (Exciplex—Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting device can be achieved at the same time.

Although the light-emitting layer is formed by a wet method such as an ink-jet method in one embodiment of the present invention, a composition for application obtained by dispersing or dissolving the above-described material in a solvent can be used. In that case, a variety of organic solvents can be used. A material obtained by mixing a material having a desired function, such as a polymer material, a low molecular material, or dendrimer, and dispersing or dissolving the material in a solvent can be used as an ink material. The polymer material is referred to as a high molecular material in some cases.

Note that in the case where the light-emitting layer is desired to be formed with polymer, a composition obtained by mixing one or more kinds of monomers of a polymer material desired to be deposited may be discharged on a deposition surface, and cross-linking, condensation, polymerization, coordination, bonding of salt or the like may be formed through heating, energy light irradiation, or the like to form a desired film.

Note that the above composition may contain an organic compound having a different function such as a surfactant or a substance for adjusting viscosity.

As the polymer material, a conjugated polymer, a non-conjugated polymer, a pendant-type polymer, a dye-blend type polymer, or the like can be used. Examples of the conjugated polymer include a polyparaphenylene vinylene derivative ((poly(p-phenylenevinylene); PPV), a polyalkylthiophene derivative ((poly(3-alkylthiophene); PAT), a polyparaphenylene derivative (poly(1,4-phenylene); PPP base), a polyfluorene derivative (poly(9,9-dialkylfluorene); PDAF), and a copolymer thereof. As the pendant-type polymer, a vinyl polymer can be given, and a polyvinylcarbazole derivative (PVK) is included, for example.

As the organic solvents that can be used as the composition, a variety of organic solvents such as benzene, toluene, xylene, mesitylene, tetrahydrofuran, dioxane, ethanol, methanol, n-propanol, isopropanol, n-butanol, t-butanol, acetonitrile, dimethylsulfoxide, dimethylformamide, chloroform, methylene chloride, carbon tetrachloride, ethyl acetate, hexane, or cyclohexane can be used. In particular, a low-polarity benzene derivative such as benzene, toluene, xylene, or mesitylene is preferably used, in which case a solution with a suitable concentration can be obtained and a material contained in the composition can be prevented from deteriorating due to oxidation or the like. Furthermore, in light of the uniformity of a formed film or the uniformity of film thickness, the boiling point is preferably 100° C. or higher, and toluene, xylene, or mesitylene is further preferable.

<Material of Layer 4430>

Note that in one embodiment of the present invention, in addition to the light-emitting layer, the layer 4430 may be formed by a wet method. Since the layer 4430 can be shared by pixels, the layer 4430 can be formed by a spin coating method or the like after the formation of the partition wall 110.

In the case where the lower electrode 672 is an anode, the layer 4430 preferably contains the skeleton having a high hole-transport property and a material exhibiting an acceptor property at the same time. In the case where the layer 4430 is formed by a wet method, examples of the material exhibiting an acceptor property include a sulfonic acid compound, a fluorine compound, a trifluoroacetic acid compound, a propionic acid compound, and a metal oxide.

In the case where the layer 4430 is formed by a wet method, when a solution is applied in which a monomer is mixed, a secondary amine and arylsulfonic acid are preferably used as the monomer.

As a secondary amine, a substituted or unsubstituted aryl group having 6 to 14 carbon atoms and a substituted or unsubstituted π-electron rich type heteroaryl group having 6 to 12 carbon atoms can be used. As an aryl group, for example, a phenyl group, a biphenyl group, a naphthyl group, a fluorenyl group, a phenanthrenyl group, an anthryl group, or the like can be used, and a phenyl group is preferable because it has high solubility and is inexpensive. As a heteroaryl group, a carbazole skeleton, a pyrrole skeleton, a thiophene skeleton, a furan skeleton, an imidazole skeleton, or the like can be used. In addition, a plurality of bondings with an arylamine or a heteroaryl amine are preferably provided because film quality is improved, and oligomers and polymers may be formed. In the case where a plurality of amines are included, part of the amine may be a tertiary amine and the proportion of a secondary amine is preferably higher than the proportion of a tertiary amine. The number of amines is preferably less than or equal to 1000, further preferably less than or equal to 10, and the molecular weight is preferably less than or equal to 100000. Substitution with fluorine is preferable because it improves compatibility with a compound in which fluorine is substituted.

The secondary amine is preferably an organic compound represented by General Formula (G1) below, for example.

[Chemical 1]

(G1)

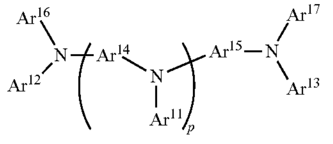

Note that in General Formula (G1) above, one or more of $Ar^{11}$ to $Ar^{11}$ represent hydrogen, $Ar^{14}$ to $Ar^{17}$ represent substituted or unsubstituted aromatic rings each having 6 to 14 carbon atoms, and $Ar^{14}$ to $Ar^{17}$ represent substituted or unsubstituted aromatic rings each having 6 to 14 carbon atoms. Note that $Ar^{12}$ and $Ar^{16}$ may be bonded to each other to form a ring, $Ar^{14}$ and $Ar^{16}$ may be bonded to each other to form a ring, $Ar^{11}$ and $Ar^{14}$ may be bonded to each other to form a ring, $Ar^{14}$ and $Ar^{15}$ may be bonded to each other to form a ring, $Ar^{15}$ and $A^{17}$ may be bonded to each other to form a ring, and $Ar^{13}$ and $Ar^{17}$ may be bonded to each other to form a ring. As the aromatic ring having 6 to 14 carbon atoms, a benzene ring, a bisbenzene ring, a naphthalene ring, a fluorene ring, a phenanthrene ring, an anthracene ring, or the like can be used. Furthermore, p represents an integer of 0 to 1000, and preferably represents 0 to 3. Note that the molecular weight of the organic compound represented by General Formula (G1) above is preferably less than or equal to 100000.

The tertiary amine is preferably an organic compound represented by General Formula (G2) below, for example.

[Chemical 2]

(G2)

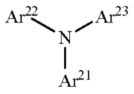

Note that in General Formula (G2) shown above, $Ar^{21}$ to $Ar^{23}$ represent a substituted or unsubstituted aryl groups each having 6 to 14 carbon atoms and may be bonded to each other to form rings. In the case where $Ar^{21}$ to $Ar^{23}$ each include a substituent, the substituent may be a group in which a plurality of diarylamino groups or carbazolyl groups are bonded. An ether bond, a sulfide bond, or a bond via an amine may be included; any of these bonds preferably exists between a plurality of aryl groups, in which case the solubility in an organic solvent is improved. Also when an alkyl group is included as a substituent, the alkyl group may be bonded through an ether bond, a sulfide bond, or a bond via an amine.

As specific examples of the secondary amine, organic compounds represented by Structural Formula (Am2-1) to Structural Formula (Am2-32) below are preferably used. The organic compounds represented by Structural Formula (Am2-1) to Structural Formula (Am2-32) each have an NH group.

[Chemical 3]
(Am2-1)
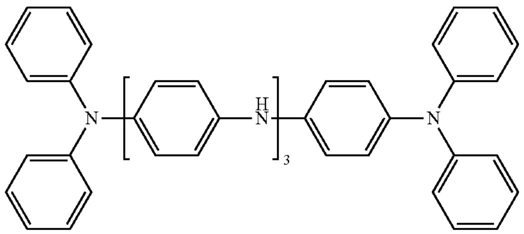
(Am2-2)
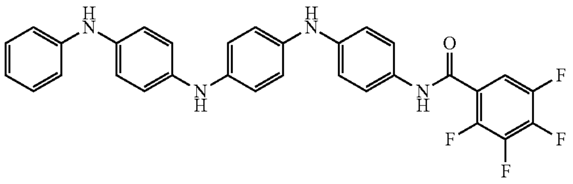
(Am2-3)
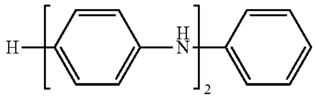
(Am2-4)
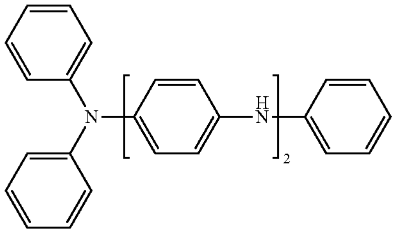
(Am2-5)
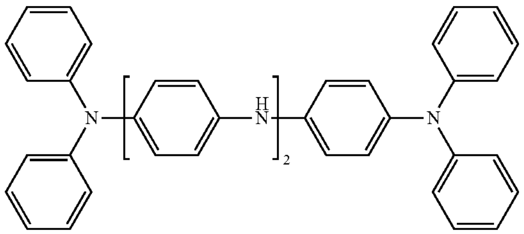
(Am2-6)
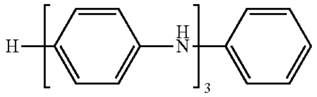
(Am2-7)
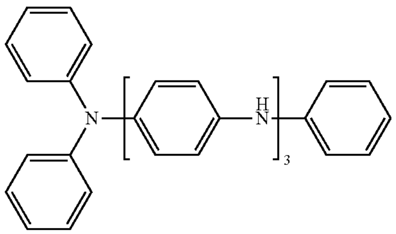
(Am2-8)
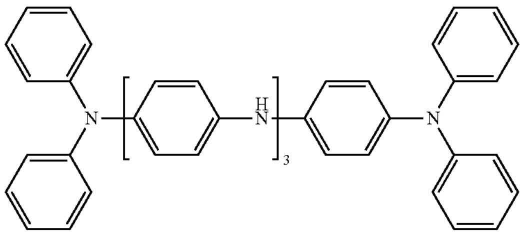
(Am2-9)
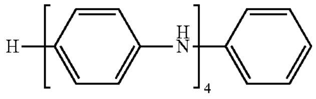
(Am2-10)
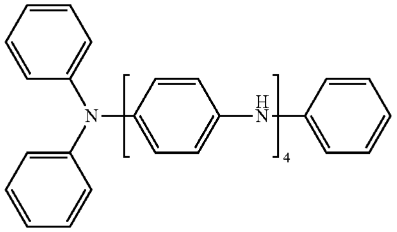
(Am2-11)
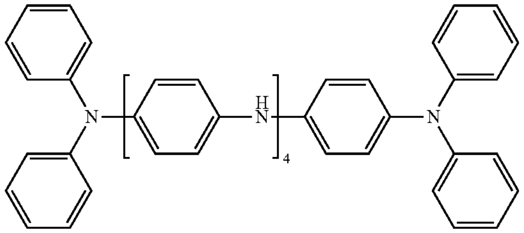

-continued
[Chemical 4]
(Am2-12)
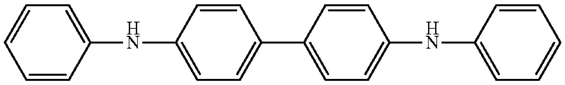
(Am2-13)
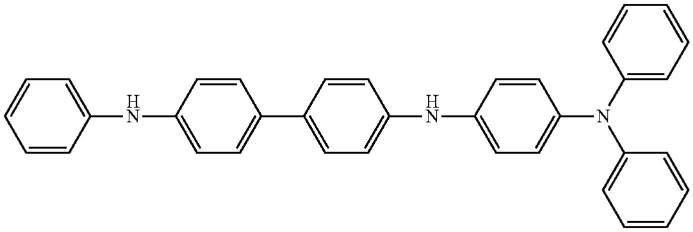
(Am2-14)
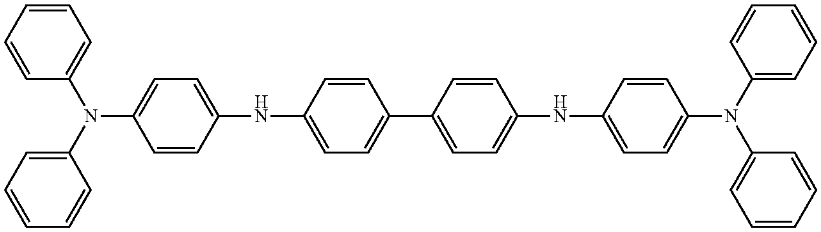
(Am2-15)
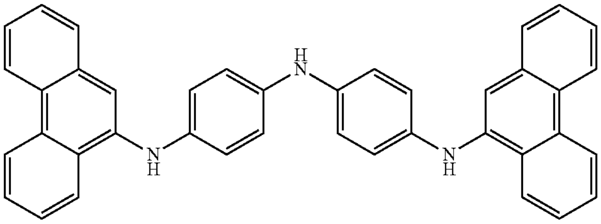
(Am2-16)
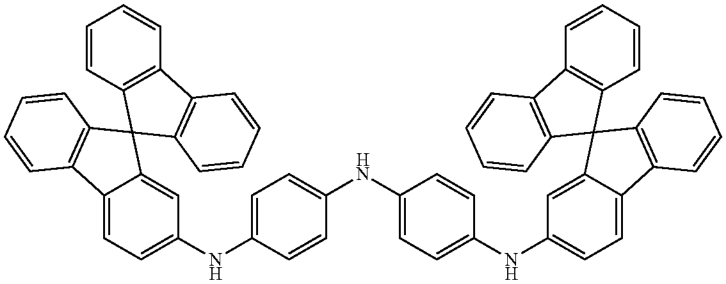
(Am2-17)
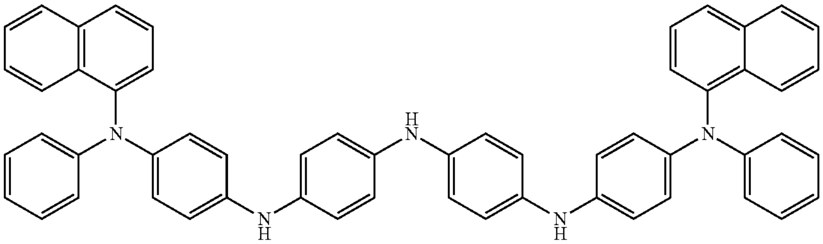
(Am2-18)
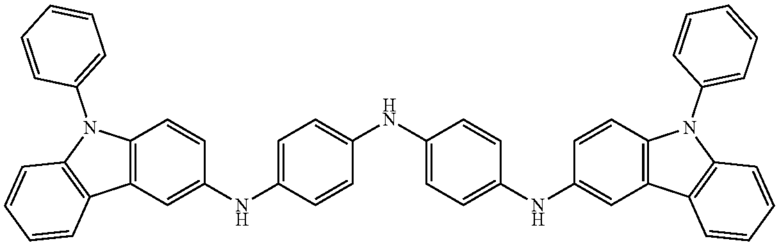

-continued
[Chemical 5]
(Am2-19)
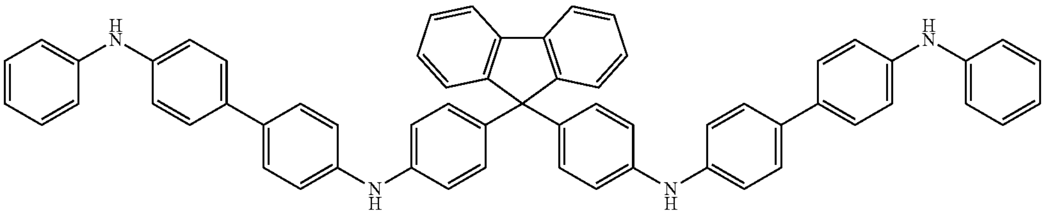
(Am2-20)
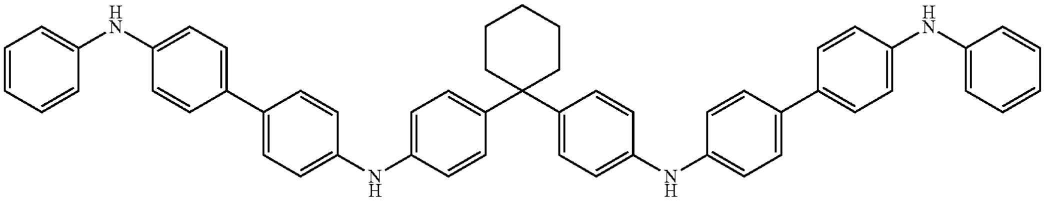
(Am2-21)
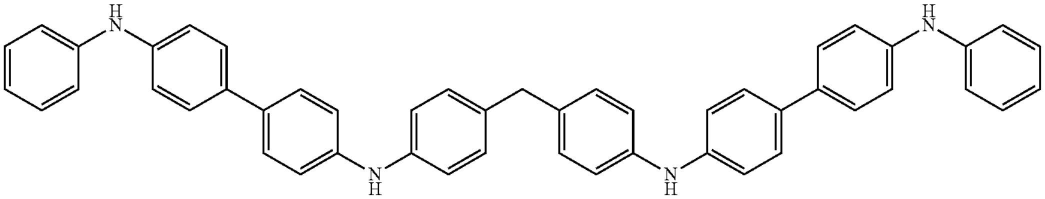
(Am2-22)
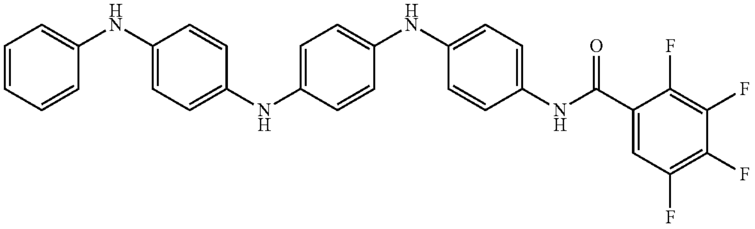
(Am2-23)
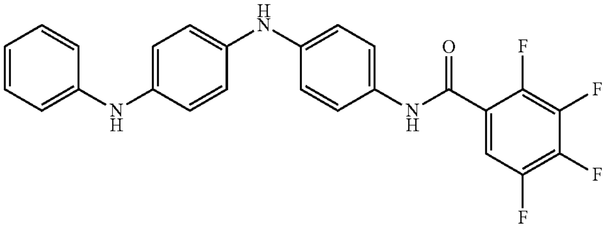
[Chemical 6]
(Am2-24)
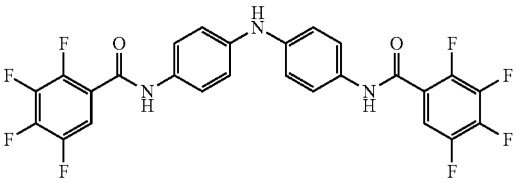
(Am2-25)
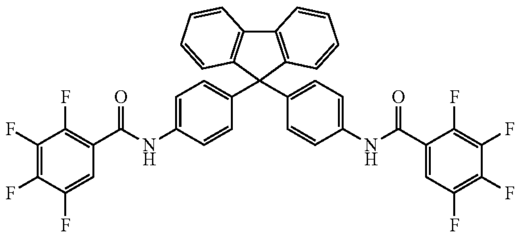

-continued (Am2-26)

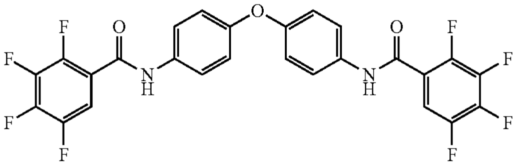

(Am2-27)

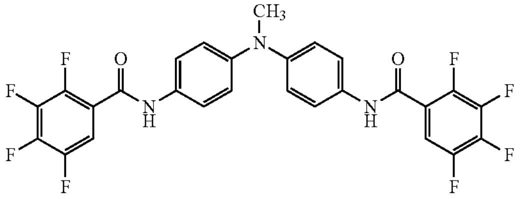

(Am2-28)

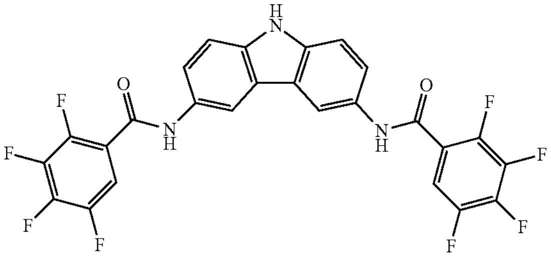

(Am2-29)

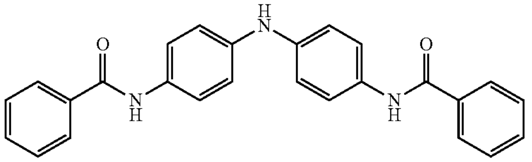

[Chemical 7]

(Am2-30)

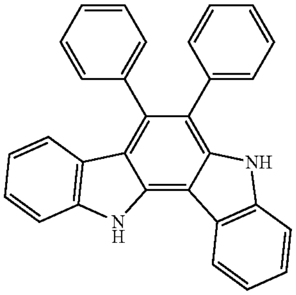

(Am2-31)

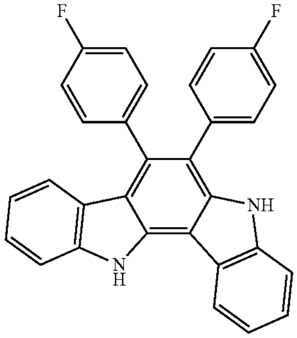

(Am2-32)

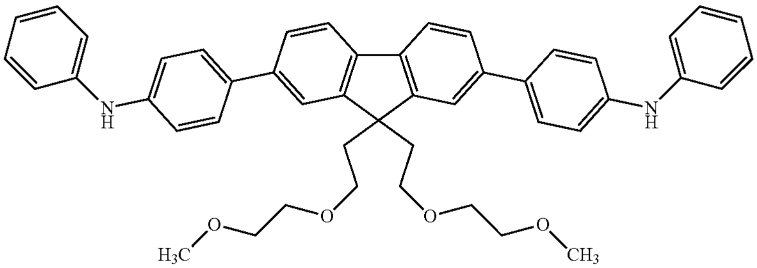

An amine compound can be used for the solution by being mixed with a sulfonic acid compound. Mixing with a sulfonic acid compound facilitates generation of carriers and improves conductivity. Mixing with a sulfonic acid compound is referred to as p doping in some cases. In the case of using the secondary amine as the amine compound, bondings with a mixed sulfonic acid compound can be formed by a dehydration reaction, or the like, which is preferable. In the case where the compound mixed with the amine compound is a fluoride, a fluoride is preferably used as in Structural Formula (Am2-1), Structural Formulae (Am2-22) to (Am2-28), or Structural Formula (Am2-31) shown above to improve compatibility.

Note that a thiophene derivative may be used instead of the secondary amine. Specific examples of a thiophene derivative, organic compounds represented by Structural Formula (T-1) to Structural Formula (T-4) shown below, polythiophene, or poly(3,4-ethylenedioxythiophene) (PEDOT) is preferable. A thiophene derivative facilitates generation of carriers and improves conductivity by being mixed with a sulfonic acid compound. Mixing with a sulfonic acid compound is referred to as p doping in some cases.

[Chemical 8]

(T-1)

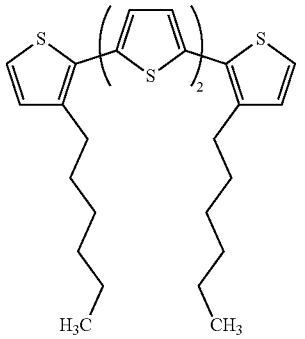

(T-2)

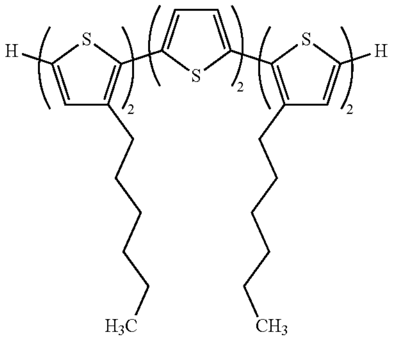

(T-3)

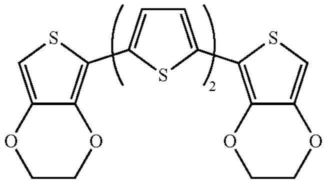

(T-4)

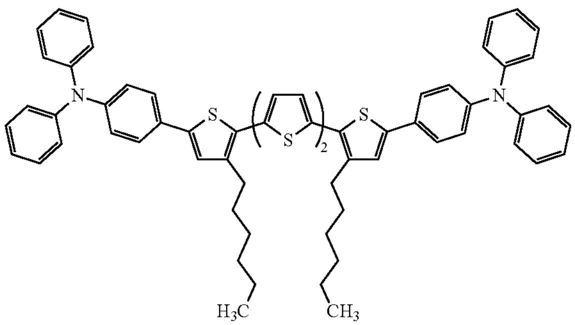

The sulfonic acid compound is a material exhibiting an acceptor property. As a sulfonic acid compound, an arylsulfonic acid can be given. It is only required that the arylsulfonic acid has a sulfo group; a sulfonic acid, a sulfonate, an alkoxysulfonic acid, a halogenated sulfonic acid, or a sulfonic acid anion can be used. Two or more of these sulfo groups may be included. As the aryl group of the arylsulfonic acid, a substituted or unsubstituted aryl group having 6 to 16 carbon atoms can be used. As the aryl group, for example, a phenyl group, a biphenyl group, a naphthyl group, a fluorenyl group, a phenanthrenyl group, an anthryl group, or a pyrenyl group can be used, and a naphthyl group is particularly preferable because it has favorable solubility in an organic solvent and a favorable transport property. The arylsulfonic acid may include two or more of the aryl groups. The arylsulfonic acid preferably includes an aryl group substituted by fluorine because the LUMO level can be adjusted to be deep (in the negative direction widely). The arylsulfonic acid may include an ether bond, a sulfide bond, or a bond via an amine; any of these bonds preferably exists between a plurality of aryl groups, in which case the solubility in an organic solvent is improved. Also when the arylsulfonic acid includes an alkyl group as a substituent, the alkyl group may be bonded through an ether bond, a sulfide bond, or a bond via an amine. The arylsulfonic acid may be substituted in a polymer. Polyethylene, nylon, polystyrene, or polyfluorenylene can be used as the polymer; polystyrene or polyfluorenylene is preferred because of its favorable conductivity.

Specific and preferred examples of compounds including the arylsulfonic acid (arylsulfonic acid compounds) include organic compounds represented by Structural Formula (5-1) to Structural Formula (5-15) below. A polymer having a sulfo group such as poly(4-styrenesulfonic acid) (PSS) can also be used. Electrons from an electron donor with a shallow HOMO (such as an amine compound, a carbazole compound, or a thiophene compound) can be accepted by using an arylsulfonic acid compound, and the property of hole injection or hole transport from an electrode can be obtained by mixing with an electron donor. When the arylsulfonic acid compound is a fluorine compound, the LUMO level can be adjusted to be deeper (the energy level can be higher in the negative direction).

[Chemical 9]

(S-1)

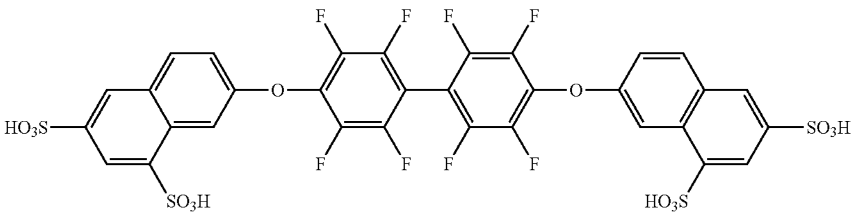

-continued
(S-2)
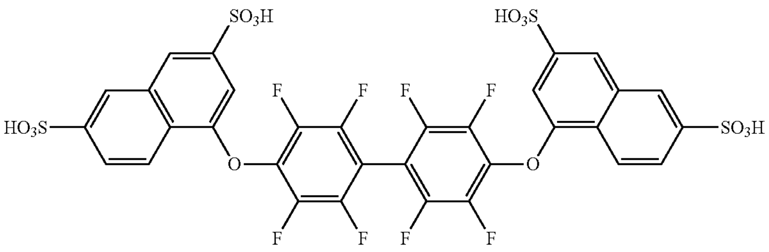
(S-3)
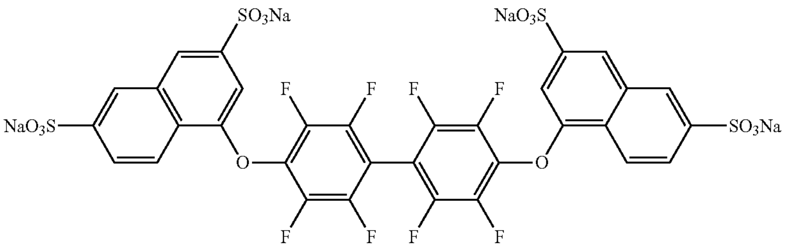
(S-4)
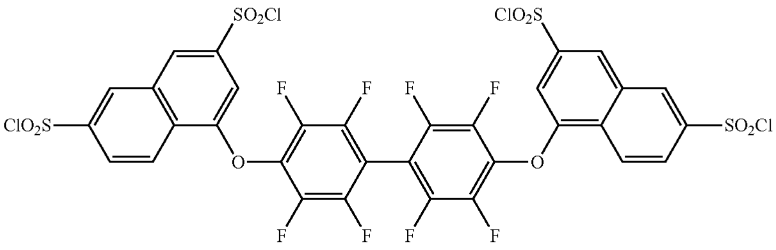
(S-5)
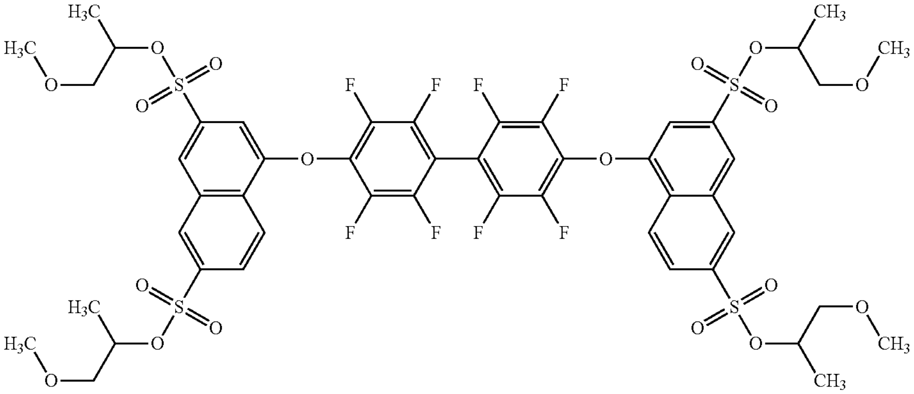
[Chemical 10]
(S-6)
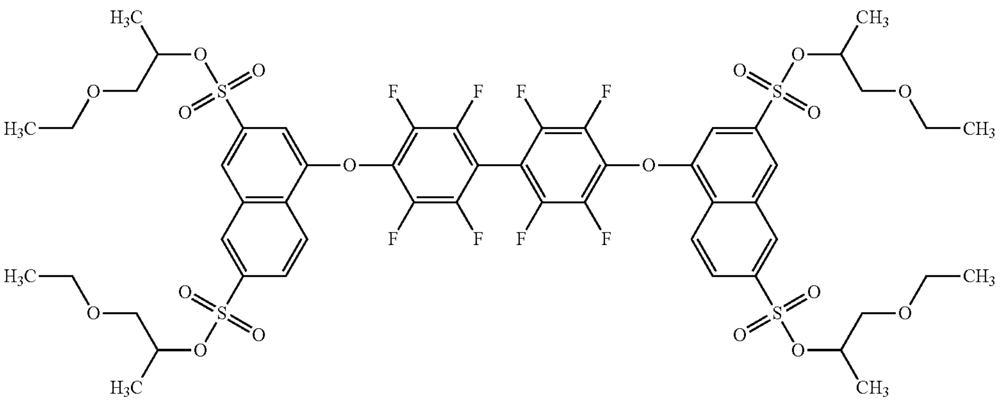

-continued
(S-7)
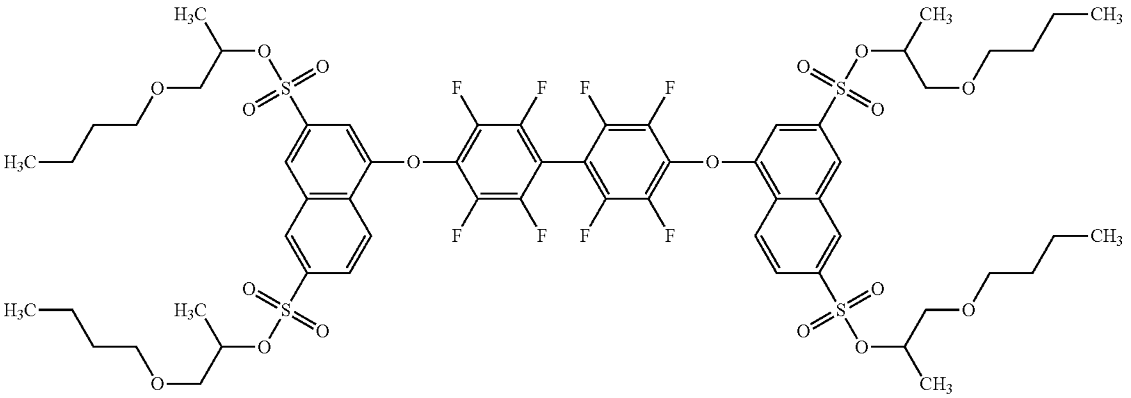
(S-8)
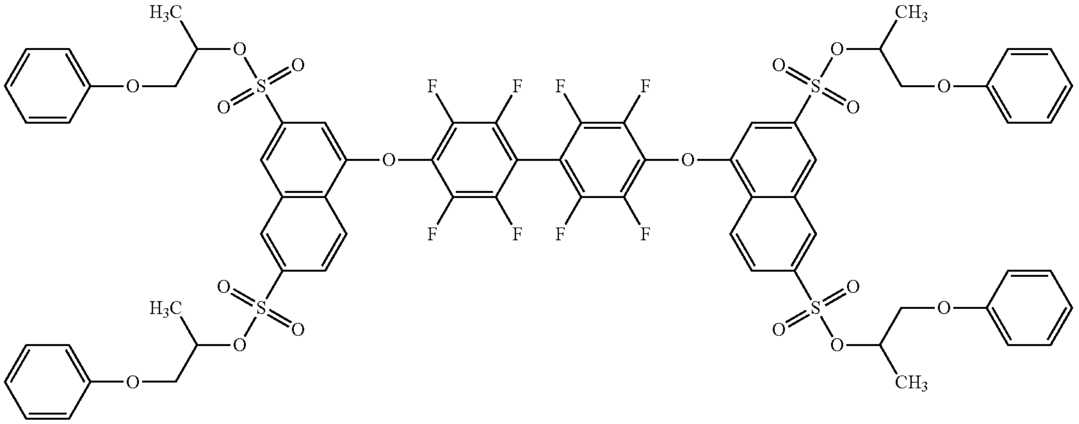
(S-9)
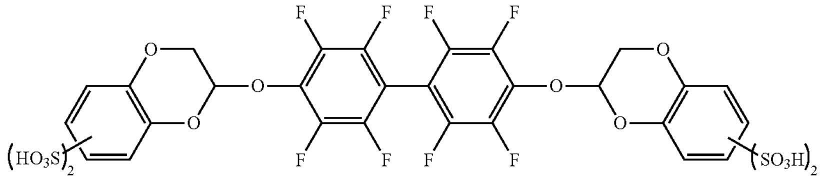
[Chemical 11]
(S-10)
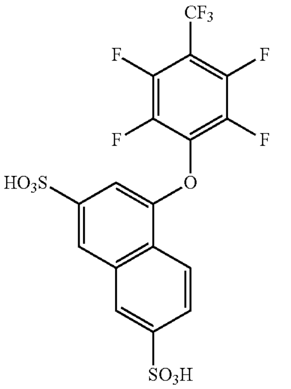
(S-11)
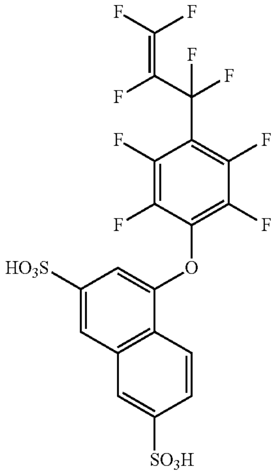

-continued (S-12)

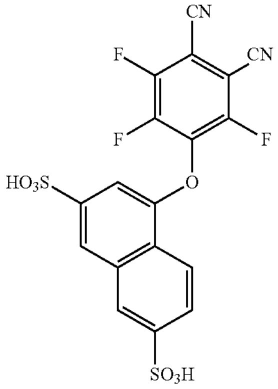

(S-13)

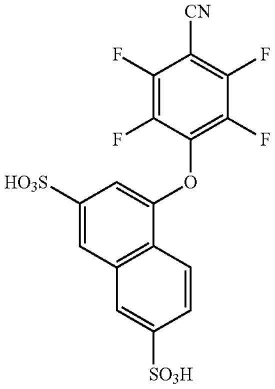

[Chemical 12]

(S-14)

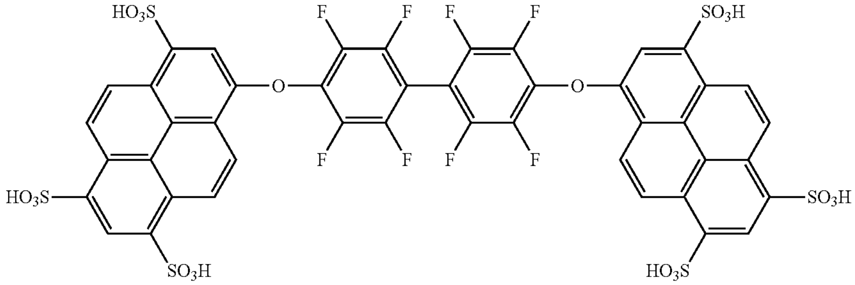

(S-15)

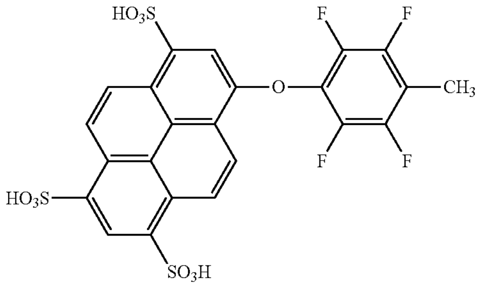

A tertiary amine may further be mixed into the solution in which a secondary amine and sulfonic acid are mixed. A tertiary amine is electrochemically and photochemically stable as compared to a secondary amine and thereby enables a favorable hole-transport property when mixed. As the tertiary amine, for example, organic compounds represented by Structural Formula (Am3-1) to Structural Formula (Am3-7) shown below are preferable. A material having a hole-transport property other than a tertiary amine may be mixed as appropriate into the solution.

[Chemical 13]
(Am3-1)
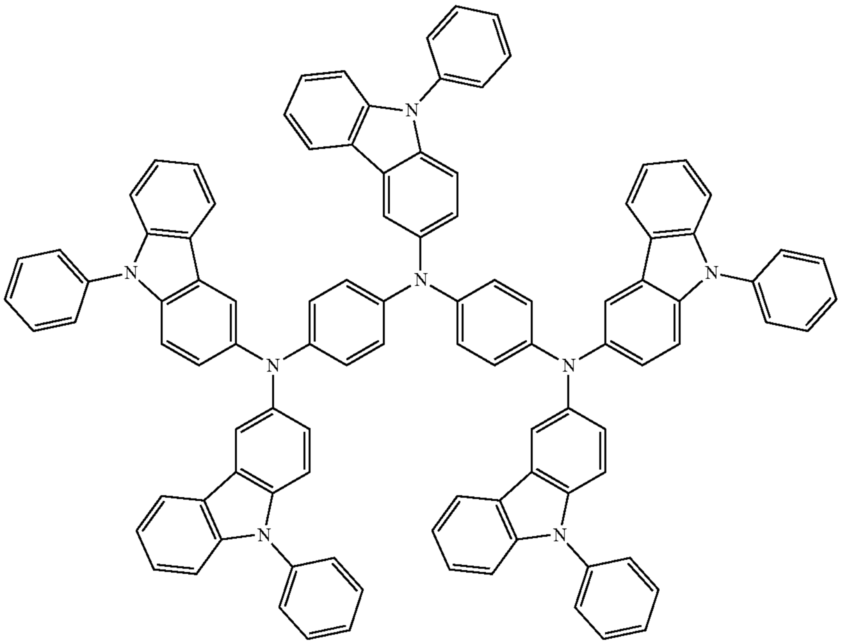
(Am3-2)
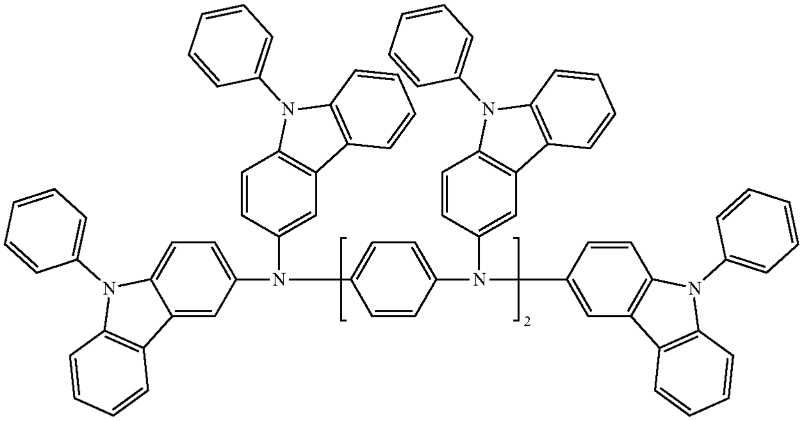

-continued

[Chemical 14]

(Am3-1)

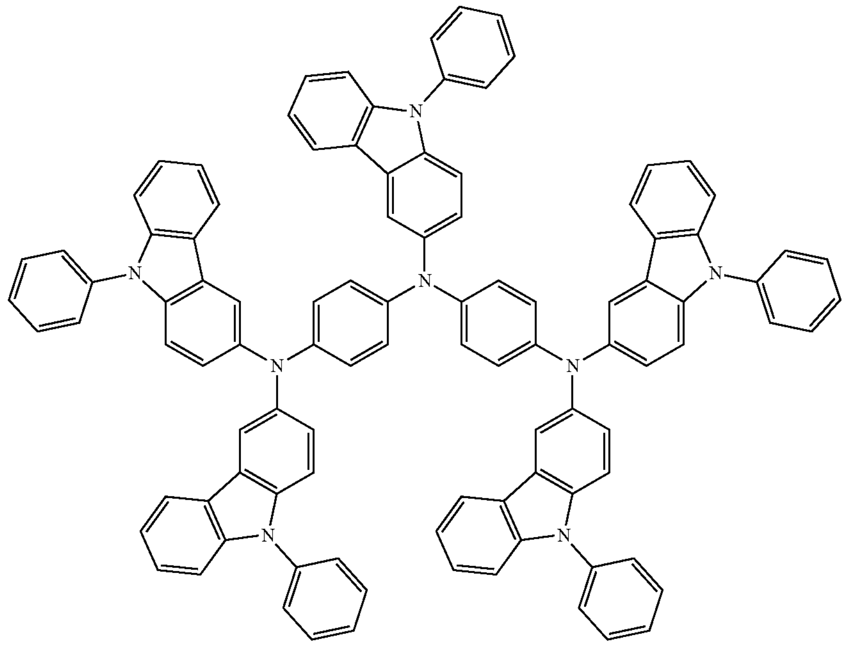

(Am3-2)

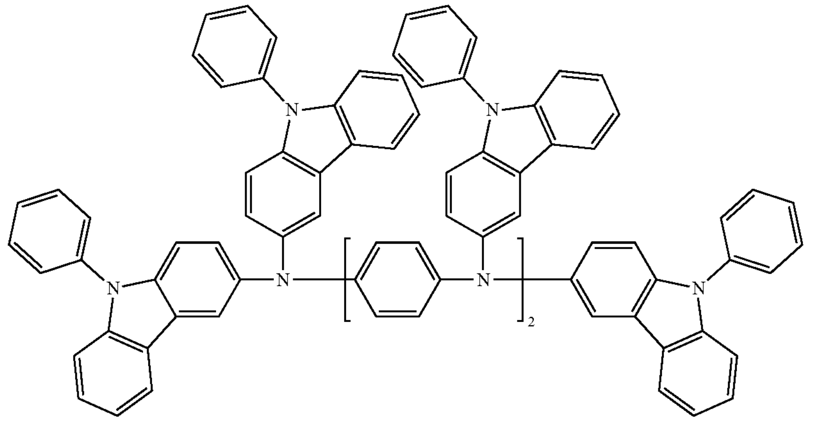

Other than the arylsulfonic acid compound, a cyano compound such as a tetracyanoquinodimethane compound can be used as an electron acceptor. Specifically, 2,3,5,6-tetrafluoro-7,7,8,8-tetracyano-quinodimethane (F4TCNQ), dipyrazino[2,3-f2',3'-h]quinoxaline-2,3,6,7,10,11-hexacarbonitrile (HAT-CN6), or the like can be given.

Note that a solution in which a monomer described above is mixed preferably includes one or both of a 3,3,3-trifluoropropyltrimethoxysilane compound and a phenyltrimethoxysilane compound because the wettability can be improved when deposited in a wet method.

When a layer deposited by a wet method with the solution including at least two monomers of an electron donor such as the secondary amine or thiophene and arylsulfonic acid is measured by ToF-SIMS, a signal is observed at around m/z=80 in a negative-mode result. The m/z=80 corresponds to a signal derived from an $SO_3$ anion in arylsulfonic acid. By contrast, a signal derived from an amine monomer is less likely to be observed from the above layer. Meanwhile, sufficient light emission by the light-emitting device including the layer gives evidence that the layer has a sufficient hole-transport property. If a light-emitting device capable of light emission shows the analysis results including the signal and the like described above, the layer is found to have a sufficient hole-transport property, and the absence of the observed skeletons having a hole-transport property such as an amine suggests that the monomers are bonded to each other to form a high molecular weight compound film. These analysis results mean that the layer is formed by a wet method.

A sulfonic acid compound represented by Structural Formula (S-1) or (S-2) shown above is preferable because the sulfonic acid compound has many sulfo groups and a three-dimensional bonding with an amine compound can be formed, so that film quality is likely to be stable. With the layer formed by using an arylsulfonic acid compound, a signal at m/z=901 can be observed in a negative mode in addition to the above signal of m/z=80. In addition, a signal at around m/z=328 can be observed as a product ion.

<Light-Emitting Material>

Note that in the light-emitting device of one embodiment of the present invention, it is preferable that the iridium complex represented by a structural formula shown below be used as a light-emitting material. The iridium complex shown below and having an alkyl group is preferable because it can easily be dissolved in an organic solvent and a solution is easily adjusted.

[Chemical 15]

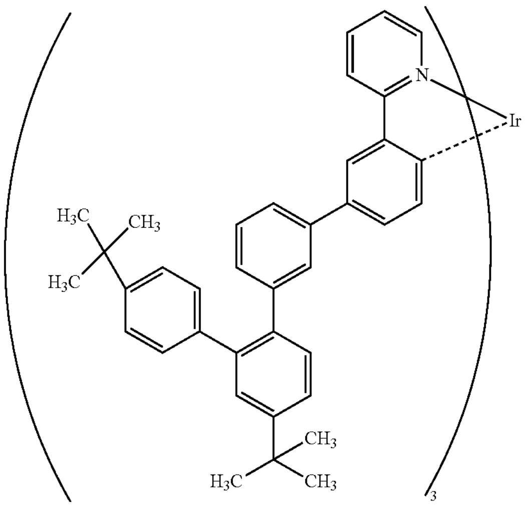

When the light-emitting layer containing the iridium complex represented by the above structural formula is measured by ToF-SIMS, it has been found that a signal appears at m/z=1676, or m/z=1181 and m/z=685 each of which corresponds to a product ion, in the result of a positive mode.

In the case where the intermediate layer is a single layer as in FIG. 13D1, the intermediate layer contains an acceptor material and a donor material. In the case where the intermediate layer includes two layers as in FIG. 13D2, the intermediate layer preferably includes an organic compound layer containing an acceptor material and an organic compound layer containing a donor material.

The organic compound layer containing an acceptor material is preferably formed with the composite material given as a material that can be used for the hole-injection layer or the hole-transport layer.

The acceptor material is a material that allows holes to be generated in another organic compound whose HOMO level value is close to the LUMO level value of the acceptor material when charge separation is caused between the acceptor material and the organic compound. For example, as the organic acceptor material, a compound having an electron-withdrawing group (a halogen group or a cyano group), such as a quinodimethane derivative, a chloranil derivative, or a hexaazatriphenylene derivative, can be used. For example, it is possible to use 7,7,8,8-tetracyano-2,3,5,6-tetrafluoroquinodimethane (abbreviation: F4-TCNQ), 3,6-difluoro-2,5,7,7,8,8-hexacyanoquinodimethane, chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), or 2-(7-dicyanomethylen-1,3,4,5,6,8,9,10-octafluoro-7H-pyren-2-ylidene)malononitrile. Note that among organic acceptor materials, a compound in which electron-withdrawing groups are bonded to fused aromatic rings each having a plurality of heteroatoms, such as HAT-CN, is particularly preferred because it has a high acceptor property and stable film quality against heat. In addition, a [3]radialene derivative having an electron-withdrawing group (in particular, a cyano group or a halogen group such as a fluoro group) has a very high electron-accepting property and thus is preferable. Specific examples include α,α',α"-1,2,3-cyclopropanetriylidenetris [4-cyano-2,3,5,6-tetrafluorob enzeneacetonitrile], α, α', α"-1,2,3-cyclopropanetriylidenetris [2,6-dichloro-3,5-difluoro-4-(trifluoromethyl)benzeneacetonitrile], and α,α',α"-1,2,3-cyclopropanetriylidenetris [2,3,4,5,6-pentafluorob enzeneacetonitrile].

A substance with a high electron-injection property, such as alkali metal, alkaline earth metal, rare earth metal, or a compound thereof, can be used as the donor material. Examples of an alkali metal compound that is used as the compound include oxide such as lithium oxide and halide, and the alkali metal compound also includes carbonate such as lithium carbonate or cesium carbonate. Examples of an alkaline earth metal compound that is used as the compound include oxide, halide, and carbonate, and examples of a rare earth metal compound include oxide, halide, and carbonate.

The organic compound layer containing a donor material can be formed with the same material as the material for the electron-transport layer or the electron-injection layer.

This embodiment can be implemented in combination with the other embodiments described in this specification and the like as appropriate. For example, part of the structure described in this embodiment may be implemented in combination with the other embodiments described in this specification and the like as appropriate.

Embodiment 6

In this embodiment, a structure example of a pixel circuit of one embodiment of the present invention and a driving method example of the pixel circuit are described.

Structure Example 1 of Pixel Circuit

Figure 25A:
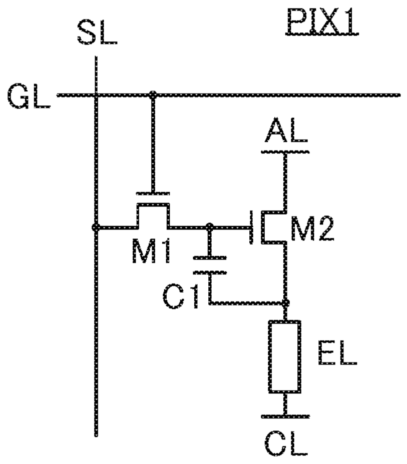
FIG. 25A to FIG. 25D are circuit diagrams illustrating pixel circuits of embodiments of the present invention.

A pixel circuit PIX1 illustrated in FIG. 25A includes a transistor M1, a transistor M2, a capacitor C1, and a light-emitting device EL. A wiring SL, a wiring GL, a wiring AL, and a wiring CL are electrically connected to the pixel circuit PIX1.

In the transistor M1, a gate is electrically connected to the wiring GL, one of a source and a drain is electrically connected to the wiring SL, and the other thereof is electrically connected to a gate of the transistor M2 and one electrode of the capacitor C1. One of a source and a drain of the transistor M2 is electrically connected to the wiring AL and the other of the source and the drain of the transistor M2 is electrically connected to an anode of the light-emitting device EL. The other electrode of the capacitor C1 is electrically connected to the anode of the light-emitting device EL. A cathode of the light-emitting device EL is electrically connected to a wiring CL.

The transistor M1 can also be referred to as a selection transistor and functions as a switch for controlling selection/non-selection of the pixel. Although an LTPS transistor, an OS transistor, or the like described in the above embodiments can be used as the transistor M1, an OS transistor is preferably used.

The transistor M2 can be referred to as a driving transistor and has a function of controlling a current flowing through the light-emitting device EL. Although an LTPS transistor, an OS transistor, or the like described in the above embodiments can be used as the transistor M2, an LTPS transistor is preferably used.

The capacitor C1 functions as a storage capacitor and has a function of retaining a gate potential of the transistor M2. A capacitor such as a MIM capacitor may be used as the capacitor C1; alternatively, capacitance between wirings, a gate capacitance of the transistor, or the like may be used as the capacitor C1.

The wiring SL is supplied with a source signal. The wiring SL can be formed with the same conductive layer as the conductive layer functioning as a source or a drain of a transistor. The wiring GL is supplied with a gate signal. The wiring GL can be formed with the same conductive layer as a conductive layer G functioning as a gate of a transistor. The wiring AL and the wiring CL are each supplied with a constant potential. Each of the wiring AL and the wiring CL can be formed with the conductive layer or the conductive layer G, or the conductive layer and the conductive layer G. Each of the wiring AL and the wiring CL can be formed with the same conductive layer as the conductive layer or the same conductive layer as the conductive layer G.

An anode side of the light-emitting device EL can have a high potential and a cathode side thereof can have a lower potential than the anode side, and thus the anode can correspond to a positive electrode and the cathode can correspond to a negative electrode.

Figure 25B:
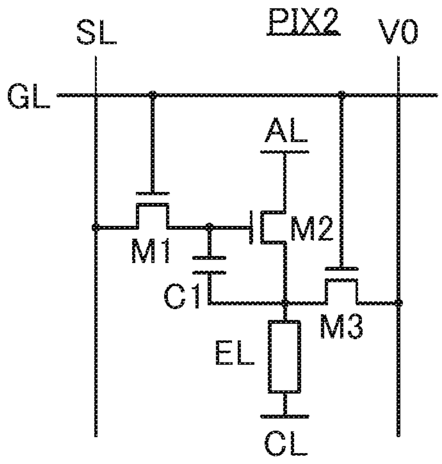

A pixel circuit PIX2 illustrated in FIG. 25B has a structure in which a transistor M3 is added to the pixel circuit PIX1. In addition, a wiring V0 is electrically connected to the pixel circuit PIX2. The LTPS transistor described in the above embodiment, an OS transistor, or the like can be used as the transistor M3, and the LTPS transistor is preferably used.

A gate of the transistor M3 is electrically connected to the wiring GL, one of a source and a drain of the transistor M3 is electrically connected to the anode of the light-emitting device EL, and the other of the source and the drain of the transistor M3 is electrically connected to the wiring V0.

The wiring V0 is supplied with a constant potential when data is written to the pixel circuit PIX2. Thus, a variation in the gate-source voltage of the transistor M2 can be inhibited.

Figure 25C:
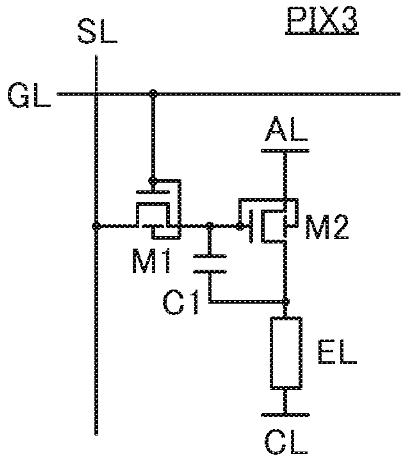
Figure 25D:
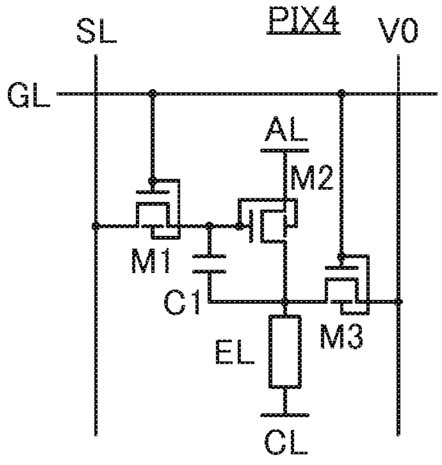

A pixel circuit PIX3 illustrated in FIG. 25C is an example in the case where a transistor in which a pair of gates are electrically connected to each other is used as each of the transistor M1 and the transistor M2 of the pixel circuit PIX1. A pixel circuit PIX4 illustrated in FIG. 25D is an example in the case where a transistor in which a pair of gates are electrically connected to each other is used in the pixel circuit PIX2. Thus, the current that can flow through the transistor can be increased. Note that although a transistor with a pair of gates being electrically connected to each other is used for each of the transistors here, one embodiment of the present invention is not limited thereto. A transistor that includes a pair of gates electrically connected to different wirings may be used. When, for example, a transistor in which one of the gates is electrically connected to the source is used, the reliability can be increased.

Figure 26A:
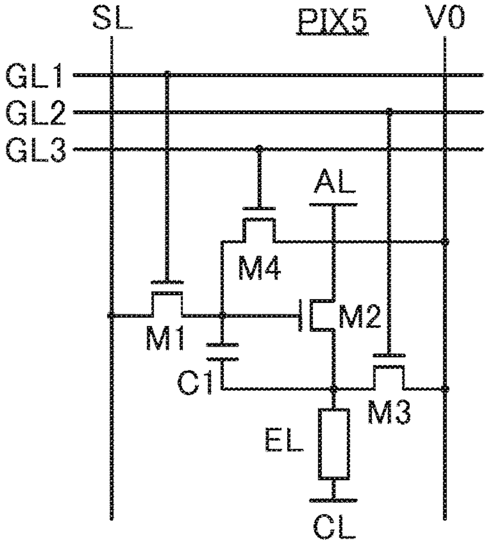
FIG. 26A to FIG. 26D are circuit diagrams illustrating pixel circuits of embodiments of the present invention.

A pixel circuit PIX5 illustrated in FIG. 26A has a structure in which a transistor M4 is added to the pixel circuit PIX2. Three wirings (a wiring GL1, a wiring GL2, and a wiring GL3) functioning as gate lines are electrically connected to the pixel circuit PIX5. The LTPS transistor described in the above embodiment, an OS transistor, or the like can be used as the transistor M4, and the LTPS transistor is preferably used.

A gate of the transistor M4 is electrically connected to the wiring GL3, one of a source and a drain of the transistor M4 is electrically connected to the gate of the transistor M2, and the other thereof is electrically connected to the wiring V0. A gate of the transistor M1 is electrically connected to the wiring GL1, and the gate of the transistor M3 is electrically connected to the wiring GL2. The wiring V0 can be formed with the same conductive layer as the conductive layer or the conductive layer G or can be formed with both the conductive layers. The wiring V0 is placed to intersect with the wiring AL in some cases.

When the transistor M3 and the transistor M4 are turned on at the same time, the source and the gate of the transistor M2 have the same potential, so that the transistor M2 can be turned off. Thus, a current flowing through the light-emitting device EL can be blocked forcibly. Such a pixel circuit is suitable for the case of using a display method in which a display period and an off period are alternately provided.

Figure 26B:
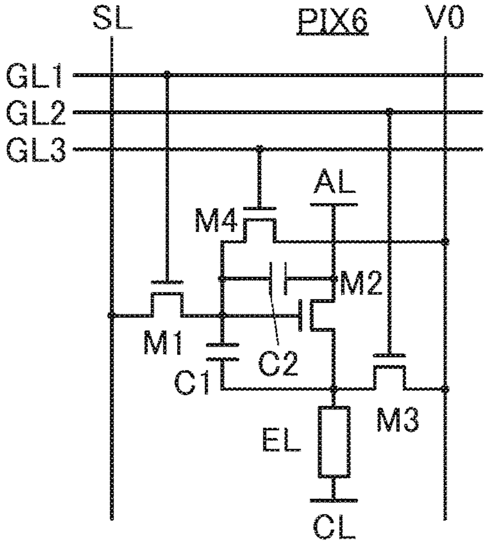

A pixel circuit PIX6 illustrated in FIG. 26B is an example in the case where a capacitor C2 is added to the pixel circuit PIX5. The capacitor C2 functions as a storage capacitor.

Figure 26C:
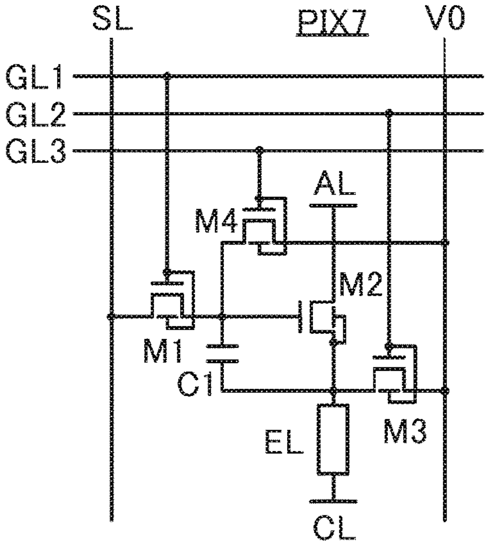
Figure 26D:
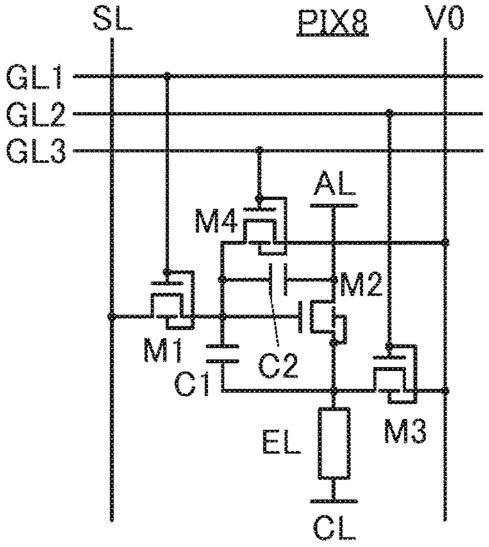

A pixel circuit PIX7 illustrated in FIG. 26C and a pixel circuit PIX8 illustrated in FIG. 26D are each an example in the case where a transistor including a pair of gates is used in the pixel circuit PIX5 or the pixel circuit PIX6. A transistor in which a pair of gates are electrically connected to each other is used as each of the transistor M1, the transistor M3, and the transistor M4, and a transistor in which one of gates is electrically connected to a source is used as the transistor M2.

Structure Example 2 of Pixel Circuit

Figure 27A:
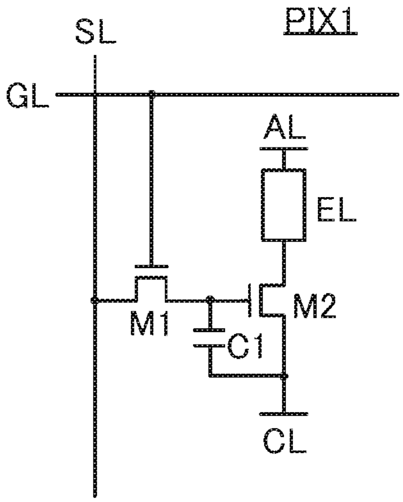
FIG. 27A and FIG. 27B are circuit diagrams illustrating pixel circuits of embodiments of the present invention.

The pixel circuit PIX1 illustrated in FIG. 27A includes the transistor M1, the transistor M2, the capacitor C1, and the light-emitting device EL. The wiring SL, the wiring GL, the wiring AL, and the wiring CL are electrically connected to the pixel circuit PIX1.

In the transistor M1, a gate is electrically connected to the wiring GL, one of a source and a drain is electrically connected to the wiring SL, and the other thereof is electrically connected to the gate of the transistor M2 and the one electrode of the capacitor C1. The one of a source and a drain of the transistor M2 is electrically connected to the wiring CL and the other thereof is electrically connected to the cathode of the light-emitting device EL. The other electrode of the capacitor C1 is electrically connected to the other of the source and the drain of the transistor M2. The anode of the light-emitting device EL is electrically connected to the wiring AL.

The transistor M1 can be referred to as a selection transistor and functions as a switch for controlling selection/non-selection of the pixel. The transistor M2 can be referred to as a driving transistor and has a function of controlling a current flowing through the light-emitting device EL. The transistor M2 is a driver element. The capacitor C1 functions as a storage capacitor and has a function of retaining a gate potential of the transistor M2. A capacitor such as a MIM capacitor may be used as the capacitor C1; alternatively, capacitance between wirings, a gate capacitance of the transistor, or the like may be used as the capacitor C1.

The wiring SL is supplied with a source signal. The wiring SL can be formed with the same conductive layer as the conductive layer functioning as a source or a drain of a transistor. The wiring GL is supplied with a gate signal. The wiring GL can be formed with the same conductive layer as a conductive layer G functioning as a gate of a transistor. The wiring AL and the wiring CL are each supplied with a constant potential. Each of the wiring AL and the wiring CL can be formed with the conductive layer or the conductive layer G, or the conductive layer and the conductive layer G. Each of the wiring AL and the wiring CL can be formed with the same conductive layer as the conductive layer or the same conductive layer as the conductive layer G.

An anode side of the light-emitting device EL can have a high potential and a cathode side thereof can have a lower potential than the anode side, and thus the anode can correspond to a positive electrode and the cathode can correspond to a negative electrode.

Figure 27B:
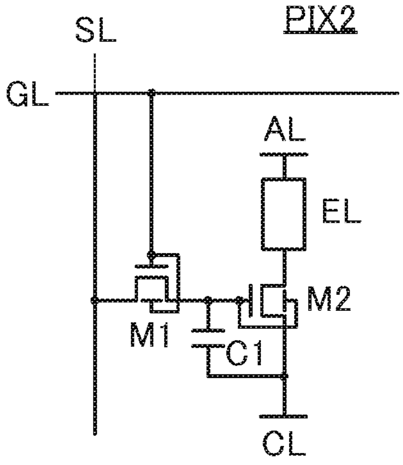

A pixel circuit PIX2 illustrated in FIG. 27B is an example of the case where a transistor in which a pair of gates are electrically connected to each other is used as each of the transistor M1 and the transistor M2 of the pixel circuit PIX1. Thus, the current that can flow through the transistor can be increased. Note that although a transistor in which a pair of gates are electrically connected to each other is used in all the transistors here, one embodiment of the present invention is not limited thereto. A transistor that includes a pair of gates electrically connected to different wirings may be used. When, for example, a transistor in which one of the gates is electrically connected to the source is used, the reliability can be increased.

Figure 28A:
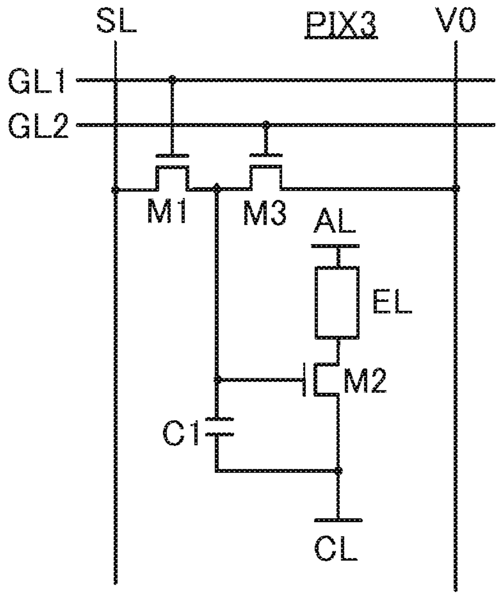
FIG. 28A and FIG. 28B are circuit diagrams illustrating pixel circuits of embodiments of the present invention.

A pixel circuit PIX3 illustrated in FIG. 28A has a structure in which a transistor M3 is added to the pixel circuit PIX1. Two wirings (a wiring GL1 and a wiring GL2) functioning as gate lines are electrically connected to the pixel circuit PIX3.

A gate of the transistor M3 is electrically connected to the wiring GL2, one of a source and a drain of the transistor M3 is electrically connected to the gate of the transistor M2, and the other thereof is electrically connected to the wiring V0. The gate of the transistor M1 is electrically connected to the wiring GL1. The wiring V0 can be formed with the same conductive layer as the conductive layer G or the same conductive layer as the conductive layer G or can be formed with both the conductive layers. The wiring V0 is placed to intersect with the wiring AL in some cases.

When the transistor M3 is turned on, the source and the gate of the transistor M2 have the same potential, so that the transistor M2 can be turned off. Thus, current flowing to the light-emitting device EL can be blocked forcibly. Such a pixel circuit is suitable for the case of using a display method in which a display period and a non-lighting period are alternately provided.

Figure 28B:
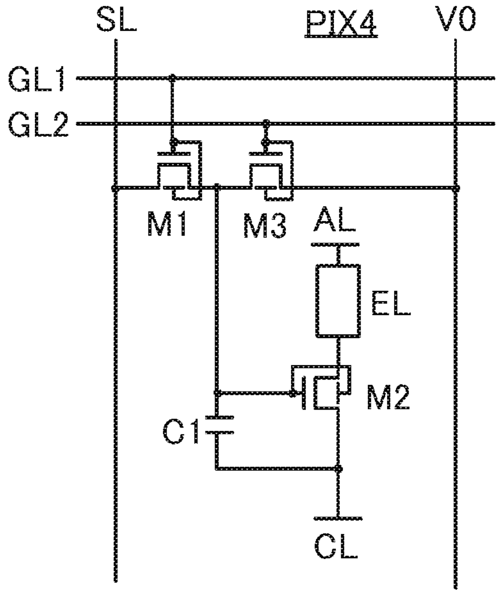

The pixel circuit PIX4 illustrated in FIG. 28B is an example in the case where transistors each including a pair of gates are employed in the pixel circuit PIX3. A transistor whose pair of gates are electrically connected to each other is used as each of the transistor M1, the transistor M2, and the transistor M3.

Driving Method Example

An example of a method for driving a display device in which the pixel circuit PIX5 is used will be described below. Note that a similar driving method can be applied to the pixel circuits PIX6, PIX7, and PIX8

Figure 29:
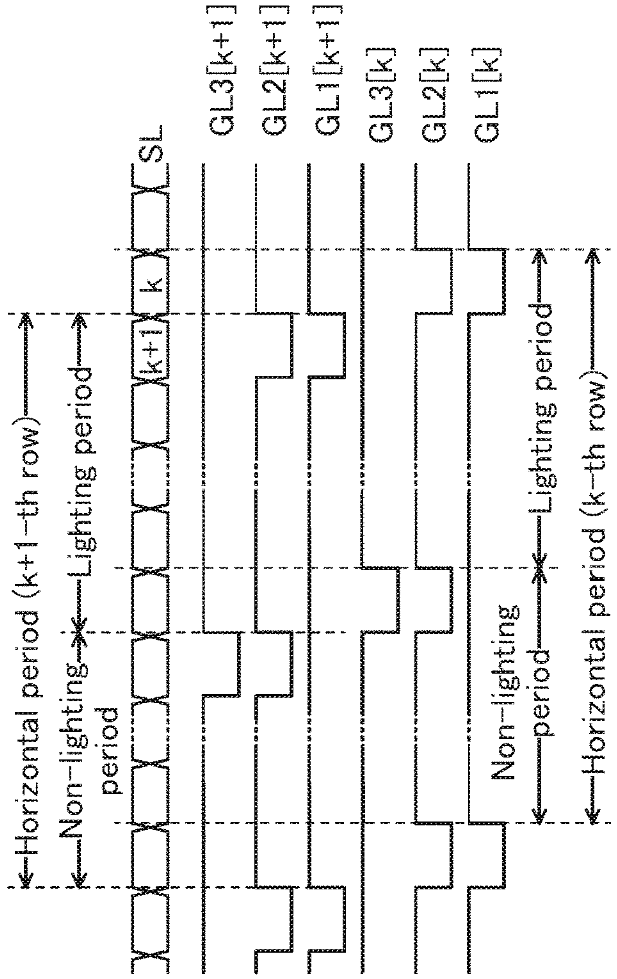
FIG. 29 is a chart showing a method of driving a pixel circuit of one embodiment of the present invention.

FIG. 29 shows a timing chart of a method for driving the display device in which the pixel circuit PIX5 is used. Changes in the potentials of a wiring GL1[k], a wiring GL2[k], and a wiring GL3 [k] that are gate lines of the k-th row and changes in the potentials of a wiring GL1[k+1], a wiring GL2[k+1], and a wiring GL3[k+1] that are gate lines of the k+1-th row are shown here. FIG. 29 also shows the timing of supplying a signal to the wiring SL functioning as a source line.

In the example of the driving method described here, one horizontal period is divided into a lighting period and a non-lighting period. A horizontal period of the k-th row is shifted from a horizontal period of the k+1-th row by a selection period of the gate line.

In the lighting period of the k-th row, first, the wiring GL1[k] and the wiring GL2[k] are supplied with a high-level potential and the wiring SL is supplied with a source signal. Thus, the transistor M1 and the transistor M3 are turned on, so that a potential corresponding to the source signal is written from the wiring SL to the gate of the transistor M2. After that, the wiring GL1[k] and the wiring GL2[k] are supplied with a low-level potential, so that the transistor M1 and the transistor M3 are turned off and the gate potential of the transistor M2 is retained.

Subsequently, in a lighting period of the k+1-th row, data is written by operation similar to that described above.

Next, the non-lighting period is described. In the non-lighting period of the k-th row, the wiring GL2[k] and the wiring GL3 [k] are supplied with a high-level potential. Accordingly, the transistor M3 and the transistor M4 are turned on, and the source and the gate of the transistor M2 are supplied with the same potential, so that almost no current flows through the transistor M2. Therefore, the light-emitting device EL is turned off. As a result, all the pixels that are positioned in the k-th row are turned off. The pixels of the k-th row remain in the off state until the next lighting period.

Subsequently, in a non-lighting period of the k+1-th row, all the pixels of the k+1-th row are turned off in a manner similar to that described above.

Such a driving method described above, in which the pixels are not constantly on through one horizontal period and a non-lighting period is provided in one horizontal period, can be called duty driving. With duty driving, an afterimage phenomenon can be inhibited at the time of displaying moving images; therefore, a display device with high performance in displaying moving images can be achieved. Particularly in a VR device and the like, a reduction in an afterimage can reduce what is called VR sickness.

In the duty driving, the proportion of the lighting period in one horizontal period can be called a duty ratio. For example, a duty ratio of 50% means that the lighting period and the non-lighting period have the same lengths. Note that the duty ratio can be set freely and can be adjusted appropriately within a range higher than 0% and lower than or equal to 100%, for example.

This embodiment can be implemented in combination with the other embodiments described in this specification and the like as appropriate. For example, part of the structure described in this embodiment may be implemented in combination with the other embodiments described in this specification and the like as appropriate.

Embodiment 7

In this embodiment, a display device of one embodiment of the present invention will be described.

The display device in this embodiment can be a high-definition display device or a large-sized display device. Accordingly, the display device in this embodiment can be used for display portions of electronic devices such as a digital camera, a digital video camera, a digital photo frame, a mobile phone, a portable game machine, a smartphone, a watch-type terminal, a tablet terminal, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Device 400A1]

Figure 30:
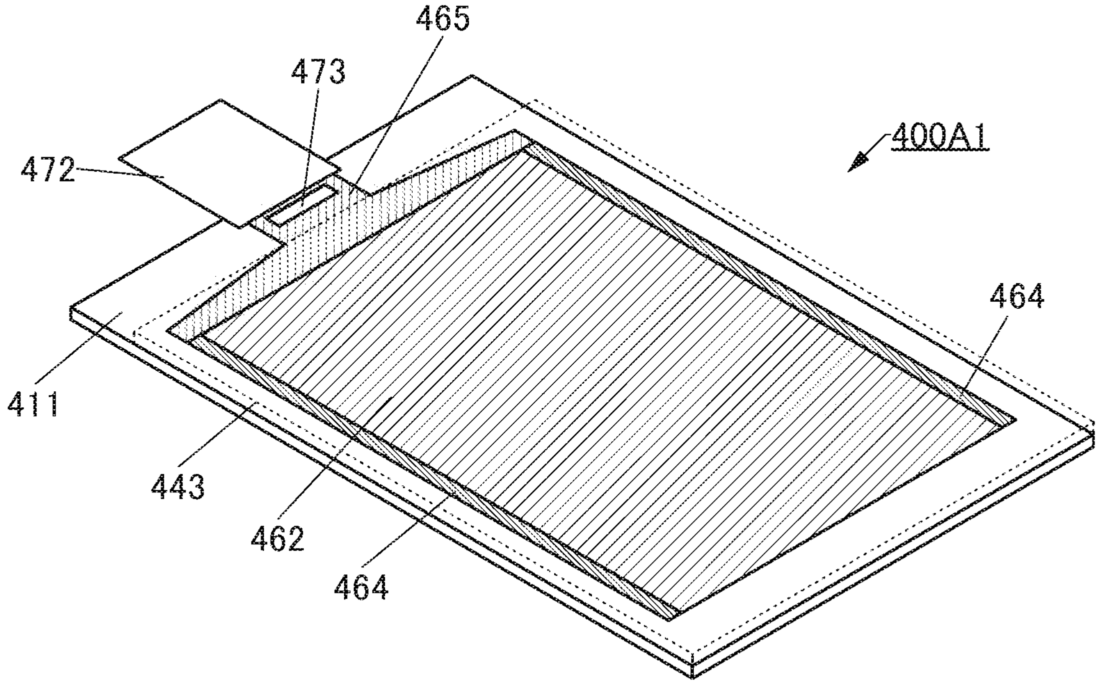
FIG. 30 is a perspective view illustrating a display device of one embodiment of the present invention.
Figures 31A, 31B:
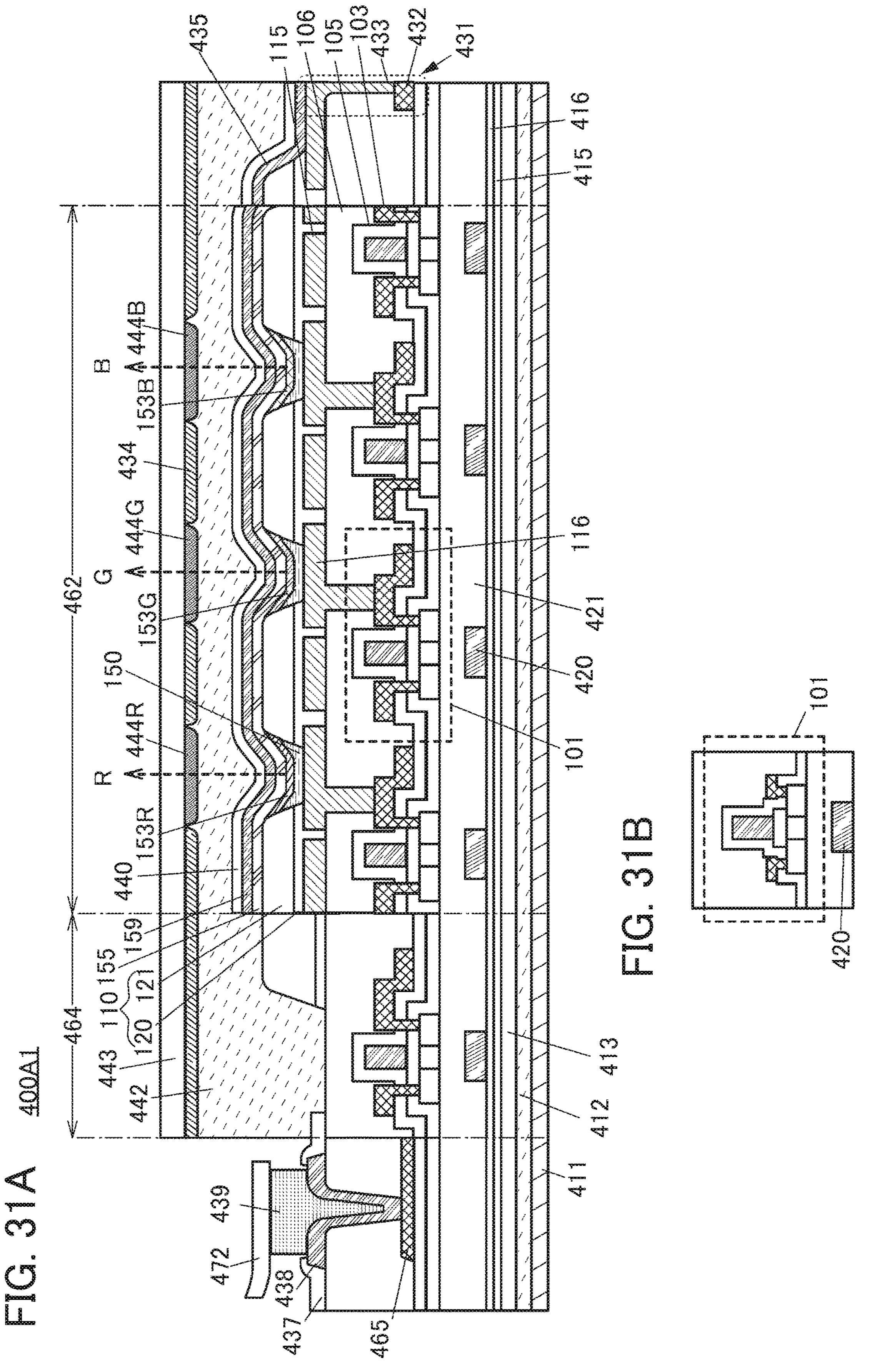
FIG. 31A is a cross-sectional view illustrating a display device of one embodiment of the present invention.
FIG. 31B is a cross-sectional view illustrating a transistor of one embodiment of the present invention.

FIG. 30 is a perspective view of a display device 400A1, and FIG. 31A is a cross-sectional view of the display device 400A1. The display device 400A1 includes a display portion 462, a circuit 464, a wiring 465, and the like. The display portion 462 includes a pixel region. FIG. 30 illustrates an example in which an IC 473 and an FPC 472 are integrated on the display device 400A1. Thus, the structure illustrated in FIG. 30 can be regarded as a display module including the display device 400A1, the IC (integrated circuit), and the FPC.

As the circuit 464, a scan line driver circuit can be used, for example.

The wiring 465 has a function of supplying a signal and electric power to the display portion 462 and the circuit 464. The signal and electric power are input to the wiring 465 from the outside through the FPC 472 or input to the wiring 465 from the IC 473.

FIG. 30 illustrates an example in which the IC 473 is provided by a COG (Chip On Glass) method, a COF (Chip on Film) method, or the like. An IC including a scan line driver circuit, a signal line driver circuit, or the like can be used as the IC 473, for example. Note that the display device 400A1 and the display module are not necessarily provided with an IC.

The cross-sectional view of FIG. 31A includes the FPC 472, the circuit 464, the display portion 462, and end portions of the display device 400A1. The end portions of the display device 400A1 are regions positioned outside the display portion 462. A region where the FPC 472 is attached also corresponds to the end portion. FIG. 31A also illustrates the end portion opposite to the end portion with the FPC 472.

The display device 400A1 has a structure in which a support substrate 411 is bonded to a resin layer 413 with an adhesive layer 412. As the support substrate 411, a glass substrate or a plastic substrate can be used. A structure using a plastic substrate can be lighter than a structure using a glass substrate. An insulating layer 415 and an insulating layer 416 are provided to prevent entry of an impurity element from the adhesive layer 412 or the resin layer 413. The insulating layer 415 and the insulating layer 416 are preferably formed with inorganic materials.

The inorganic materials contained in the insulating layer 415 and the insulating layer 416 preferably contain one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The inorganic material contained in the insulating layer 415 is preferably different from the inorganic material contained in the insulating layer 416.

In FIG. 31A, a counter substrate 443 is bonded to the counter side with an adhesive layer 442. That is, the display device 400A1 has a structure in which the support substrate 411 and the counter substrate 443 are bonded to each other. In FIG. 30, the counter substrate 443 is shown by a dashed line. As the counter substrate 443, a glass substrate or a plastic substrate can be used. A structure using a plastic substrate can be lighter than a structure using a glass substrate.

For the resin layer 413, any of the following can be used: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber.

For each of the adhesive layer 412 and the adhesive layer 442, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. The adhesive layer 412 can be omitted in the case where the resin layer 413 has a sufficient adhesion function.

The adhesive layer 442 on the counter side functions as a sealant for the light-emitting device. Such a sealing structure is referred to as a solid sealing structure. A hollow sealing structure can be used as well as a solid sealing structure. The hollow sealing structure is described later.

The display device 400A1 illustrated in FIG. 31A includes the transistor 101. For the transistor 101, the above embodiments can be referred to. In this embodiment, a back gate 420 is included in addition to the transistor 101. An insulating layer 421 is included over the back gate 420. As in the above embodiments, the back gate 420 is not necessarily included.

The light-emitting device described as an example in the above embodiments is included over the transistor 101, and in this embodiment, an insulating layer 440 is provided over the upper electrode 159. The insulating layer 421 and the insulating layer 440 are preferably formed with inorganic materials. In addition to entry of impurity elements, entry of moisture can be prevented.

The inorganic materials contained in the insulating layer 421 and the insulating layer 440 preferably contain one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 440 preferably has a stacked-layer structure of at least three layers. For the stacked-layer structure of three or more layers, at least two kinds of inorganic materials are preferably used.

The light-emitting device emits light toward the counter substrate 443 side as shown by dashed lines. The structure in which light is emitted toward the counter substrate 443 side is referred to as a top-emission structure. In the case of a top-emission structure, the counter substrate 443 is preferably formed with a material having a high light-transmitting property with respect to visible light.

A color filter layer (also referred to as a coloring layer) is provided on the counter substrate 443 to correspond to the light-emitting layer 153R, the light-emitting layer 153G, and the light-emitting layer 153B. The color filter layer corresponds to emission colors by including a color filter layer 444R capable of exhibiting a red color, a color filter layer 444G capable of exhibiting a green color, and a color filter layer 444B capable of exhibiting a blue color. A light-blocking layer 434 is provided between the color filter layers. The light-blocking layer is also referred to as a black matrix.

The circuit 464 is also provided with the light-blocking layer. A transistor provided in the circuit 464 can be formed with the same material in the same step as the transistor 101 in the display portion 462.

FIG. 31A illustrates a region 431 as the end portion. The end portion is also provided with the light-blocking layer. The region 431 has a structure in which a conductive layer 432, a conductive layer 433, and a conductive layer 435 are in contact with one another, that is, the region 431 is sealed with these layers. The conductive layer 432 includes the same material as the source and the drain 103. The conductive layer 433 includes the same material as the auxiliary electrode 115. The conductive layer 435 includes the same material as the upper electrode 159. Openings are provided in the insulating layers in order that the conductive films may be in contact with one another. For example, an opening is provided in the insulating layer 106 and the conductive layer 432 includes a region in contact with the conductive layer 433 in the opening. An opening is provided in the first insulator 120 and the second insulator 121 and the conductive layer 433 includes a region in contact with the conductive layer 435 in the opening. In the end portion, the insulating layer 440 is provided over the conductive layer 435, and the adhesive layer 442 is provided over the insulating layer 440.

The transistor 101 includes the back gate 420 and employs a structure in which the semiconductor layer is sandwiched between two gates. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the structure of the transistors included in the display device of this embodiment. For example, a planar transistor, a staggered transistor, an inverted staggered transistor, or the like can be used. A top-gate transistor or a bottom-gate transistor can be used. FIG. 31B illustrates the transistor 101 having a structure in which a gate insulating layer goes across the gate and is patterned in a region overlapping with the semiconductor layer and a back gate is included.

There is no particular limitation on the crystallinity of a semiconductor layer used for the transistor 101, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a single crystal semiconductor or a semiconductor having crystallinity, in which case deterioration of the transistor characteristics can be inhibited.

The semiconductor layer in the transistor preferably contains silicon. Examples of silicon include amorphous silicon and crystalline silicon (e.g., low-temperature polysilicon or single crystal silicon). Alternatively, the semiconductor layer preferably contains metal oxide (also referred to as an oxide semiconductor). A transistor including metal oxide in a channel formation region is sometimes referred to as an OS transistor.

The metal oxide preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example, and such a metal oxide is referred to as an In-M-Zn oxide in some cases. Specifically, M is preferably one or more kinds selected from aluminum, gallium, yttrium, and tin.

It is preferable that an oxide containing indium (In), gallium (Ga), and zinc (Zn) (M is Ga and this oxide is referred to as IGZO) be used as the metal oxide.

When the metal oxide is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, InM:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and InM:Zn=5:2:5 or a composition in the neighborhood thereof. Note that a composition in the neighborhood includes the range of ±30% of an intended atomic ratio.

When M=Ga and the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

A connection portion is provided in a region of the support substrate 411 which is exposed from the counter substrate 443. In the connection portion, the wiring 465 is electrically connected to the FPC 472 through a conductive layer 438 and a connection layer 439. The wiring 465 can be formed with the same material as the source and the drain. The conductive layer 438 can be formed with the same material as the upper electrode 159. In the connection portion, an end portion of the conductive layer 438 is covered with an insulating layer 437. The insulating layer 437 can be formed with the same material as the insulating layer 440.

As the connection layer 439, an anisotropic conductive film (ACF), an anisotropic conductive paste (ACP), or the like can be used.

A variety of optical members can be arranged on the outer side of the counter substrate 443. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impactabsorbing layer, or the like may be provided on the outer side of the counter substrate 443.

When a material having flexibility such as a plastic substrate or a thin glass substrate is used for the counter substrate 443, the flexibility of the display device can be increased. A polarizing plate may be used as the counter substrate 443.

As materials for the gates, the source, and the drain of a transistor and conductive layers such as a variety of wirings and electrodes included in the display device, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used.

[Display Device 400B1]

Figure 32:
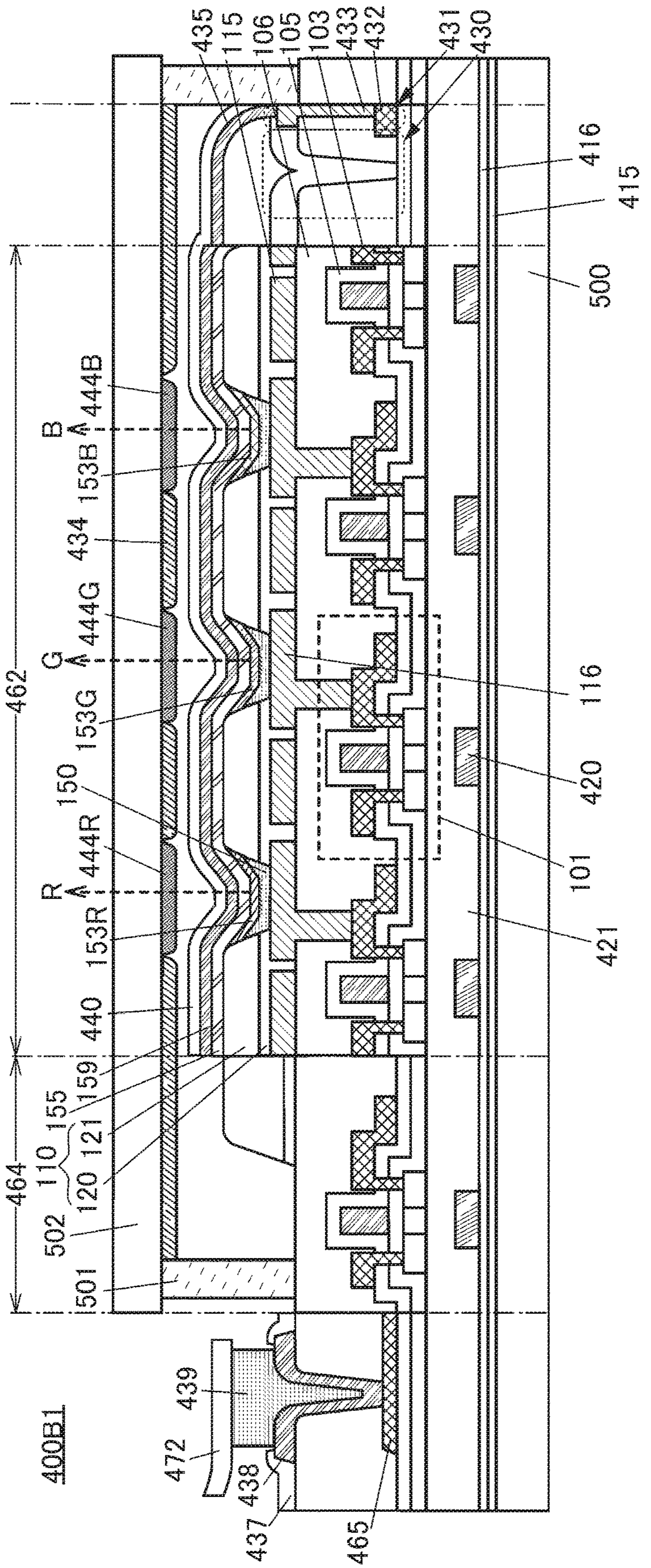
FIG. 32 is a cross-sectional view illustrating a display device of one embodiment of the present invention.

FIG. 32 is a cross-sectional view of a display device 400B1. The cross-sectional view of the display device 400B1 illustrates the case where a hollow sealing structure is employed for the display device 400A1 illustrated in FIG. 32. A substrate 500 and a counter substrate 502 are prepared in order to employ the hollow sealing structure. As the substrate 500 and the counter substrate 502, a glass substrate is preferred than a plastic substrate. A sealing material 501 or the like is provided in the end portion in order to hold the counter substrate 502. A space surrounded by the substrate 500, the sealing material 501, and the counter substrate 502 is filled with an inert gas (e.g., nitrogen or argon).

The end portion of the display device 400B1 illustrated in FIG. 32 is described. The end portion includes a region 430 in addition to the region 431 similar to that in the display device 400A1 illustrated in FIG. 31. An opening is provided in the insulating layer 106 in the region 430. When the insulating layer 106 contains an organic material, the organic material might be a moisture entering path and the light-emitting device might deteriorate; providing the opening can block the moisture entering path. The opening in the insulating layer 106 in the region 430 is preferably filled with a layer containing the same material as the first insulator 120 and the second insulator 121. The opening in the insulating layer 106 may be filled with the same material as the lower electrode 116 or the upper electrode 159. The region 430 is illustrated inside the region 431, but may be outside the region 431.

The other components of the display device 400B1 illustrated in FIG. 32 are similar to those of the display device 400A1 illustrated in FIG. 31.

[Display Device 400C1]

Figure 33:
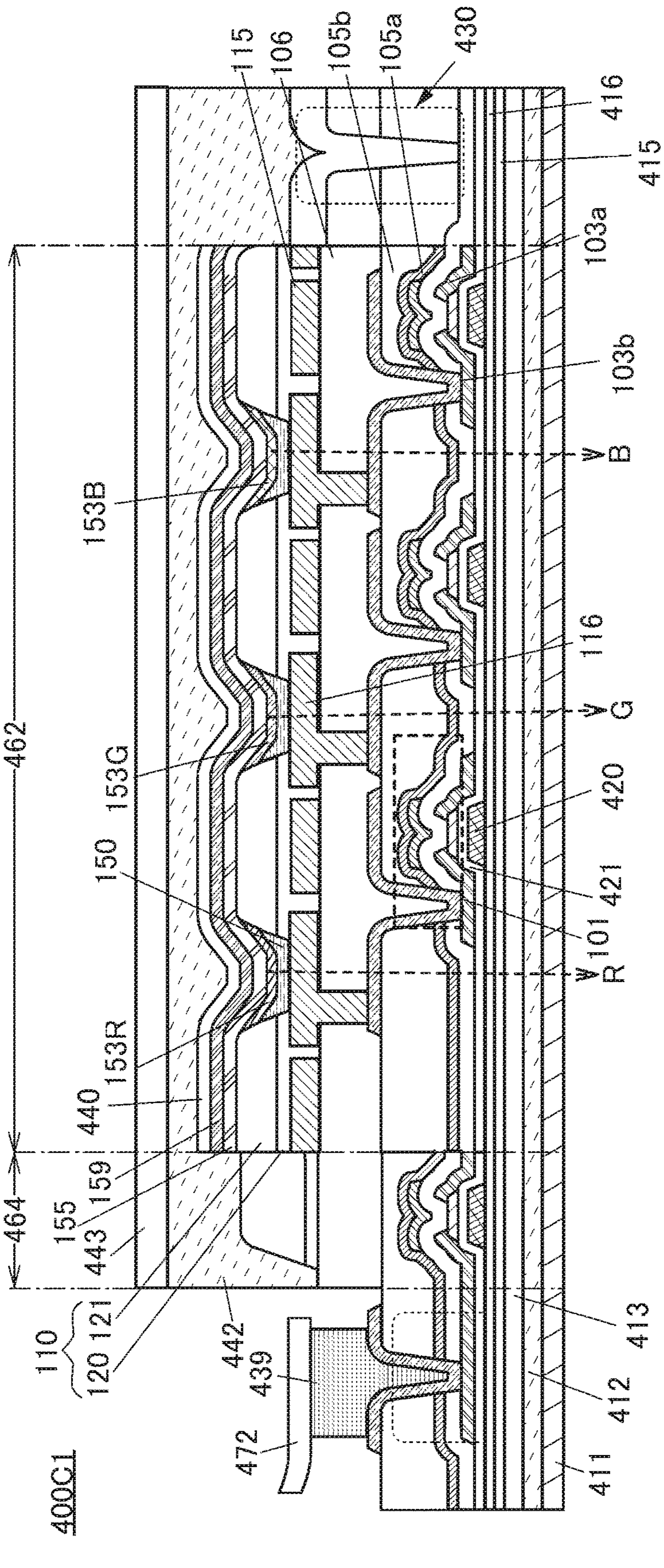
FIG. 33 is a cross-sectional view illustrating a display device of one embodiment of the present invention.

FIG. 33 is a cross-sectional view of a display device 400C1. The cross-sectional view illustrates the case where the display device 400C1 employs a bottom-emission structure in which light from the light-emitting device is emitted toward the support substrate 411 side as shown by arrows and metal oxide is used for the semiconductor layer of the transistor 101.

Since light is extracted from the support substrate 411 side in the bottom-emission structure, the transistor 101 preferably contains metal oxide. The metal oxide is used to obtain a light-transmitting property. The transistor 101 includes the back gate 420 and the insulating layer 421 covering the back gate 420. The transistor 101 includes a source 103*a* and a drain 103*b*. Furthermore, an insulating layer 105*a* and an insulating layer 105*b* are included. It is preferable that the insulating layer 105*a* contain an inorganic material and the insulating layer 105*b* contain an organic material. The source 103*a* and the drain 103*b* are formed in an opening in the insulating layer 105*a* and an opening in the insulating layer 105*b* to be electrically connected to the lower electrode 116.

In the transistor 101, the gate, the source 103*a*, and the drain 103*b* are positioned above the metal oxide. A conductive material is used for the gate, the source, and the drain, so that the metal oxide can be inhibited from being irradiated with light. Furthermore, light emitted from the light-emitting device can also be blocked.

In the display device 400C1 illustrated in FIG. 33, the counter substrate 443 does not include a color filter layer and a light-blocking layer.

The other components of the display device 400C1 illustrated in FIG. 33 are similar to those of the display device 400A1 illustrated in FIG. 31 or the display device 400B1 illustrated in FIG. 32.

[Display Device 400A2]

Figure 34A:
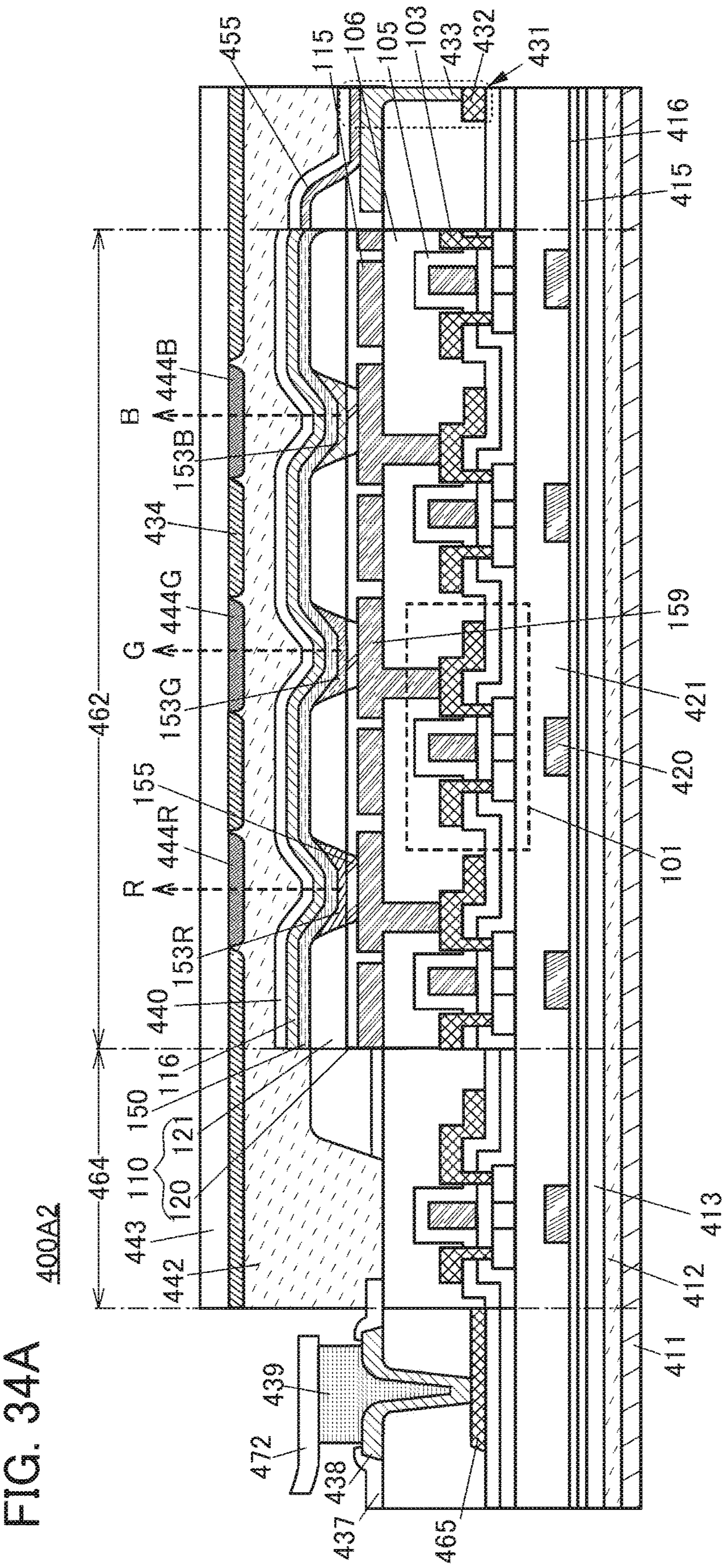
FIG. 34A is a cross-sectional view illustrating a display device of one embodiment of the present invention.

FIG. 34A is a cross-sectional view of a display device 400A2. The display device 400A2 includes a display portion 462, a circuit 464, a wiring 465, and the like. The display portion 462 includes a pixel region. FIG. 34A illustrates an example in which the IC 473 and the FPC 472 are integrated on the display device 400A2. Thus, the structure illustrated in FIG. 34A can be regarded as a display module including the display device 400A2, the IC (integrated circuit), and the FPC.

Figure 34B:
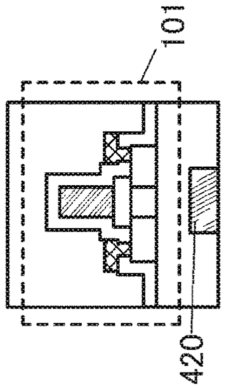
FIG. 34B is a cross-sectional view illustrating a transistor of one embodiment of the present invention.

The display device 400A2 illustrated in FIG. 34A may include any of the light-emitting devices described in Embodiments 2 and 3. The other components of the display device 400A2 illustrated in FIG. 34A are similar to those of the display device 400A1 illustrated in FIG. 31A and the like. A structure and the like of the transistor 101 illustrated in FIG. 34B are similar to those of the transistor 101 illustrated in FIG. 31B and the like.

[Display Device 400B2]

Figure 35:
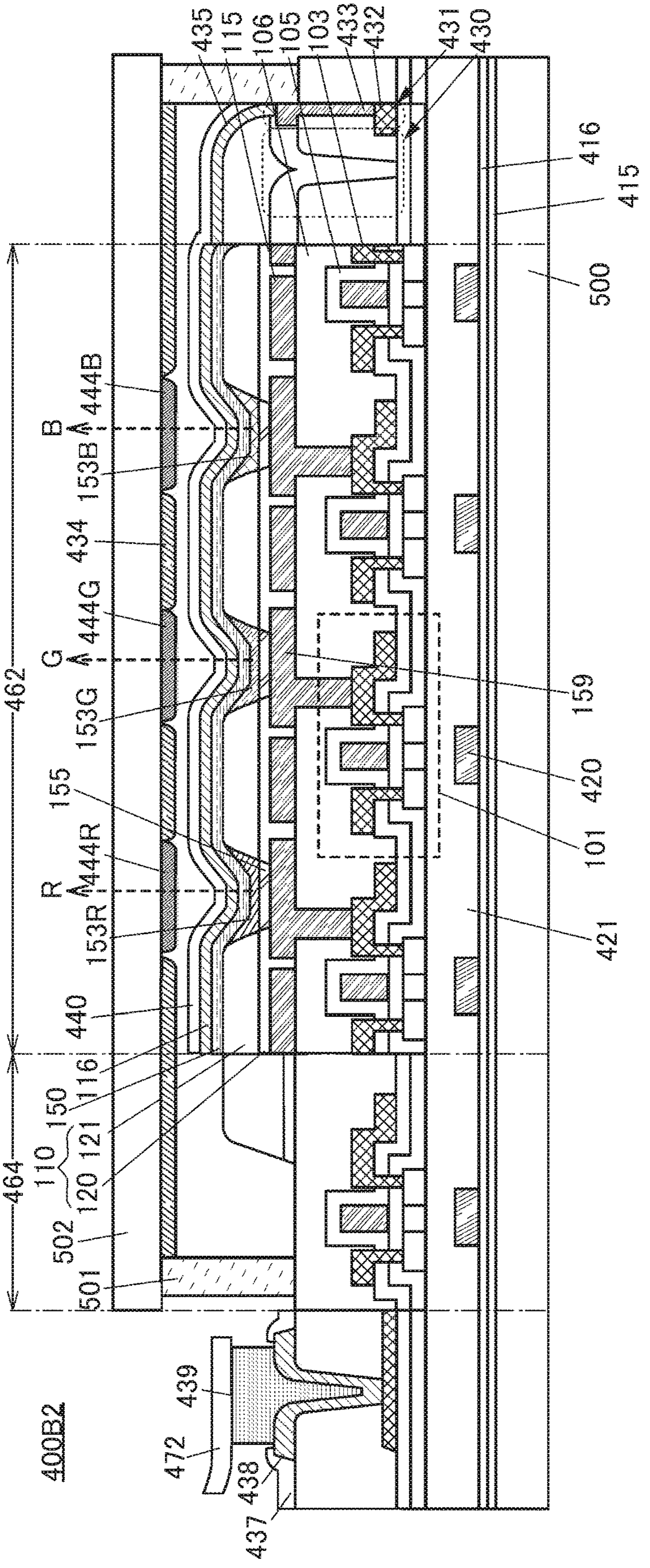
FIG. 35 is a cross-sectional view illustrating a display device of one embodiment of the present invention.

FIG. 35 is a cross-sectional view of a display device 400B2. The cross-sectional view of the display device 400B2 illustrates the case where a hollow sealing structure is employed for the display device 400A2 illustrated in FIG. 34A.

The other components of the display device B2 illustrated in FIG. 35 are similar to those of the display device 400A1 illustrated in FIG. 31A and the like.

[Display Device 400C2]

Figure 36:
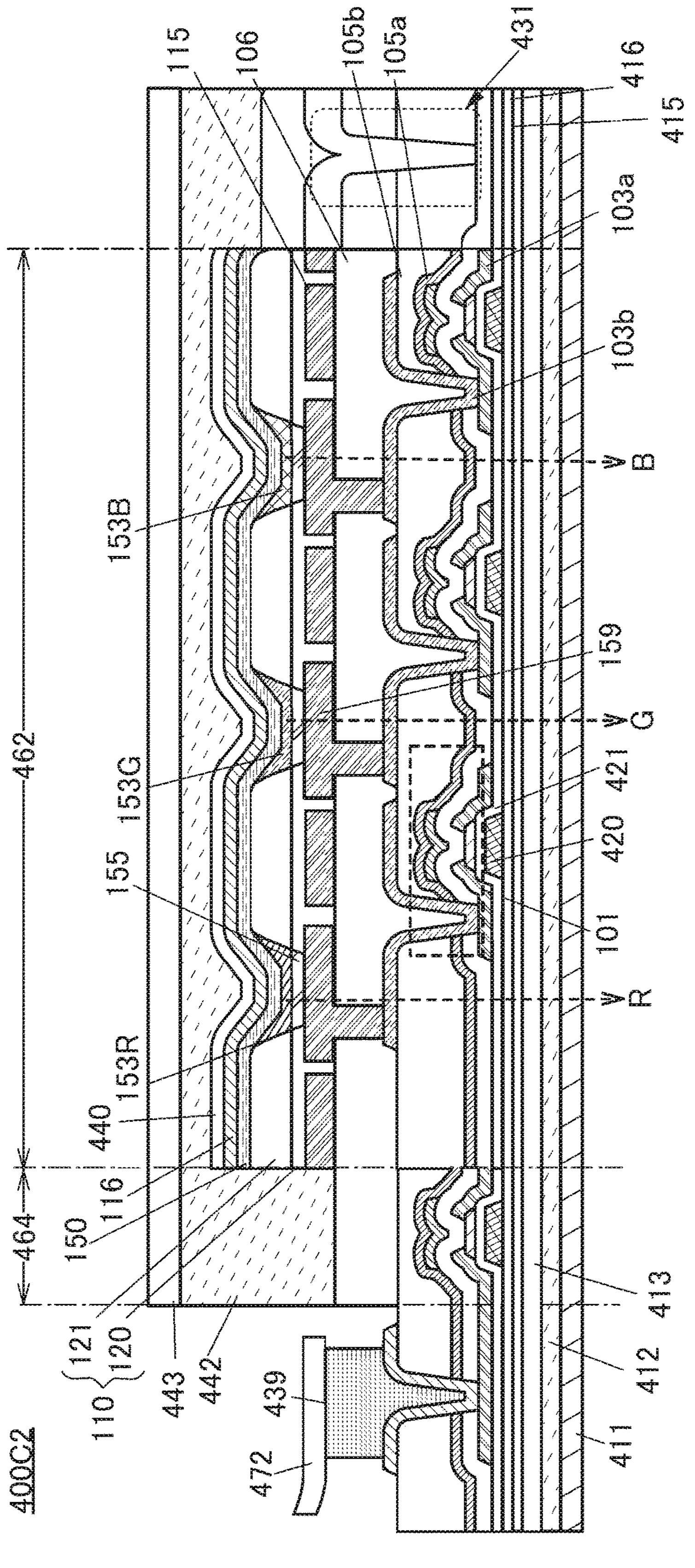
FIG. 36 is a cross-sectional view illustrating a display device of one embodiment of the present invention.

FIG. 36 is a cross-sectional view of a display device 400C2. The cross-sectional view illustrates the case where the display device 400C2 employs a bottom-emission structure in which light from the light-emitting element is emitted toward the support substrate 411 side as shown by arrows and metal oxide is used for the semiconductor layer of the transistor 101.

The other components of the display device C2 illustrated in FIG. 36 are similar to those of the display device 400A1 illustrated in FIG. 31A or the display device 400B2 illustrated in FIG. or the like.

This embodiment can be implemented in combination with the other embodiments described in this specification and the like as appropriate. For example, part of the structure described in this embodiment may be implemented in combination with the other embodiments described in this specification and the like as appropriate.

Embodiment 8

In this embodiment, metal oxide (also referred to as an oxide semiconductor) that can be used in the OS transistor will be described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including completely amorphous), CAAC (c-axis-aligned crystalline), nc (nanocrystalline), CAC (cloud-aligned composite), single-crystal, and polycrystalline (polycrystal) structures can be given as examples of a crystal structure of the metal oxide.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

The XRD spectra obtained by a GIXD method are described. The XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using $\theta/2\theta$ scanning, for example, a peak indicating c-axis alignment is detected at $2\theta$ of 31° or around 31°. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, or the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurity elements, formation of defects, and the like, the CAAC-OS can be regarded as an oxide semiconductor that has small amounts of impurity elements and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS and an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[A-Like OS]

The a-like OS is an oxide semiconductor having a structure between those of the nc-OS and the amorphous oxide semiconductor. The a-like OS contains a void or a low-density region. That is, the a-like OS has lower crystallinity than the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. Alternatively, for example, the first region has [In] higher than [In] in the second region and [Ga] lower than [Ga] in the second region. Moreover, the second region has higher [Ga] than [Ga] in the first region and lower [In] than [In] in the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility (μ) can be achieved.

The second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ) and excellent switching operation can be achieved.

A transistor using the CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration in an oxide semiconductor film, the impurity element concentration in the oxide semiconductor film is reduced so that the density of defect states can be reduced. In this specification and the like, a state with a low impurity element concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity element concentration in an oxide semiconductor is effective. In order to reduce the impurity element concentration in the oxide semiconductor, it is preferable that the impurity element concentration in an adjacent film be also reduced. Examples of impurity elements include hydrogen, nitrogen, an alkali metal, an alkaline earth metal, iron, nickel, and silicon.

<Impurity Element>

Here, the influence of each impurity element in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/$cm^3$, preferably lower than or equal to $2\times10^{16}$ atoms/$cm^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurity elements is used for the channel formation region of the transistor, stable electrical characteristics can be given.

This embodiment can be implemented in combination with the other embodiments described in this specification and the like as appropriate. For example, part of the structure described in this embodiment may be implemented in combination with the other embodiments described in this specification and the like as appropriate.

Embodiment 9

In this embodiment, electronic devices of embodiments of the present invention is described with reference to FIG. 37 to FIG. 40.

An electronic device in this embodiment includes the display device of one embodiment of the present invention. For the display device of one embodiment of the present invention, increases in resolution, definition, and sizes are easily achieved. Thus, the display device of one embodiment of the present invention can be used for display portions of a variety of electronic devices.

The display device of one embodiment of the present invention can be manufactured at low cost, which leads to a reduction in manufacturing cost of an electronic device.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

In particular, a display device of one embodiment of the present invention can have a high resolution, and thus can be favorably used for an electronic device having a relatively small display portion. As such an electronic device, a watch-type or bracelet-type information terminal device (wearable device); and a wearable device worn on a head, such as a device for VR such as a head mounted display and a glasses-type device for AR can be given, for example. Examples of wearable devices include a device for SR and a device for MR.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, definition of 4K2K, 8K4K, or higher is preferable. Furthermore, the pixel density (resolution) of the display device of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With such a display device with high definition or high resolution, the electronic device can have higher realistic sensation, sense of depth, and the like in personal use such as portable use and home use.

The electronic device in this embodiment can be incorporated along a curved surface of an inside wall or an outside wall of a house or a building or the interior or the exterior of a car.

The electronic device in this embodiment may include an antenna. With the antenna receiving a signal, the electronic device can display an image, information, and the like on a display portion. When the electronic device includes an antenna and a secondary battery, the antenna may be used for contactless power transmission.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device of one embodiment of the present invention can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 37A:
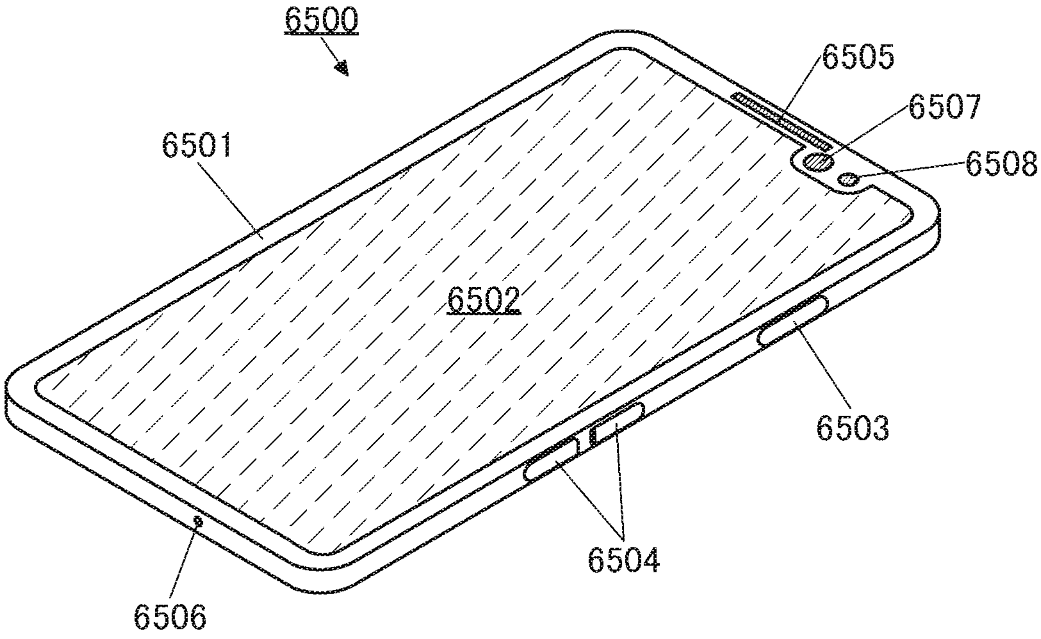
FIG. 37A and FIG. 37B are diagrams illustrating an electronic device of one embodiment of the present invention.

An electronic device 6500 in FIG. 37A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 37B:
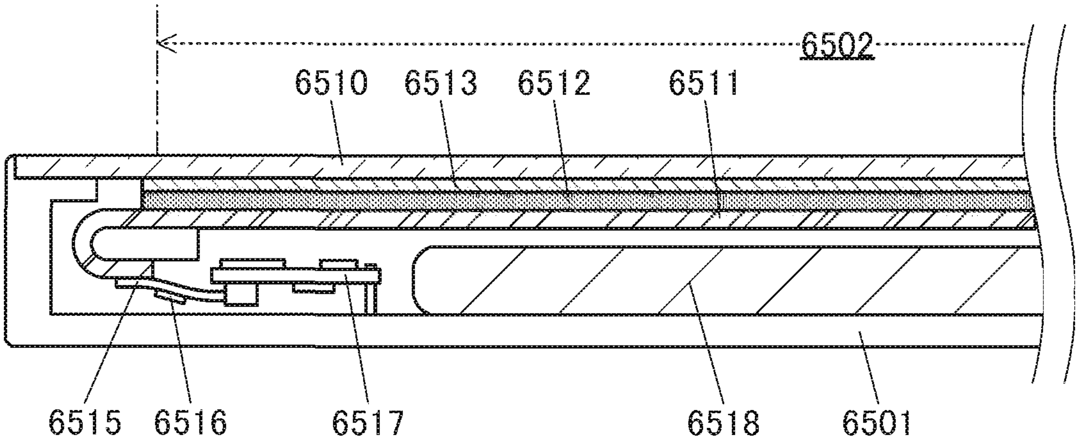

FIG. 37B is a cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of the pixel portion, whereby an electronic device with a narrow bezel can be achieved.

Figure 38A:
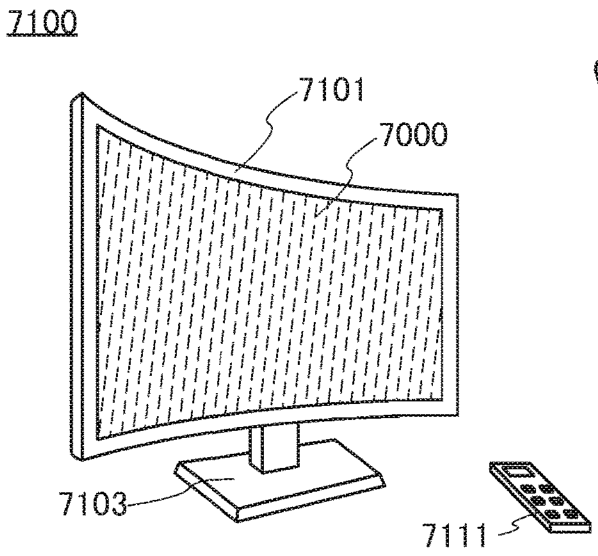
FIG. 38A to FIG. 38D are diagrams illustrating electronic devices of embodiments of the present invention.

FIG. 38A illustrates an example of a television device. In a television device 7100, a display portion 7000 is incorporated in a housing 7101. Here, the housing 7101 is supported by a stand 7103.

The display device of one embodiment of the present invention can be used in the display portion 7000.

Operation of the television device 7100 illustrated in FIG. 38A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 38B:
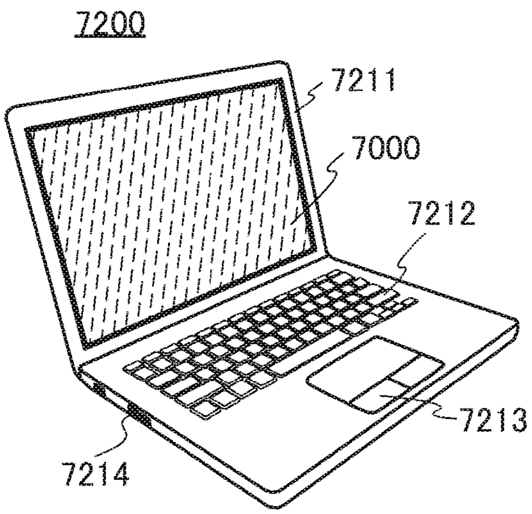

FIG. 38B illustrates an example of a laptop personal computer. A notebook personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

Figure 38C:
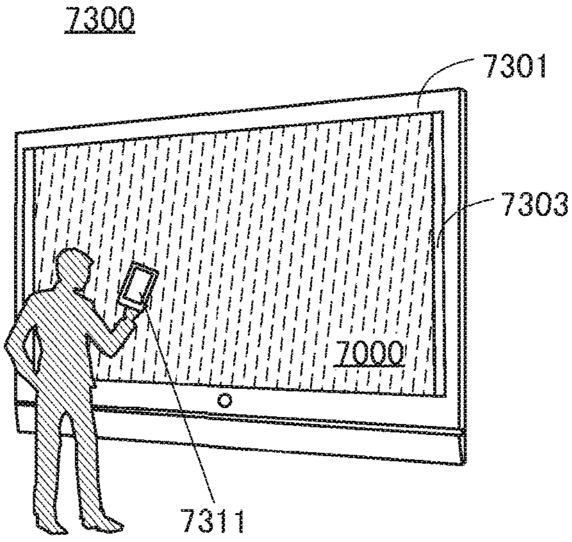
Figure 38D:
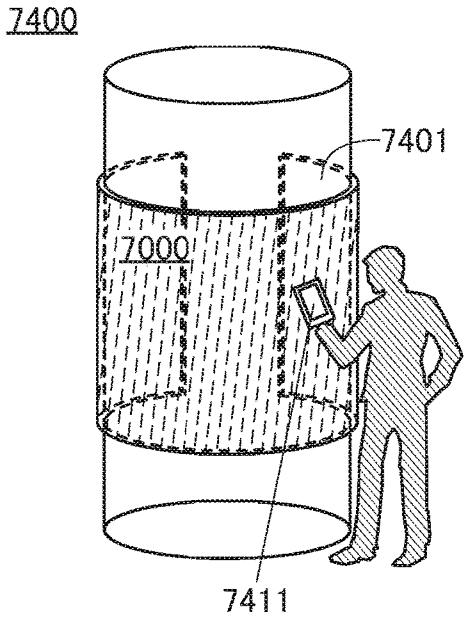

FIG. 38C and FIG. 38D illustrate examples of digital signage.

Digital signage 7300 illustrated in FIG. 38C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 38D is digital signage 7400 attached to a cylindrical pillar 7401. The digital signage 7400 includes the display portion 7000 provided along a curved surface of the pillar 7401.

The display device of one embodiment of the present invention can be used in the display portion 7000 illustrated in each of FIG. 38C and FIG. 38D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 38C and FIG. 38D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Figure 39A:
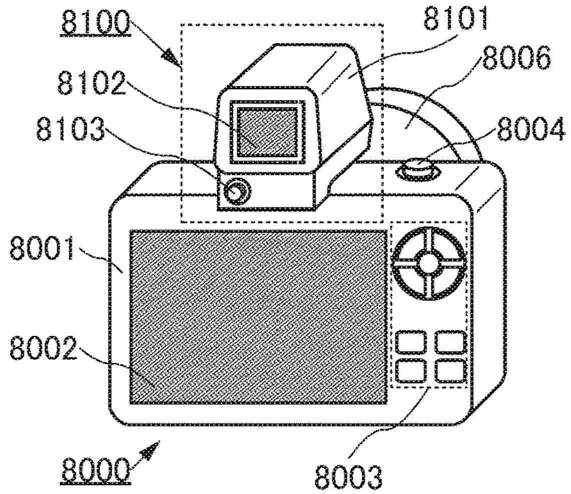
FIG. 39A to FIG. 39F are diagrams illustrating electronic devices of embodiments of the present invention.

FIG. 39A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 by a mount for engagement with the mount of the camera 8000. The finder 8100 can display a video and the like received from the camera 8000 on the display portion 8102.

The button 8103 functions as a power supply button or the like.

A display device of one embodiment of the present invention can be used in the display portion 8002 of the camera 8000 and the display portion 8102 of the finder 8100. Note that a finder may be incorporated in the camera 8000.

Figure 39B:
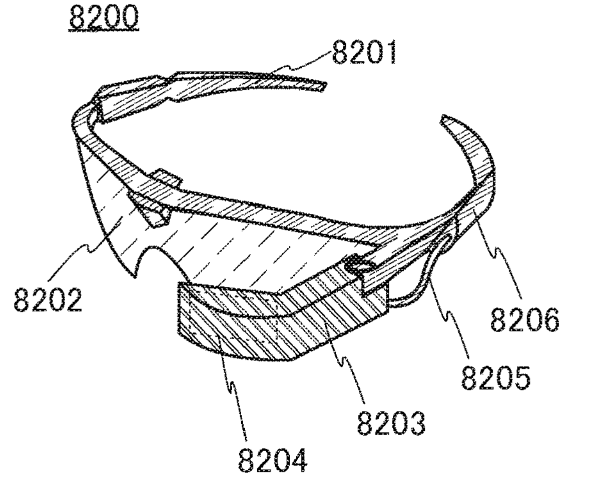

FIG. 39B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like to receive image data and display it on the display portion 8204. The main body 8203 includes a camera, and data on the movement of the eyeballs or the eyelids of the user can be used as an input means.

The mounting portion 8201 may include a plurality of electrodes capable of sensing current flowing accompanying with the movement of the user's eyeball at a position in contact with the user to recognize the user's sight line. The mounting portion 8201 may also have a function of monitoring the user's pulse with use of current flowing in the electrodes. Moreover, the mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, or the like.

A display device of one embodiment of the present invention can be used in the display portion 8204.

Figure 39C:
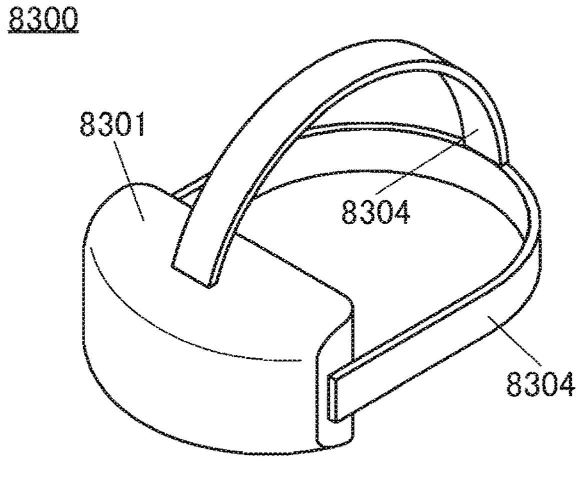
Figure 39D:
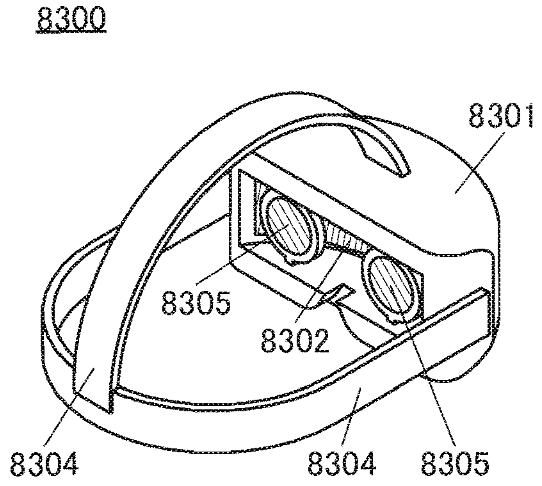
Figure 39E:
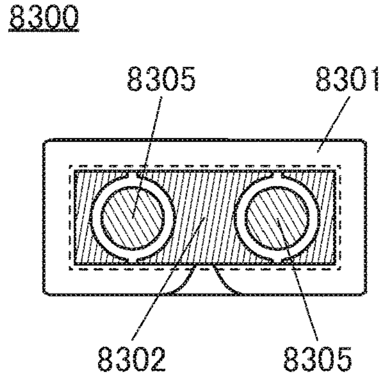

FIG. 39C to FIG. 39E are external views of a head-mounted display 8300. The head-mounted display 8300 includes a housing 8301, a display portion 8302, a band-like fixing member 8304, and a pair of lenses 8305.

A user can see display on the display portion 8302 through the lenses 8305. The display portion 8302 is preferably curved because the user can feel high realistic sensation. Another image displayed in another region of the display portion 8302 is viewed through the lenses 8305, so that three-dimensional display using parallax or the like can be performed. Note that the number of display portions 8302 provided is not limited to one; two display portions 8302 may be provided so that one display portion is provided for one eye of the user.

The display device of one embodiment of the present invention can be used for the display portion 8302. The display device of one embodiment of the present invention achieves extremely high resolution. For example, a pixel is not easily seen by the user even when the user sees display that is magnified by the use of the lenses 8305 as illustrated in FIG. 39E. In other words, a video with a strong sense of reality can be seen by the user with use of the display portion 8302.

Figure 39F:
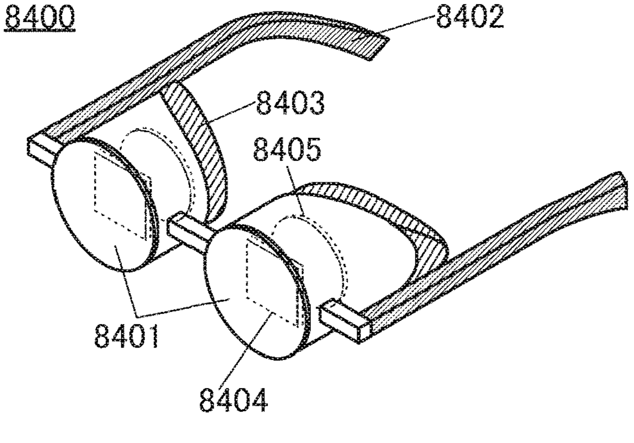

FIG. 39F is an external view of a goggle-type head-mounted display 8400. The head-mounted display 8400 includes a pair of housings 8401, a mounting portion 8402, and a cushion 8403. A display portion 8404 and a lens 8405 are provided in each of the pair of housings 8401. When the pair of display portions 8404 display different images, three-dimensional display using parallax can be performed.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has plasticity and elasticity so as to be adjusted to fit the size of the user's face and not to slide down. In addition, part of the mounting portion 8402 preferably has a vibration mechanism to function as a bone conduction earphone. Thus, audio devices such as an earphone and a speaker are not necessarily provided separately, and the user can enjoy images and sounds only when wearing the head-mounted display 8400. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

Electronic devices illustrated in FIG. 40A to FIG. 40F include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like. The electronic devices illustrated in FIG. 40A to FIG. 40F have a variety of functions.

For example, the electronic device can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The display device of one embodiment of the present invention can be used for the display portion 9001.

The electronic devices illustrated in FIG. 40A to FIG. 40F are described in detail below.

Figure 40A:
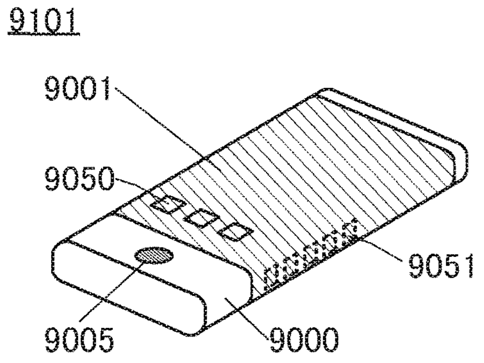
FIG. 40A to FIG. 40F are diagrams illustrating electronic devices of embodiments of the present invention.

FIG. 40A is a perspective view illustrating a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 40A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the reception strength of an antenna. Alternatively, the icon 9050 or the like may be displayed at the position where the information 9051 is displayed.

Figure 40B:
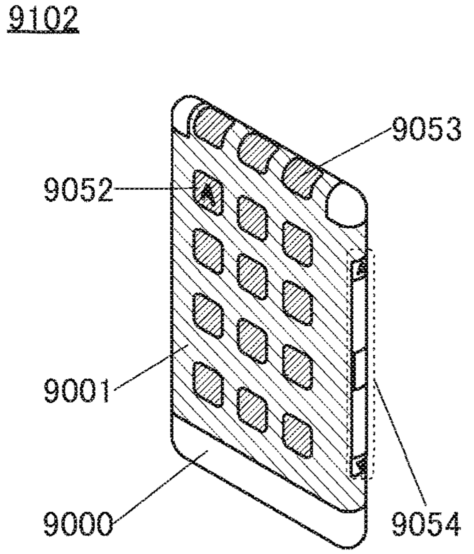

FIG. 40B is a perspective view illustrating a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

Figure 40C:
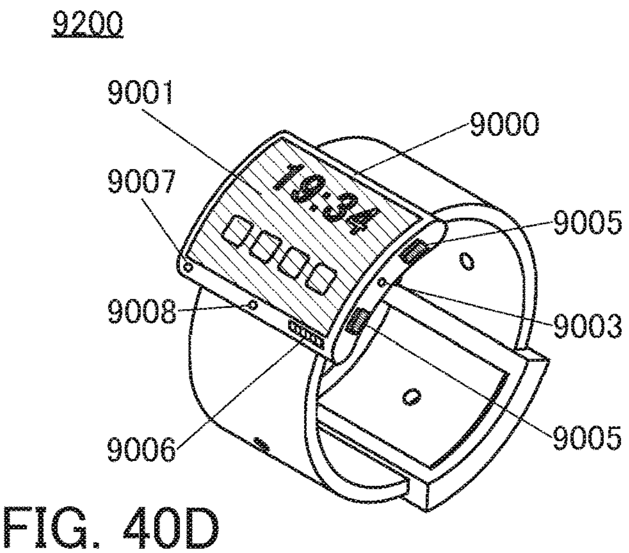

FIG. 40C is a perspective view illustrating a watch-type portable information terminal 9200. For example, the portable information terminal 9200 can be used as a Smartwatch (registered trademark). The display surface of the display portion 9001 is curved, and an image can be displayed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 40D:
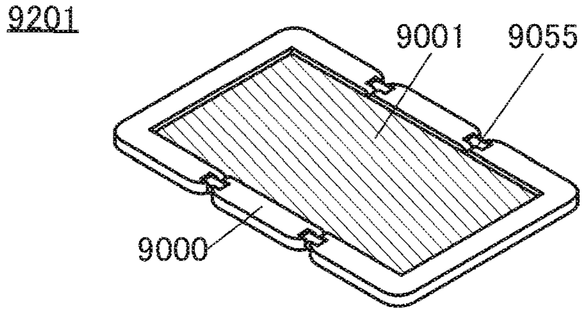
Figure 40E:
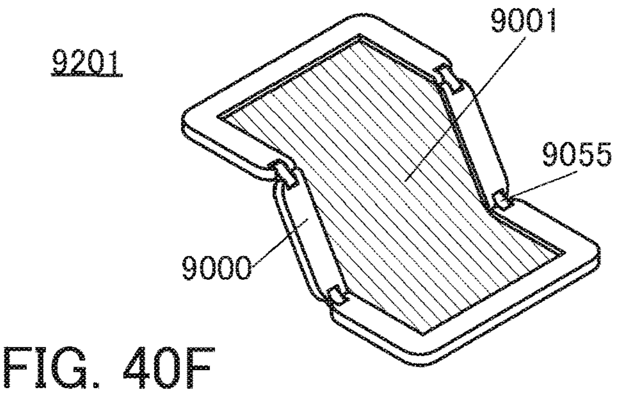
Figure 40F:
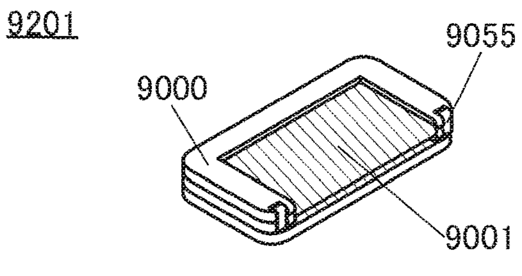

FIG. 40D to FIG. 40F are perspective views illustrating a foldable portable information terminal 9201. FIG. 40D is a perspective view of an opened state of the portable information terminal 9201, FIG. 40F is a perspective view of a folded state thereof, and FIG. 40E is a perspective view of a state in the middle of change from one of FIG. 40D and FIG. 40F to the other. The portable information terminal 9201 is highly portable in the folded state and is highly browsable in the opened state because of a seamless large display region. The display portion 9001 of the portable information terminal 9201 is supported by three housings 9000 joined together by hinges 9055. For example, the display portion 9001 can be folded with a radius of curvature greater than or equal to 0.1 mm and less than or equal to 150 mm.

This embodiment can be implemented in combination with the other embodiments described in this specification and the like as appropriate. For example, part of the structure described in this embodiment may be implemented in combination with the other embodiments described in this specification and the like as appropriate.

REFERENCE NUMERALS

AL: wiring, CL: wiring, GL: wiring, SL: wiring, 10: pixel region, 11B: pixel, 11G: pixel, 11R: pixel, 15B: contact hole, 15G: contact hole, 15R: contact hole, 18: contact hole, 20: light-emitting device, 100: substrate, 101*a*: transistor, 101: transistor, 102: gate, 103*a*: source, 103*b*: drain, 103: drain, 105*a*: insulating layer, 105*b*: insulating layer, 105: insulating layer, 106: insulating layer, 107: insulating layer, 110*x*: first region, 110*y*: second region, 110: partition wall, 114: conductive layer, 115: auxiliary electrode, 116: lower electrode, 117: conductive layer, 119B: ink-jet nozzle, 119G: ink-jet nozzle, 119R: ink-jet nozzle, 120: first insulator, 121: second insulator, 150: layer, 153B: light-emitting layer, 153G: light-emitting layer, 153R: light-emitting layer, 155: layer, 159: upper electrode, 160: layer, 161: metal mask, 163B: light-emitting layer, 163G: light-emitting layer, 163R: light-emitting layer, 165: layer, 216: upper electrode, 259: lower electrode, 311*i*: channel formation region, 311*n*: low-resistance region, 311: semiconductor layer, 312: insulating layer, 313: conductive layer, 314*a*: conductive layer, 314*b*: conductive layer, 315: conductive layer, 316: insulating layer, 321: insulating layer, 322: insulating layer, 323: insulating layer, 326: insulating layer, 350*a*: transistor, 350: transistor, 351: semiconductor layer, 352: insulating layer, 353: conductive layer, 354*a*: conductive layer, 354*b*: conductive layer, 355: conductive layer, 411: support substrate, 412: adhesive layer, 413: resin layer, 415: insulating layer, 416: insulating layer, 420: back gate, 421: insulating layer, 430: region, 431: region, 432: conductive layer, 434: light-blocking layer, 435: conductive layer, 437: insulating layer, 438: conductive layer, 439: connection layer, 440: insulating layer, 442: adhesive layer, 443: counter substrate, 444B: color filter layer, 444G: color filter layer, 444R: color filter layer, 462: display portion, 464: circuit, 465: wiring, 472: FPC, 473: IC, 500: substrate, 501: sealing material, 502: counter substrate, 672: lower electrode, 686*a*: first light-emitting unit, 686*b*: second light-emitting unit, 686: light-emitting unit, 688: upper electrode, 690*a*: intermediate layer, 690*b*: intermediate layer, 690: intermediate layer, 4411: light-emitting layer, 4412: first light-emitting layer, 4413: second light-emitting layer, 4414: third light-emitting layer, 4420: layer, 4430: layer, 6500: electronic device, 6501: housing, 6502: display portion, 6503: power supply button, 6504: button, 6505: speaker, 6506: microphone, 6507: camera, 6508: light source, 6510: protection member, 6511: display panel, 6512: optical component, 6513: touch sensor panel, 6515: FPC, 6516: IC, 6517: printed circuit board, 6518: battery, 7000: display portion, 7100: television device, 7101: housing, 7103: stand, 7111: remote controller, 7200: notebook personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing member, 8305: lens, 8400: head-mounted display, 8401: housing, 8402: mounting portion, 8403: cushion, 8404: display portion, 8405: lens, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display device comprising:

a first lower electrode;

a second lower electrode positioned in a region adjacent to the first lower electrode in an X direction in a top view;

a third lower electrode positioned in a region adjacent to the first lower electrode in a Y direction in the top view;

an auxiliary electrode positioned between the first lower electrode and the third lower electrode in the top view;

a partition wall over the first lower electrode, the second lower electrode, the third lower electrode, and the auxiliary electrode;

a first light-emitting layer over the first lower electrode and in a first opening in the partition wall;

a first layer between the first lower electrode and the first light-emitting layer;

a second light-emitting layer over the second lower electrode and in a second opening in the partition wall;

a second layer between the second lower electrode and the second light-emitting layer;

a third light-emitting layer over the third lower electrode and in a third opening in the partition wall;

a third layer between the third lower electrode and the third light-emitting layer;

a fourth layer over and in contact with the partition wall, the first light-emitting layer, the second light-emitting layer, and the third light-emitting layer; and an upper electrode over the fourth layer, wherein the upper electrode is in contact with the auxiliary electrode in a contact hole, wherein the partition wall has a stacked-layer structure of a first insulator containing an inorganic material and a second insulator containing an organic material over the first insulator, and wherein an end portion of the first insulator is exposed from an end portion of the second insulator and the end portion of the second insulator is exposed from an end portion of the fourth layer in a cross-sectional view of the contact hole.

2. The display device according to claim 1, wherein a height of the partition wall along an X direction is lower than a height of the partition wall along a Y direction.

3. The display device according to claim 1, wherein each of the first layer, the second layer, and the third layer comprises a hole-transport layer or a hole-injection layer.

4. A display device comprising:

an auxiliary electrode;

an insulating layer over the auxiliary electrode;

a first lower electrode over the insulating layer;

a second lower electrode over the insulating layer, the second lower electrode positioned in a region adjacent to the first lower electrode in an X direction in a top view;

a third lower electrode over the insulating layer, the third lower electrode positioned in a region adjacent to the first lower electrode in a Y direction in the top view;

a conductive layer over the insulating layer, the conductive layer positioned between the first lower electrode and the third lower electrode in the top view;

a partition wall over the first lower electrode, the second lower electrode, the third lower electrode, and the conductive layer;

a first light-emitting layer over the first lower electrode and in a first opening in the partition wall;

a first layer between the first lower electrode and the first light-emitting layer;

a second light-emitting layer over the second lower electrode and in a second opening in the partition wall;

a second layer between the second lower electrode and the second light-emitting layer;

a third light-emitting layer over the third lower electrode and in a third opening in the partition wall;

a third layer between the third lower electrode and the third light-emitting layer;

a fourth layer over and in contact with the partition wall, the first light-emitting layer, the second light-emitting layer, and the third light-emitting layer; and an upper electrode over the fourth layer, wherein the upper electrode is in contact with the conductive layer in a contact hole, wherein the partition wall has a stacked-layer structure of a first insulator containing an inorganic material and a second insulator containing an organic material over the first insulator, and wherein an end portion of the first insulator is exposed from an end portion of the second insulator and the end portion of the second insulator is exposed from an end portion of the fourth layer in a cross-sectional view of the contact hole.

5. The display device according to claim 4, wherein a height of the partition wall along an X direction is lower than a height of the partition wall along a Y direction.

6. The display device according to claim 4, wherein each of the first layer, the second layer, and the third layer comprises a hole-transport layer or a hole-injection layer.

* * * * *